United States Patent [19]

Belisomi et al.

[11] Patent Number: 4,600,918
[45] Date of Patent: Jul. 15, 1986

[54] EQUIPMENT FOR REPRODUCTION OF ALPHANUMERICAL DATA

[75] Inventors: Pietro Belisomi, Pinerolo; Attilio Farina, Torino, both of Italy

[73] Assignee: Indesit Industria Elettrodomestici Italiana SpA, Rivalta, Italy

[21] Appl. No.: 393,127

[22] Filed: Jun. 28, 1982

[30] Foreign Application Priority Data

Jun. 29, 1981 [IT] Italy ................................ 67892 A/81
Mar. 9, 1982 [IT] Italy ................................ 67274 A/82

[51] Int. Cl.$^4$ ............................................. G09G 1/00
[52] U.S. Cl. .................................. 340/711; 340/721; 340/286 M; 368/10; 368/28
[58] Field of Search ................... 340/721, 711, 745; 368/28, 29, 10

[56] References Cited

U.S. PATENT DOCUMENTS

| | | | |
|---|---|---|---|
| 3,891,792 | 6/1975 | Kimura | 340/745 |
| 3,898,644 | 8/1975 | Baxter | 368/28 |
| 4,051,522 | 9/1977 | Healy | 340/745 |
| 4,087,958 | 5/1978 | Ebihara | 368/29 |
| 4,194,196 | 3/1980 | Mohiuddin | 368/29 |
| 4,253,169 | 2/1981 | Salah | 368/28 |
| 4,386,436 | 5/1983 | Kocher | 340/286 M |
| 4,393,376 | 7/1983 | Thomas | 340/745 |

*Primary Examiner*—Marshall M. Curtz
*Attorney, Agent, or Firm*—Michael N. Mellner

[57] ABSTRACT

The invention relates to a television set provided with a alphanumerical display device for displaying on the television screen (6), as an alternative to the received video picture, another complete picture constituted by alphanumerical data which can comprise all the letters in the alphabet, the numbers from 0 to 9 and graphic symbols.

The invention also relates to a receiver provided with color picture display means for displaying, following a control from the user, a calendar data constituted by at least one of the said colour pictures and composed of alphanumerical characters.

The invention also relates to a receiver for receiving radioelectric signals which is provided with an alphanumerical character display device in which the tuning of a radioelectric signal takes place by means of a message from the user composed of alphanumerical characters and representative of the station which transmits the said radioelectric signal.

The invention relates furthermore to a receiver comprising reproducer means for reproducing on a display screen, or reproducer printing means or vodal reproducer means for the reproduction of alphanumerical data, in which the instruction from the user for the generation of the alphanumerical data coded control signals takes place by means of telecontrol unit.

All the said receivers comprise a control unit (1, 2) comprising an alphanumerical keyboard apt to generate at least as many coded control signals as the characters which can be generated for being reproduced, a control unit (3) for the detection of the control signals generated by the control unit, and circuit means (4) for generating, through reproducer means (5), the alphanumerical data formed by the said selected characters.

23 Claims, 15 Drawing Figures

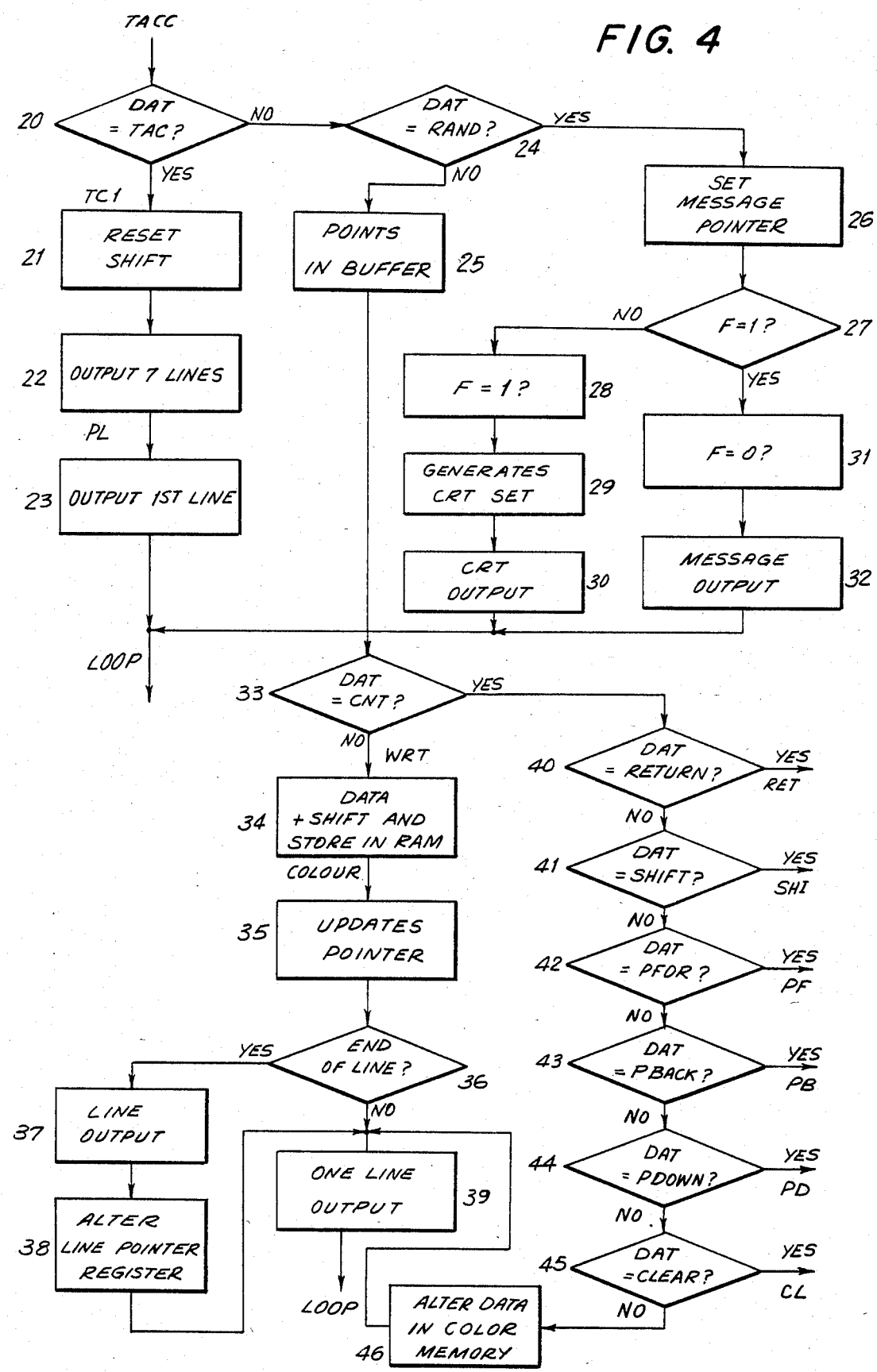

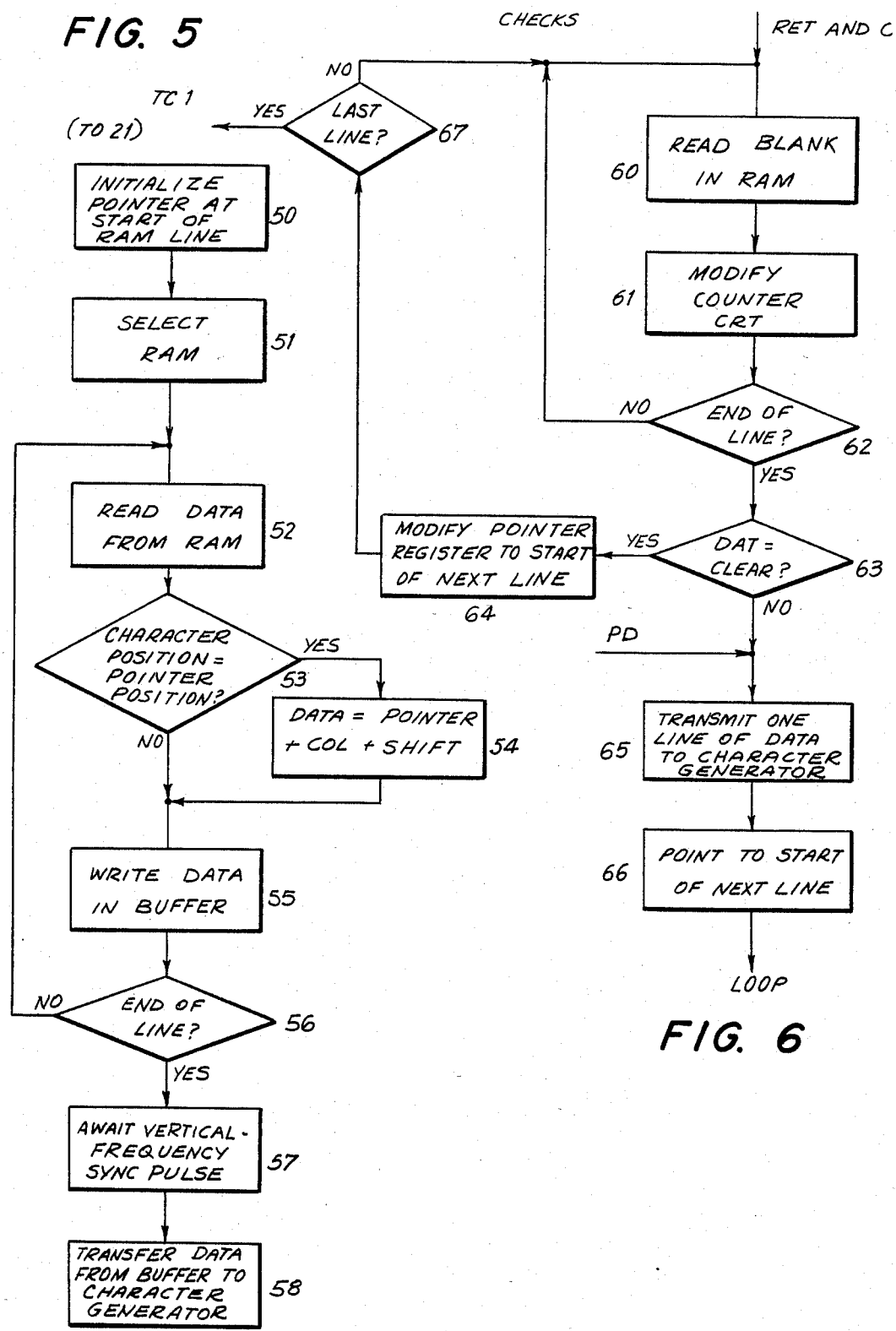

EQUIPMENT FOR REPRODUCTION OF ALPHANUMERICAL DATA

BACKGROUND OF THE INVENTION

The present invention relates to an equipment for reproduction of alphanumerical data, which comprises an operating unit having an alphanumerical keyboard adapted to generate at least as many coded control signals as the characters which can be generated for reproduction, a control unit for the detection of the control signals generated by the operating unit, and circuit means for the generation, through reproducer means, of alphanumerical data formed by the characters selected by means of the operating unit.

The equipment, in its various configurations, may be a television set provided with an alphanumerical display device adapted to display alphanumerical data on the television screen; it may be a generic apparatus, in particular a television set, provided with color picture display means for displaying the alphanumerical data; it may be a radioelectric signal receiver, for example a television set or a radio set, provided with an alphanumerical character display device; it may be an apparatus comprising means for the reproduction of alphanumerical data on a display screen (television set, peripheral unit in a computer system, etc.) or reproducer printing device (typewriter, printing machine in a computer system) or vocal reproducer devices.

The known prior art apparatuses are designed to perform various functions (for example, for a television set, direct channel selection, the memorization of a large number of programs, time display, timed turn-on or program switching, etc.) which can be performed easily with the aid of a suitably programmed microprocessor.

The television sets are preferably fitted with display devices for supplying data relative to the foregoing functions. However, these display devices are usually only designed to provide a numerical indication of the time, channel and/or program, and the keyboards by means of which the foregoing functions are controlled possess a limited number of keys which cannot allow a large number of operations on the set.

Consequently, the microprocessor is not used to a sufficient extent as regards its data processing capacity, because of the insufficiency of the display means connected to it and the control device supplying it with the data to be processed.

SUMMARY OF THE INVENTION

The object of the present invention is to provide sets of the types mentioned hereinabove which in the performance of their various specific functions and in their control system are more sophisticated than the prior art sets, with no substantial increase in the complexity and cost of the circuits.

Therefore, on the basis of the present invention there is provided a television receiver fitted with a television screen and circuit means for generating a picture to be displayed, connected to the television screen, for displaying, following a control from the user, in substitution of the received video picture, another complete picture composed of alphanumerical data formed by characters which may comprise all the letters in the alphabet, the numbers from 0 to 9 and graphic symbols. The invention comprises a control unit, connected to the circuit means, to first read-write (RAM) memory means and to an operating unit for receiving data from the user, characterized by the fact that the operating unit comprises an alphanumerical keyboard for generating at least as many coded control signals as the characters which may be generated by the circuits and displayed on the television screen, these operating signals being decoded by the control unit, sent to the circuits in order to allow displaying the corresponding characters on the screen and stored by the control unit in the first read-write memory means for repeat display on the screen at any time in response to a given display control operated by the user.

The present invention also provides a set fitted with color picture display means, comprising circuit means for generating color pictures, for displaying, following a operating control from the the user, data composed of at least one of the color pictures, composed of alphanumerical characters including at least the numbers from 0 to 9. The invention further comprises a control unit, connected both to the circuit means and to an operating unit for receiving data from the user, characterized by the fact that the operating unit comprises a keyboard for generating coded control signals which are sent to and decoded by the control unit, and that the control unit, when it receives the coded control signals, determines the day of the week corresponding to a given date set by the coded control signals entered by the user on the operating unit and supplies the display means with data relative to the alphanumerical characters to be displayed, so as to display the picture on a screen in at least two colors showing at least the calendar month containing the date determined by the coded control signal entered by the user.

The present invention also provides a radioelectric signal receiver fitted with at least an alphanumerical character display device, comprising a control unit connected to circuit means for controlling the display device, to radioelectric signal tuning means, to first electronic memorizing means for memorizing at least data relative to the tuning of the radioelectric signals, and to an operating unit for receiving data from the user, characterized by the fact that, in response to a first coded control signal corresponding to a message composed of alphanumerical characters and representative of the station which transmits the radioelectric signal from the operating unit, the control unit extracts from the first memorizing means the data relative to the tuning of the radioelectric signal to be sent to the tuning means, and supplies the circuit means with codes adapted to obtain the reproduction of the message on the display device.

Finally, the present invention provides a receiver comprising reproducer means for reproducing on a display screen, or printing reproducer means or vocal reproducer means, alphanumerical data formed by characters which may comprise all the letters in the alphabet, the numbers from 0 to 9 and graphic symbols, characterized by the fact that it comprises a telecontrol type operating unit comprising an alphanumerical keyboard adapted to generate at least as many coded control signals as the characters which can be generated for reproduction by the reproducer means, a control unit for the detection of the control signals generated by the operating unit, and circuit means which through the reproducer means generate the said alphanumerical data formed by the selected characters.

BRIEF DESCRIPTION OF THE DRAWINGS

The invention will now be described in detail, in order to render easy its realization, in particular with reference to the annexed drawings given by way of non-limiting example.

FIGS. 3–14 show block diagrams of the elementary functions performed by the circuits inserted inside the television set according to the invention.

DETAILED DESCRIPTION OF THE INVENTION

Figure 1:
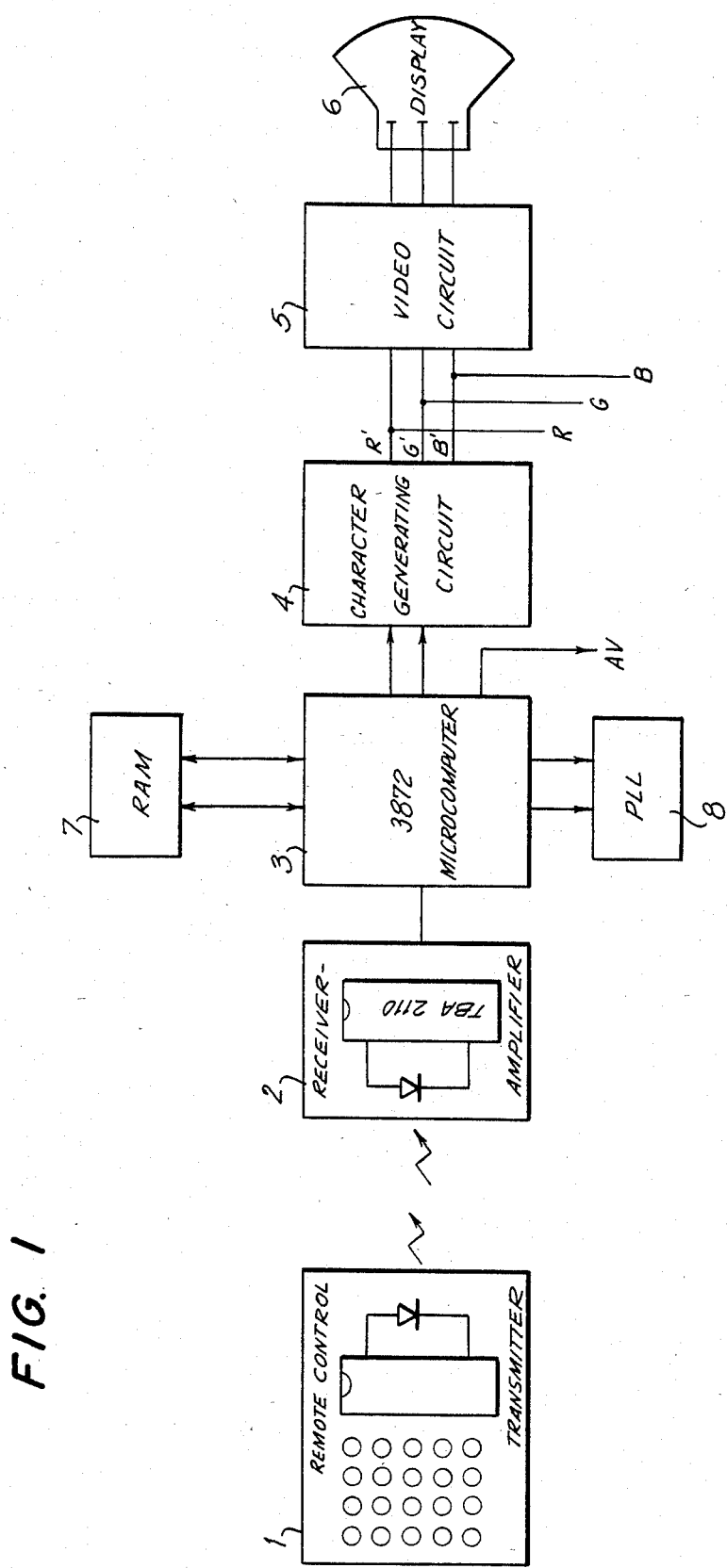
FIG. 1 shows a block diagram of a television set improved according to the present invention.

In FIG. 1, reference numeral 1 indicates a remote-control transmitter comprising an alphanumerical keyboard composed conveniently of 64 keys and known infrared ray transmission and coding circuits (Motorola MC14497 integrated circuit). Number 2 is an infrared ray receiver circuit comprising an amplifier (Motorola TBA 2110 integrated circuit) whose output is connected to control unit 3 comprising a Fairchild 3872 microcomputer.

The control unit is also connected to:

a random access CMOS memory (RAM) 7 consisting of (512) 8-bit cells and made using two RCA MW5113 512*4 RAM memories;

a PLL frequency synthesis circuit 8 for direct channel tuning consisting of a Motorola UAA 2000 integrated circuit;

a character generating circuit 4 for displaying 64 types of alphanumerical characters on the screen with a 5×7 dot matrix arranged in 8 lines of 32 characters;

the "AV" terminal of a known time constant switch circuit for the line sync circuits on the receiver.

The character generating circuit has three outputs (R', G', B') connected to inputs R, G and B respectively on final video circuit 5. The latter also receives at inputs R, G and B the three red, green and blue color signals sent out from the brightness and color circuits on the set and has three outputs connected to the cathodes of color kinescope 6.

More detailed information about the integrated and associated operating circuits mentioned above and later on can be found in the maker's specifications and catalogues which are readily available on the market.

Operation of the circuit is as follows:

Remote-control transmitter 1 consists of:

a first set of 32 dual-function buttons, the first or second function being selected by means of a shift key. The first set of functions includes the letters of the alphabet and the second the arabic numbers or punctuation marks.

three keys, TAC, CAL and DSP, for selecting the required function: scratch pad, calendar or return to normal receiver function control.

eight control keys for compiling the scratch pad message.

an OFF key for switching the set off.

When any one of these 44 keys is pressed, the MC 14497 integrated circuit transmits a special signal in two-phase FSK code, i.e. a series signal consisting of two packs of two given frequencies for each bit in the number of the key that has been pressed.

Receiver-amplifier circuit 2 then amplifies and demodulates the received signal into a timed sequence of ones and zeroes. Whenever a key is released, integrated circuit MC 14497 automatically transmits an end-of-transmission code corresponding to control 63.

Control unit 3 decodes the timed sequence into the corresponding code of the key that has been pressed. When one of the TAC, CAL or DSP function keys is pressed, the control unit switches to the corresponding operating mode as described later on with reference to FIG. 3.

If the TAC key is pressed, the control unit calls up data (scratch pad message) from memory circuits 7 and sends it to character generating circuit 4 for display on the screen, after which it prepares to receive further instructions from the transmitter which it stores in RAM 7 for forming a new message.

More details will be given about this when FIGS. 4-6 and Tables 1 and 2 are discussed.

If the CAL button is pressed, the control unit sends character generator 4 the following message:

"CALENDAR OF ??/????"

and prepares to receive the number of the month (January=01, December=12) and calendar year in question. Once this data has been supplied, the control unit calculates the date of the first day in the month requested, draws up a seven-column table of four or five lines showing all the days in the month and sends it to character generator 4. The calendar displayed on the screen may look like this:

| DECEMBER 1980 | | | | | | |
|---|---|---|---|---|---|---|
| MO | TU | WE | TH | FR | SA | SU |
| 1 | 2 | 3 | 4 | 5 | 6 | 7 |
| 8 | 9 | 10 | 11 | 12 | 13 | 14 |
| 15 | 16 | 17 | 18 | 19 | 20 | 21 |
| 22 | 23 | 24 | 25 | 26 | 27 | 28 |
| 29 | 30 | 31 | | | | |

The month and year (December 1980) are displayed in red, the days of the week, (MO, TU, WE, TH, FR, SA) in magenta, the numbers usually in white and "SU" and public holiday numbers (7, 14, 21, 28, 25) in red.

More details about this will be given later when FIGS. 8, 9 and 10 and Tables 3, 4 and 5 are discussed.

If the DSP button is pressed, the control unit prepares for ordinary television functions (channel/program selection, level adjustments, memorization, etc.).

In the case of program selection, for example, the control unit calls up tuning data relative to the selected program number from RAM 7, calculates the dividing number, which it sends in code to PLL circuit 8 for tuning into the required channel, and sends the data to be displayed (selected program/channel number, etc.) to character generator 4. For certain programs, it also supplies terminal "AV" with a time constant switch signal.

The way some of these functions are controlled by the present invention will be described in more detail when FIGS. 11-14 and Tables 6-9 are discussed particularly as regards memory labels for identifying priority stations. The non-volatile RAM 7 or, as in the case described, the low-consumption CMOS memory, with a buffer battery for preserving data even in the event of power failure, is used for storing both scratch pad and favorite program data in specific separate areas. Scratch pad data is stored in 32×8=256 cells, i.e. the first half of the memory, and program data in 8×10×3=240 cells (8 data per program on three 10 program pages) in the second half of the memory.

Besides the external RAM 7, the control unit microcomputer contains a block of registers (SPAD), consisting of (64) 8-bit registers, and a RAM memory area (BUFFER), consisting of 64 RAM memory cells ranging between the "FCO" and "FFF" addresses in hexadecimal notation.

Operation of character generator 4, connected to kinescope 6 via final video amplifier circuit 5, will now be described with reference to FIG. 2.

"DATA" indicates six input terminals representing the ASCII code of the 64 symbols which may be displayed.

"COLOUR" indicates two terminals representing the particular color assigned to each character (00=RED, 10=YELLOW, 01=MAGENTA, 11=WHITE).

"ADD" indicates three terminals representing the selected print line number (0–7 on an 8-line display).

"DT" indicates a terminal for enabling data transmission to the character generating circuit.

"DC" indicates a clock terminal for moving the character forward on a given line.

"FH" and "FV" indicate two sync terminals, for the horizontal and the vertical frequency, depending on the scanning of the set.

"R', G', B'" indicate three output terminals for supplying red, green and blue display picture data which is amplified and then sent to the kinescope.

Figure 2:
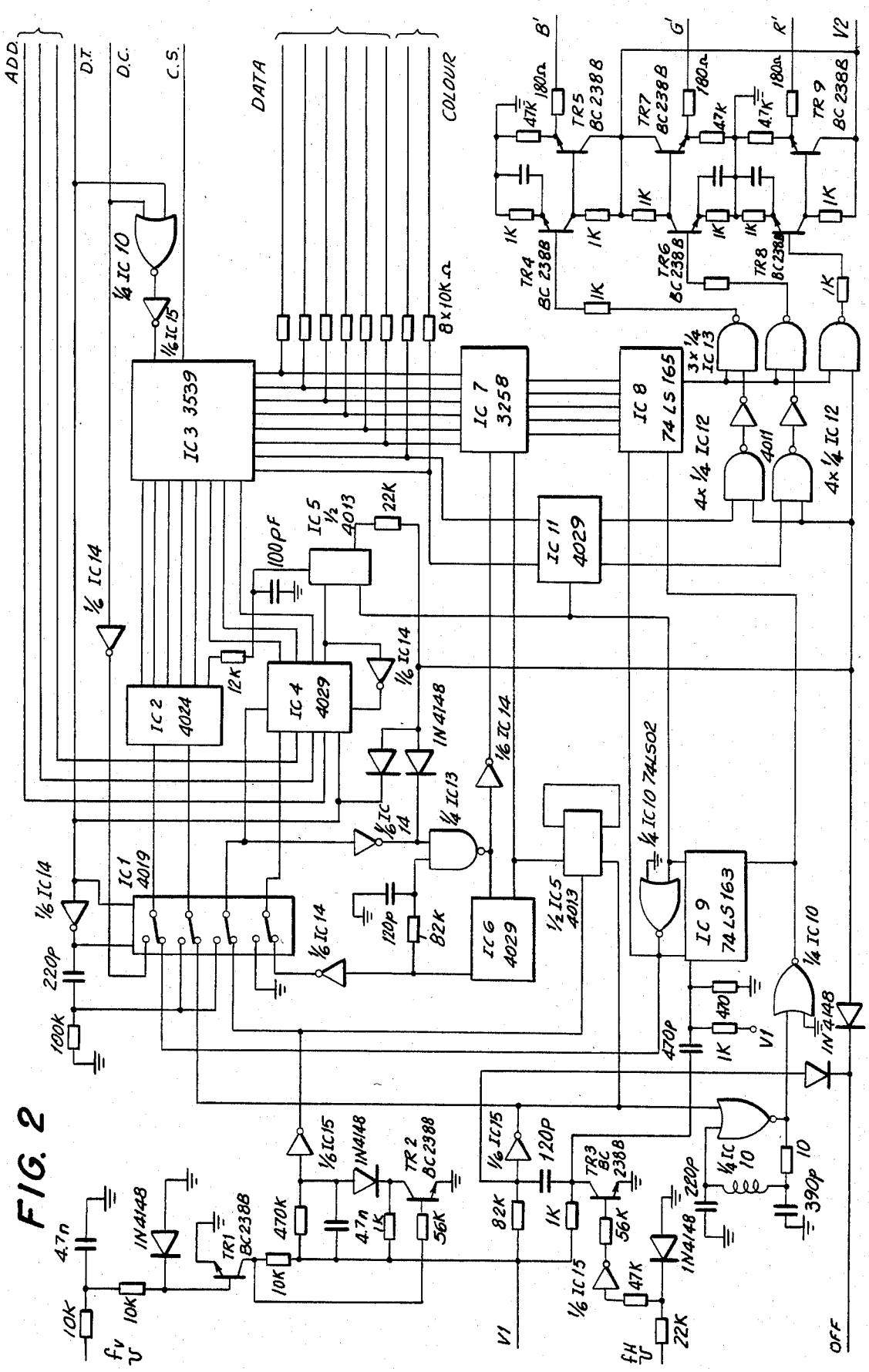
FIG. 2 shows a wiring diagram of some of the circuits shown diagrammatically in FIG. 1.

The character generating 4 circuit essentially consists of a Fairchild 3258 integrated circuit for generating a 64-character display matrix, a Fairchild 3539 256×8 RAM memory, a clock generator consisting of Fairchild IO10 (74LS02) and IC9 (74LS163) integrated circuits and character and line counters, for supplying addresses to the memory circuit, consisting of Fairchild IO2 (4024) and IC4 (4029) integrated circuits with the auxiliary circuits and connections shown in FIG. 2.

Operation of the circuit is as follows:

For printing on a given line, the line number must first be supplied to the "ADD" terminals so as to set the line counter to the required value. A signal is then sent to the "DT" terminal for setting the memory to print mode, followed by the display character and clock pulse which are sent respectively to the "DATA" and "COLOUR" and "DC" terminals.

The entered data is thus stored in successive memory cells in the area set aside for the selected line.

The above operation is repeated in the case of multiple lines and, once all the data has been loaded, the characters stored in the memory are displayed by removing the signal on the "DT" terminal.

This causes the cells in RAM 7 to be scanned, in time with the vertical- and horizontal-frequency signals on the set, the content of which (6 bits corresponding to the ASCII code of the character in question) is sent to the input of character generator integrated circuit 3258. This then sends out five signals, corresponding to the five picture elements making up a line on the 5×7 character matrix, which are converted into a series signal by the parallel-series converter, consisting of a Fairchild IC8 (74LS165) integrated circuit, which is then sent to one or more of outputs R', G', B' depending on the two color bits.

The character generating circuit 4 has another two input terminals ("CS" and "OFF")—one for print enabling the character generator RAM memory and the other for disabling any printing on the screen—both connected to appropriate outputs on the microcomputer control unit.

Operation of the latter is shown in the block diagrams of its basic functions.

Figure 3:
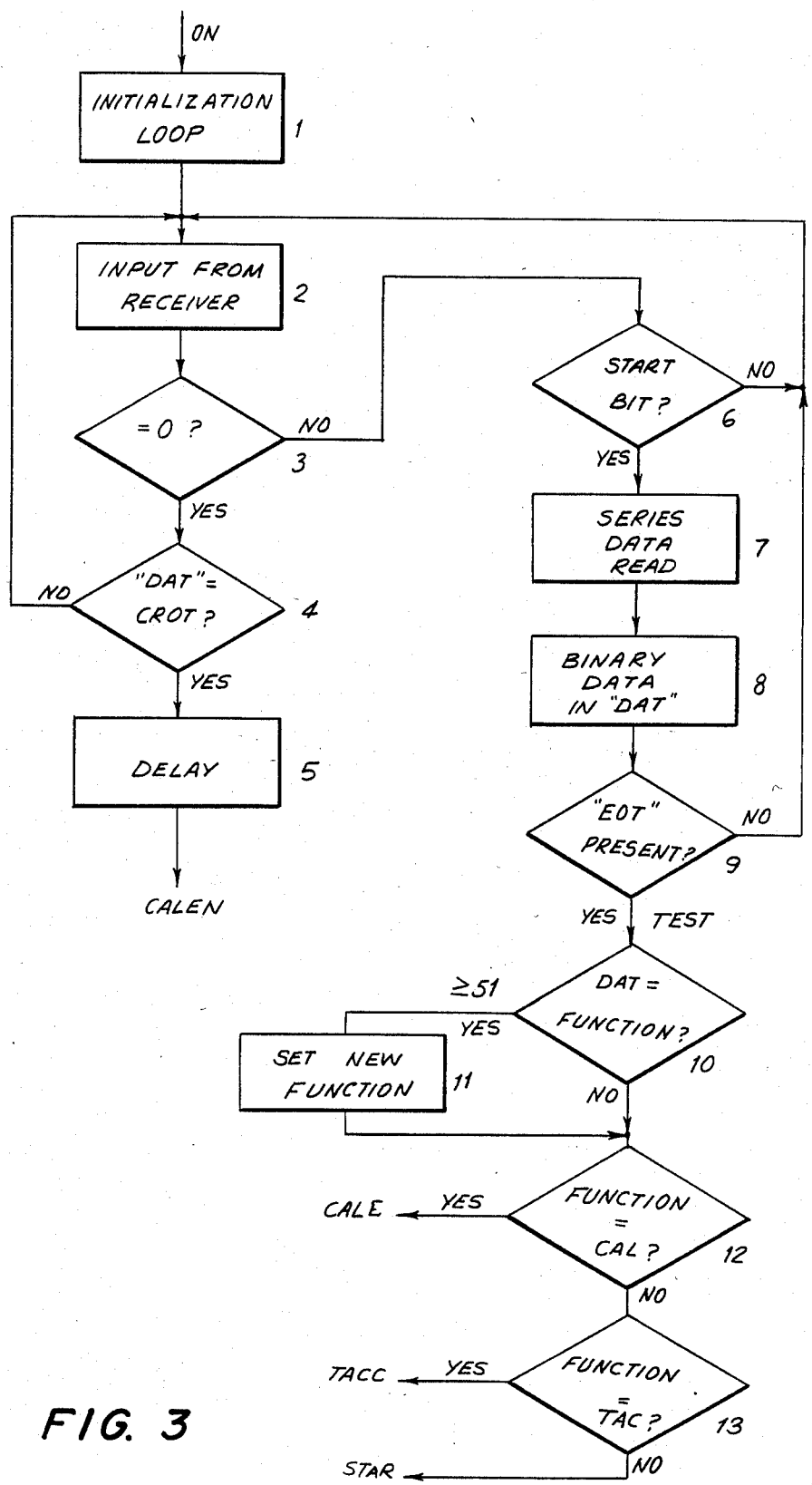

FIG. 3 shows reading and decoding of the controls received from amplifier 2 in FIG. 1 and function selection. Number 1 in FIG. 3 indicates an initialization block which, when activated by an "ON" signal, assigns specific initial values to the registers and TIMER and arranged for the "receiver control" function.

The initialization block activates the next block (2) which reads the input signal from amplifier 2 in FIG. 1 and, in turn, activates block 3, which checks whether the signal is 0.

The "YES" output of block 3 activates block 4, which checks whether the "DAT" register contains a preset "CROT" value. The "NO" output of block 4 supplies the signal for activating block 2 while the "YES" output activates block 5, which, after a set pause, supplies a "CALEN" signal for activating the blocks in FIG. 9.

The "NO" output of block 3 activates the next block (6), which checks whether the input signal contains a START BIT. The "NO" output supplies a signal for activating block 2 while the "YES" output activates in turn:

block 7 which reads the series signal received from amplifier 2 in FIG. 1;
block 8 which converts the read data into a binary number and stores it in the "DAT" register;
block 9 which detects the presence of an end-of-transmission "EOT" signal.

The "NO" output of block 9 supplies a signal for activating block 2 while the "YES" output activates block 10, which checks whether the "DAT" register contains a set of "FUNCTION" (>50) values. The "YES" output activates block 11, which arranges for the new function and stores the contents of the "DAT" register in the "FUNCTION" register, while the "NO" output of block 10 and the output of block 11 activate in turn:

block 12 which checks whether the "FUNCTION" register contains a prearranged "CAL" value corresponding to the code of the calendar key on keyboard 1 in FIG. 2;
block 13 which checks whether the "FUNCTION" register contains a prearranged "TAC" value corresponding to the code of the scratch pad key on keyboard 1 in FIG. 2.

The "YES" output of block 12 supplies a "CALE" signal for activating the blocks described later in FIG. 8. The "YES" output of block 13 supplies a "TACC" (scratch pad) signal for activating the blocks described later in FIG. 4, while the "NO" output supplies a "STAR" signal for activating the television function control blocks described later in FIG. 11. FIG. 4 shows block diagrams of the basic "TACC" logic functions performed by the control unit.

The "TACC" signal received from block 13 in FIG. 3 activates block 20, which checks whether the "DAT" register contains a prearranged "TAC" value (i.e.

whether the scratch pad function key has just been pressed on keyboard 1 in FIG. 1).

The "YES" output (first time) activates in turn:
block 21 which zeroes the shift mode (sets the keys in the first character group, i.e. letters of the alphabet);
block 22 which supplies character generator 4 in FIG. 1 with the data stored in RAM 7 corresponding to the last seven lines of characters forming the scratch pad message;
block 23 which supplies the character generating circuit with first line data and positions the "pointer" character in the first top left-hand position on the screen.

Block 23 then supplies an enabling (LOOP) control to block 2 in FIG. 3. The "NO" output of block 20 activates block 24, which checks whether the "DAT" register contains a prearranged "RAND" value, while the "YES" output of block 24 activates in turn:
block 26, which sets a pointer at the start of the message in the form of a set of codes stored in the ROM memory of the microprocessor;
block 27 which checks for an F signal.

The "YES" output of block 27 then activates block 31, which clears the F signal, and block 32, which sends the ROM code sequence to the character generating circuit.

The "NO" output of block 27 activates in turn:
block 28 which generates the F signal;
block 29 which generates all the codes representing all the characters that can be generated by the character generating circuit;
block 30 which sends the generated codes to the character generating circuit.

Blocks 30 and 32 supply the enabling signal to block 2 in FIG. 3.

The "NO" output of block 24 activates block 25, which, depending on the line number ("ADD" register) and pointer position ("CRT" register), sets the pointer to a particular cell in RAM memory 7 in FIG. 1.

Block 25 activates block 33, which checks whether the content of the "DAT" register belongs to the group of control function values (>32). The "NO" output (data for display) activates in turn:
block 34, which adds a shift function bit and two color function bits to the content of the "DAT" register and stores the new data in the RAM memory;
block 35, which alters the content of the "CRT" (pointer position) register;
block 36, which checks whether the position of the pointer corresponds to the end of a line.

The "YES" output of block 36 activates in turn block 37, which sends all the line data to the character generating circuit, and block 38, which alters the content of the "ADD" (line pointer) register.

The "NO" output of block 36 and block 38 activate block 39, which sends the new line data to the character generating circuit and an enabling signal to block 2 in FIG. 3.

The "YES" output of block 33 activates in turn:
block 40, which checks whether the "DAT" register contains a prearranged "RETURN" value (new line key clearing all the remaining characters on the present line);
block 41, which checks whether the "DAT" register contains a "SHIFT" value (key for selecting first or second case for the first 32 keys on the keyboard);
block 42, which checks whether the "DAT" register contains a "PFOR" value (pointer forward shift key);
block 43, which checks whether the "DAT" register contains a "PBACK" value (pointer backward shift key);
block 44, which checks whether the "DAT" register contains a "PDOWN" value (key for shifting the pointer to the start of the next line);
block 45, which checks whether the "DAT" register contains a "CLEAR" value (key for clearing the page starting from the present position);
block 46, which alters the data (0-3) in the color register.

Figure 7:
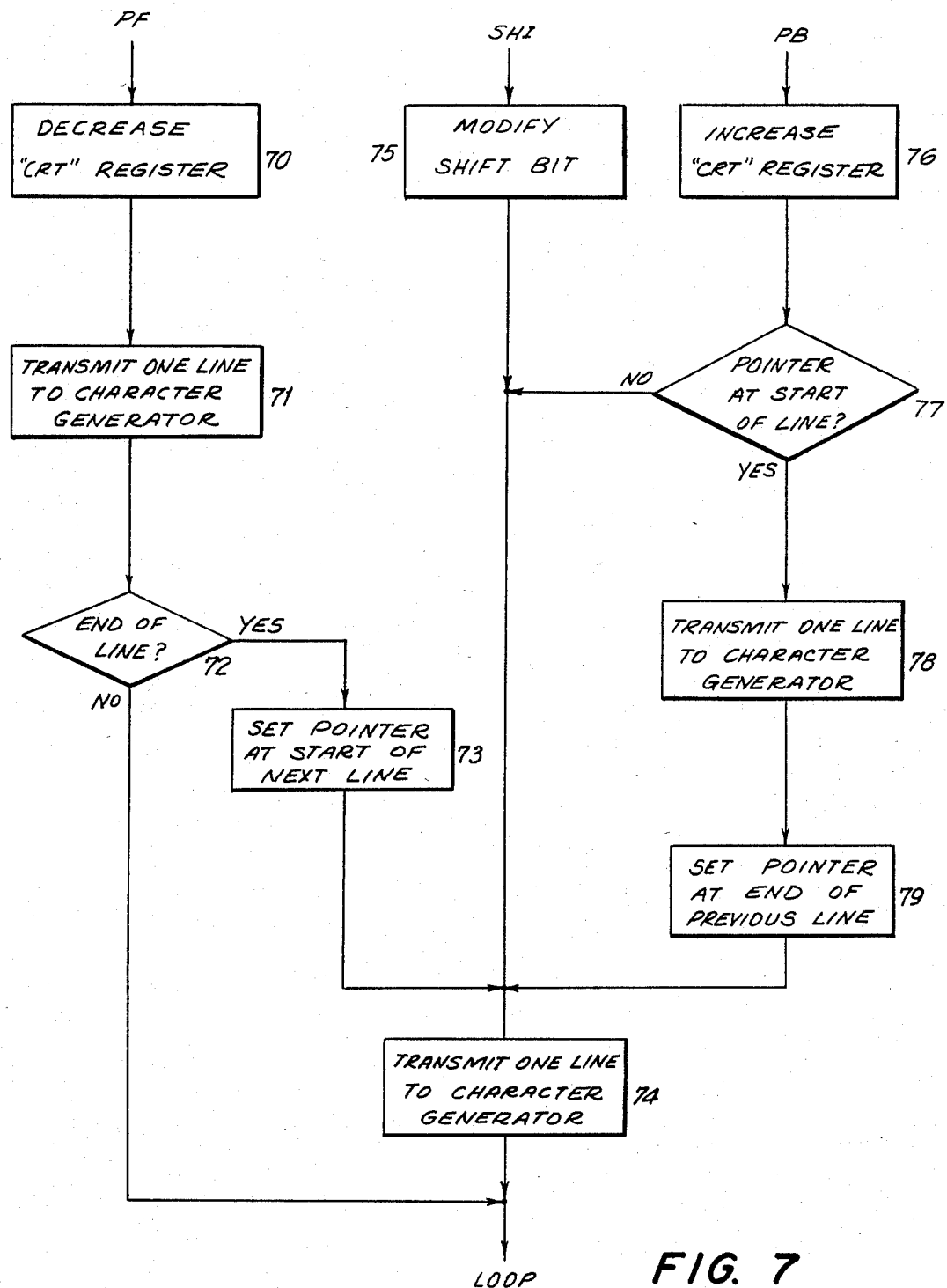

The "YES" outputs of blocks 40-45 supply signals RET, SHI, PF, PB, PD and CL respectively for enabling the next blocks in FIGS. 5-7.

Block 46 supplies the activating signal to block 39.

FIG. 5 shows the reading of a line in RAM memory 7 of FIG. 1 and transmission to the character generating circuit, i.e. operation of FIG. 4 blocks, such as 22, 23, 37 and 39, in greater detail. Number 50 in FIG. 5 indicates a block which, depending on the present line number in the "ADD" register, initializes a pointer register at a given cell in RAM memory 7 in FIG. 1.

The block 50 activates in turn:
block 51, which enables the RAM memory for reading;
block 52, which reads data from the RAM memory;
block 53, which checks whether the position of the character that has just been read tallies with the position of the pointer.

The "YES" output of block 53 activates block 54, which substitutes the read data with a selected pointer character code ("-"=31) and adds the color and shift bits.

The "NO" output of block 53 and the output of block 54 activate in turn:
block 55, which copies the data into a memory BUFFER inside the microprocessor control unit;
block 56, which checks whether the read data is the last of a print line.

The "NO" output of block 56 supplies an enabling signal to block 52, while the "YES" output enables block 57, which waits for a vertical-frequency sync pulse, after which it supplies an enabling signal to block 58, which transfers the line data stored in the BUFFER to the character generating circuit.

FIGS. 6 and 7 show block diagrams of the elementary functions performed by the microcomputer control unit for controlling composition of the printed text. FIG. 6 shows the page clearing functions and pointer shift with or without clearing and FIG. 7 the shift function and pointer shift to the right or left.

The "RET" or "CL" signal in FIG. 6, supplied by blocks 40 and 45 in FIG. 4, activates in turn:
block 60, which sends the "BLANK" character code to RAM memory 7 in FIG. 1;
block 61, which modifies pointer position counter "CRT";
block 62, which checks whether the position corresponds with the end of a line.

The "NO" output of block 62 supplies an enabling signal to block 60, while the "YES" output supplies an enabling signal to block 63, which checks whether the "DAT" register contains a preset "CLEAR" value (clear key); the "YES" output activates block 64, which modifies the pointer registers to indicate the start of the next line and activates block 67, which checks whether the end of the last line has been reached; the "YES" output supplies signal TC1 to block 21 in FIG. 4, while the "NO" output supplies an enabling signal to block 60. The "NO" output activates in turn:

block 65, which transmits a line of data to the character generating circuit;

block 66, which points to the start of the next line and supplies an enabling signal to block 2 in FIG. 3 (await new data).

The "PF" signal in FIG. 7 from block 42 in FIG. 4 activates in turn:

block 70, which decreases the "CRT" register (one place forward pointer shift);

block 71, which transmits a line of characters to the character generating circuit;

block 72, which checks whether the pointer is positioned at the end of a line.

The "YES" output of block 72 activates block 73, which sets the pointers at the start of the next line, and block 74, which transmits a line of characters to the character generating circuit. The "NO" output of block 72 and block 74 supply an enabling signal to block 2 in FIG. 3. The "SHI" output from block 41 in FIG. 4 activates block 75, which modifies the "SHIFT" function bit (first or second function group selection on the keyboard) and supplies an enabling signal to block 74. The "PB" signal from block 43 in FIG. 4 activates block 76, which increases the content of counter "CRT" (pointer one place back shift), and block 77, which checks whether the pointer was positioned at the start of a line. The "NO" output activates block 74, while the "YES" output activates, in turn, block 78, which transmits a line of characters to the character generating circuit, and block 79, which sets the pointers at the end of the previous line.

The output of block 79 supplies an enabling signal to block 74.

To give a clearer description, the following is a summary of the operating features of the blocks mentioned above. When the "TAC" function key is pressed, the complete message recorded beforehand in the RAM appears on the screen. At the same time, the control unit is set for compiling a new message or altering or completing the existing one. The pointer character "-" in the top left-hand corner indicates where any newly entered character will be inserted. The user may cancel the message entirely ("CLEAR" key) or shift the pointer as required for compiling the message using the pointer shift keys (back, forward, new line, etc.). The "SHIFT" key provides for inserting letters or numbers and punctuation marks. When operated, the pointer character changes to inform the user, by means of a visual aid, which group of characters has been selected ("-" for letters, " ^ " for numbers). The pointer also changes color whenever the "COL" key is pressed (white, red, yellow, magenta) to remind the user which color has been selected for display. Each character entered is automatically stored in the memory. Furthermore, whenever a key is operated (characters, pointer shift, etc.), the content of the present line is transmitted to the character generator. Transmitting a whole line each time is the best compromise between transmission speed and the number of connections required and also guarantees constant character alignment.

Furthermore, transmission is synchronous with vertical return so as to avoid any visibile interference on the screen. The scratch pad function also includes two fixed messages, generated by the control unit regardless of the message compiled by the user.

Both are called up alternately whenever the "PRG" key is operated. The first fixed message concerns the more common receiver operating instructions and consists of a full-page message stored in the ROM, as opposed to the RAM, on the microcomputer during masking. The second corresponds to the entire group of display characters produced by the microcomputer unit (all 256 possible 8-bit data values displayed by the character generating circuit in four groups of 64 characters in four colors over eight lines) which serves both as a memo for the user and for making a fast check of correct circuit operating during stop testing.

In the example shown, a special meaning has been assigned to the last line in the scratch pad, which may be used for memorizing special dates, such as birthdays, anniversaries, appointments, etc.

This is usually displayed and may be compiled and altered in the same way as the other lines in the pad.

Furthermore, if the dates are represented by:

NN/MM or by two figures indicating the number of the day followed by "/" and the number of the month, they are automatically recognized and shown whenever the calender of a particular month is called up. However, this will be described in more detail when FIG. 10 is discussed.

Operation of the above blocks is illustrated more clearly in Tables 1 and 2 which show, in hexadecimal form, the internal connections of each cell in the ROM memory on microcomputer integrated circuit 3872, which constitutes the cell control unit.

Table 1 shows the blocks in FIG. 3 for reading and decoding the controls received from the remote control and selecting the functions to be performed.

Table 2 shows the blocks in FIGS. 4–7 for performing the "SCRATCH PAD" function, i.e. displaying a message stored beforehand in the RAM memory and compiling and storing a new message.

TABLE 1

| ADDRESS | CODE | | | | | | | |
|---|---|---|---|---|---|---|---|---|
| M0000 = | 1A | 70 | B4 | 62 | 6C | 5C | 52 | 2A |
| M0008 = | 0F | C0 | 20 | E0 | 17 | 71 | 17 | 7D |
| M0010 = | 58 | 20 | F0 | 17 | 38 | 94 | FD | 20 |
| M0018 = | 10 | B1 | 6F | 5C | 65 | 6D | 5C | 20 |
| M0020 = | AA | B6 | 2A | 0F | FF | 20 | 34 | 17 |
| M0028 = | 20 | 3C | 53 | 43 | 25 | 3C | 84 | 01 |
| M0030 = | 20 | A0 | 67 | 6F | 5E | 5D | 28 | 00 |
| M0038 = | D7 | 94 | 19 | 2A | 0F | FF | 16 | 25 |
| M0040 = | 33 | 94 | E9 | 43 | 25 | 2B | 94 | E4 |
| M0048 = | 1A | 3C | 94 | EB | 4E | 3D | 94 | E7 |
| M0050 = | 29 | 02 | B8 | 20 | BB | B7 | 28 | 00 |
| M0058 = | D7 | 94 | FC | 1A | A7 | 91 | D8 | 71 |
| M0060 = | 5A | 20 | 3F | 0B | 70 | 5E | 5C | 59 |
| M0068 = | 20 | A0 | B7 | 28 | 00 | D7 | 4B | E9 |
| M0070 = | 84 | FA | 4B | 59 | 70 | CB | 84 | 04 |
| M0078 = | 4A | CC | 5C | 4A | 13 | 5A | 84 | 0C |
| M0080 = | 25 | 10 | 94 | 0B | 0A | 25 | 3F | 84 |
| M0088 = | 0E | 90 | 04 | 71 | 5A | 4D | A7 | 91 |
| M0090 = | D8 | 20 | FF | B7 | 90 | DF | 20 | 3E |
| M0098 = | 0B | 70 | 59 | 71 | 5A | 25 | 10 | 94 |
| M00A0 = | 05 | 4D | 4C | 15 | 5C | 4C | 12 | 5C |
| M00A8 = | FA | C9 | 59 | 4A | 13 | 5A | 81 | EE |
| M00B0 = | 49 | 25 | 3E | 84 | 05 | 53 | 29 | 00 |
| M00B8 = | 30 | 43 | 25 | 31 | 81 | 05 | 2A | 0F |
| M00C0 = | FF | 17 | 2A | 0F | FF | 16 | 25 | 33 |

TABLE 1-continued

| ADDRESS | CODE | | | | | | | |
|---|---|---|---|---|---|---|---|---|
| M00C8 = | 84 | 06 | 92 | 07 | 29 | 01 | 3B | 29 |
| M00D0 = | 00 | DF | 43 | 52 | 29 | 09 | 1C | 70 |
| M00D8 = | B0 | A0 | 18 | 21 | 01 | 5B | 1C | |

TABLE 2

| ADDRESS | CODE | | | | | | | |
|---|---|---|---|---|---|---|---|---|
| M0138 = |    |    |    | 43 | 25 | 32 | 84 | 4A |
| M0140 = | 25 | 30 | 84 | 6C | 70 | C8 | 84 | 05 |
| M0148 = | 25 | 30 | 94 | 3E | 45 | 15 | 13 | C2 |
| M0150 = | 18 | 07 | 43 | 25 | 20 | 81 | 50 | 25 |
| M0158 = | 2E | 84 | 1B | 25 | 2F | 84 | 2D | 25 |
| M0160 = | 2A | 84 | 42 | 25 | 29 | 84 | 2B | 25 |
| M0168 = | 2B | 84 | 3E | 25 | 2D | 84 | 07 | 40 |
| M0170 = | 24 | 40 | 50 | 90 | 1B | 20 | 20 | 59 |
| M0178 = | 28 | 02 | A6 | 32 | 81 | F8 | 43 | 25 |
| M0180 = | 2D | 94 | 26 | 35 | 20 | 1F | 52 | 81 |
| M0188 = | ED | 90 | 51 | 48 | 23 | 30 | 58 | 90 |
| M0190 = | 65 | 42 | 24 | 02 | 25 | 1F | 81 | 0C |
| M0198 = | 70 | 52 | 28 | 02 | 5B | 45 | 1F | 21 |
| M01A0 = | 07 | 55 | 72 | 52 | 90 | 5D | 90 | 50 |
| M01A8 = | 70 | 52 | 28 | 02 | 5B | 90 | 5A | 38 |
| M01B0 = | 77 | 55 | 70 | 52 | 2A | 05 | 7F | 48 |
| M01B8 = | 21 | 01 | 94 | 15 | 20 | 1E | 59 | 20 |
| M01C0 = | 20 | 2A | 0F | DF | 17 | 17 | 42 | 17 |
| M01C8 = | 1F | 52 | 39 | 94 | FA | 2A | 0F | DF |
| M01D0 = | 20 | 20 | 59 | 28 | 02 | 8F | 35 | 81 |
| M01D8 = | DF | 90 | 37 | 70 | 58 | 52 | 07 | 20 |
| M01E0 = | 20 | 59 | 28 | 02 | A6 | 76 | 55 | 28 |
| M01E8 = | 02 | 5B | 35 | 81 | FB | 20 | C0 | 50 |
| M01F0 = | 20 | 1E | 52 | 77 | 55 | 90 | 18 | 43 |
| M01F8 = | 25 | 20 | 84 | 03 | C0 | E8 | 59 | 28 |
| M0200 = | 02 | A6 | 32 | 94 | 0A | 28 | 02 | 5B |
| M0208 = | 20 | 1E | 52 | 35 | 91 | E6 | 28 | 02 |
| M0210 = | 5B | 29 | 00 | 2B | 07 | 12 | E0 | E0 |
| M0218 = | C3 | C1 | CC | C5 | CE | C4 | C1 | D2 |
| M0220 = | C9 | CF | E0 | C4 | C5 | CC | FA | E0 |
| M0228 = | 07 | 08 | 16 | 59 | 70 | 55 | 22 | 10 |
| M0230 = | B1 | 28 | 02 | 4F | 94 | FC | 16 | 59 |
| M0238 = | 0F | 28 | 02 | 4F | 94 | FC | 2A | 02 |
| M0240 = | 14 | 16 | 59 | 20 | 20 | 18 | B4 | 28 |
| M0248 = | 02 | 52 | 94 | F8 | 70 | B1 | 0C | 16 |
| M0250 = | 18 | B4 | 45 | 22 | 18 | B1 | 23 | 08 |
| M0258 = | B1 | 39 | 1C | 2A | 0F | DF | 20 | 20 |
| M0260 = | 59 | 45 | 18 | 15 | 13 | 1F | 07 | 20 |
| M0268 = | 27 | B1 | 20 | 20 | 90 | 1B | 49 | 25 |
| M0270 = | 1F | 84 | F8 | 03 | B5 | 1F | 07 | 70 |
| M0278 = | B4 | A4 | 64 | 6F | 5C | 49 | E2 | 4C |
| M0280 = | 94 | 07 | 48 | 14 | 12 | C0 | 24 | 1E |
| M0288 = | 17 | 39 | 94 | E3 | 2A | 0F | DF | 08 |
| M0290 = | 77 | B1 | A0 | 21 | 10 | 94 | FC | 20 |
| M0298 = | 20 | 59 | 45 | 22 | 10 | B1 | 28 | 02 |
| M02A0 = | 4F | 94 | FC | 77 | B1 | 0C | A1 | 22 |
| M02A8 = | 20 | B1 | 03 | B5 | 1F | 07 | 49 | B4 |
| M02B0 = | A1 | 23 | 08 | B1 | 23 | 28 | B1 | 1C |

Figure 8:
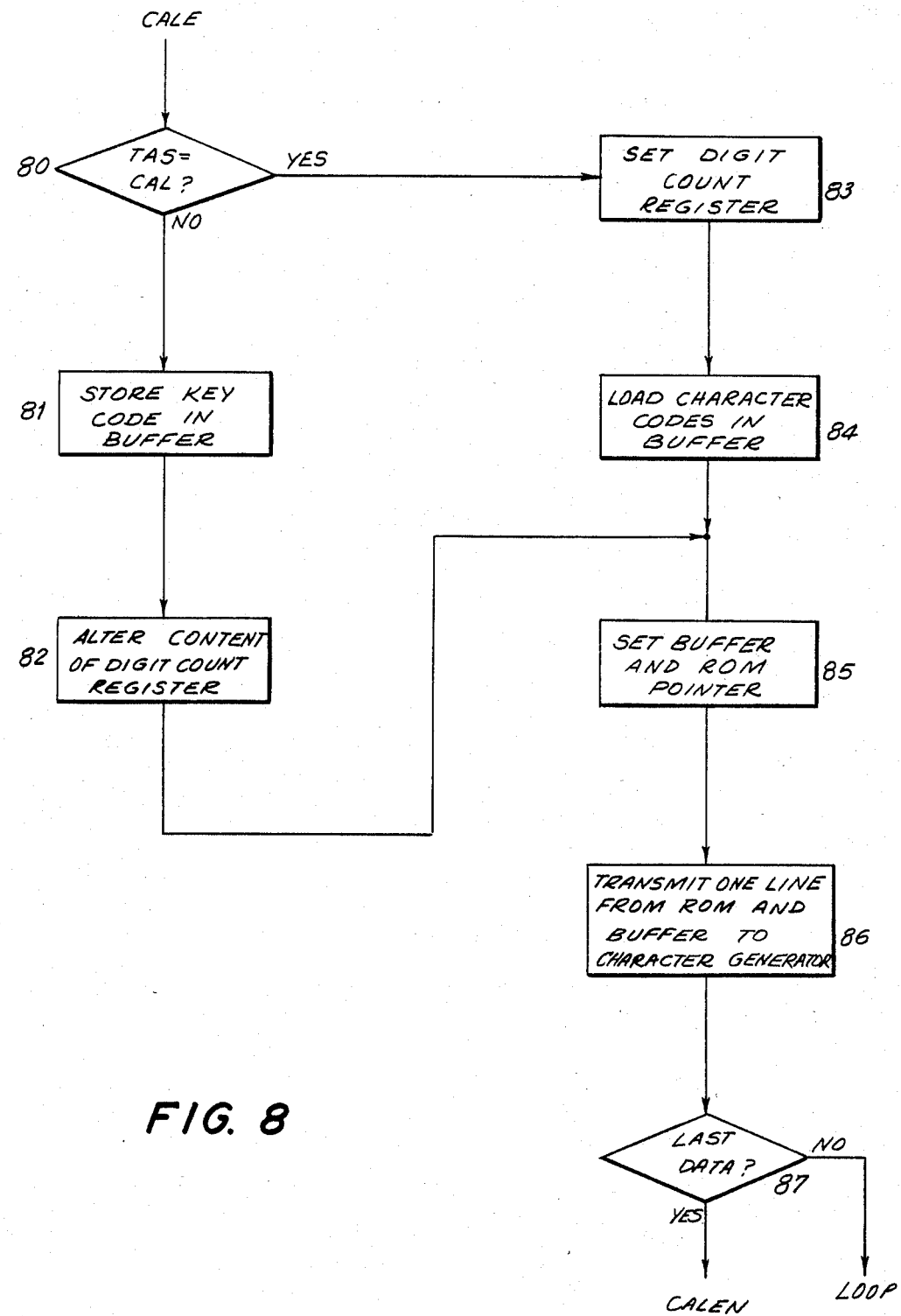

FIG. 8 shows data entry (month and year) for the calender call-up function.

The "CALE" signal from block 12 in FIG. 3 activates block 80, which checks whether the "TAS" register contains a preset "CAL" value (i.e. whether the calender function button has just been operated). The "NO" output activates, in turn, block 81, which stores the operated key code in a cell in the RAM memory buffer inside the microprocessor, and block 82, which alters the content of a digit count register. The "YES" output of block 80 activates, in turn, block 83, which assigns an initial value to said digit count register, and block 84, which stores the "??/????" character codes in the memory buffer.

Blocks 82 and 84 both activate:
block 85, which assigns initial vaues to pointer registers for locating a given cell in the ROM memory and the initial cell in the memory buffer;
block 86, which takes the character line data from the ROM memory and buffer and transmits it to the character generating circuit;
block 87, which checks whether the data entered is the last figure in the number of the year.

The "YES" output of block 87 supplies a "CALEN" signal to the blocks described later in connection with FIG. 9. The "NO" output supplies a signal for activating block 2 in FIG. 3 (await new data). FIG. 9 shows how Easter and the calender of a given month are calculated for the set year.

The "CALEN" signal from block 87 in FIG. 8 activates block 90, which checks whether the set month number (1–12) is acceptable: the "YES" output activates block 91, which checks whether the century number falls within a given range (16–24), while the "NO" output of blocks 90 and 91 activate in turn:
block 92, which assigns limit numbers 1 or 12 to the number of the month and 1600 or 2499 to the number of the year;
block 93, which supplies an error signal.

The "YES" output of block 91 and the output of block 93 activate in turn:
block 94, which converts the month number into a binary value and stores it in the "MES" register;
block 95, which, starting from the year and century number, calculates the date of Easter Sunday using the known Gauss formula and stores it in the "TE1" register;
block 96, which, starting from the date of Easter Sunday, calculates the first day in the required month (1=Monday, 7=Sunday) and stores it in a provisional register "R(A)";
block 97, which checks whether the number of the month read by the RAM memory tallies with that of the requested month.

The "YES" output of block 97 (indicating that the requested month is among the dates to be remembered) activates block 98, which stores the number of the day to be remembered in a "SPAD" register.

Block 98 and the "NO" output of block 97 activate block 99, which checks whether the data to be remembered is the last one in the RAM memory.

Figure 10:
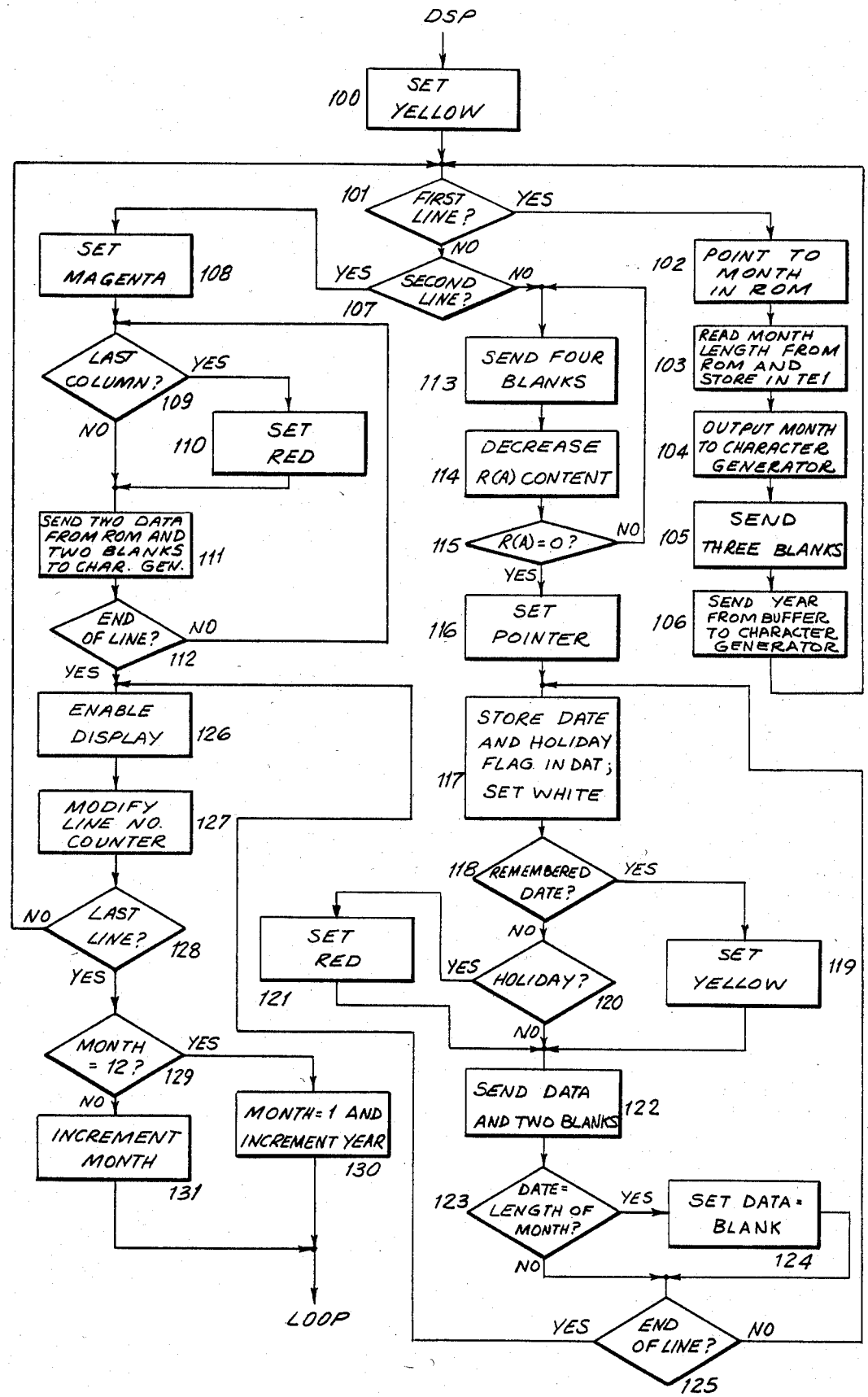

The "NO" output of block 99 activates block 97 again, while the "YES" output supplies a "DSP" signal to the nex blocks in FIG. 10.

FIG. 10 shows block diagrams of elementary logic functions performed by the control unit for displaying a calender page. The "DSP" signal from block 99 in FIG. 9 activates block 100, which sets the color yellow and activates block 101, which checks whether it is the first line. The "YES" output of block 101 (line containing the name of the month and the year) activates in turn:
block 102, which points to the name of the month in the ROM;
block 103, which reads the length of the month and any holidays from the ROM and stores them in the TE1 register;
block 104, which sends the month name codes to the character generating circuit;
block 105, which sends three blank codes to the character generating circuit;
block 106, which sends the year number codes from the memory buffer to the character generating circuit.

The output of block 106 supplies a signal for activating block 101 the "NO" output of which activates block 107, which checks whether it is the second line.

The "YES" output of block 107 (line containing abbreviations of the days of the week: MO, TU, WE, TH, FR, SA, SU) activates block 108, which sets the color magenta, and block 109, which checks whether it is the last column. The "YES" output (Sundays) activates block 110, which sets the color red, while the "NO" output and the output of block 110 activate, in turn, block 111, which sends two data from the ROM and two blanks to the character generating circuit, and block 112, which checks whether it is the end of a line.

The "NO" output of block 112 supplies an enabling signal to block 109, while the "YES" output activates in turn:

block 126, which enables the character generating circuit for display;
block 127, which modifies the line number counter;
block 128, which checks whether it was the last line.

The "NO" output of block 128 (incomplete calender page) supplies a signal for activating block 101, while the "YES" output (complete page; increment month and year for rotating calendar) activates block 129, which checks whether the number of the month is 12. The "NO" output activates block 131, which increments the number of the month, while the "YES" output activates block 130, which assigns a 1 to the number of the month and increments the number of the year.

The outputs of blocks 130 and 131 supply a signal for activating block 2 in FIG. 3 (end of calender, await new instructions; if the "CROT" key has been pressed, after a certain length of time, the "CALEN" signal is generated again and the next month's calender is displayed on the screen).

The "NO" output of block 107 activates in turn:
block 113, which sends four blanks to the character generating circuit;
block 114, which decreases the content of the first day of the week register R(A);
block 115, which checks whether the content of the R(A) register is zero.

The "NO" output of block 115 supplies an enabling signal to block 113, while the "YES" output activates in turn:

block 116, which sets the pointer at the beginning of a number table in the ROM;
block 117, which stores the date and information indicating a possible holiday in the "DAT" register and sets the color white;
block 118, which checks whether the day is one of the dates to be remembered in the "SPAD" register.

The "YES" output of block 118 (day=date to be remembered) activates block 119, which sets the color yellow, while the "NO" output activates block 120, which checks whether the day in question is a holiday.

The "NO" output of block 120 activates block 121, which sets the color red.

Blocks 119 and 121 and the "NO" output of block 120 activate, in turn, block 122, which sends "DATA" relative to the day of the month and two blanks of the character generating circuit, and block 123, which checks whether the date corresponds with the length of the month.

The "YES" output of block 123 activates block 124, which assigns the "DATA" a blank code (to fill in with blanks after the last day of the month).

Block 124 and the "NO" output of block 123 activate block 125, which checks whether it is the end of a line.

The "NO" output activates block 117, while the "YES" output activates block 126.

Operation of the above blocks will become clearer from Tables 3–5.

Table 3 shows the blocks in FIG. 3 relative to the calendar data entry function.

Figure 9:
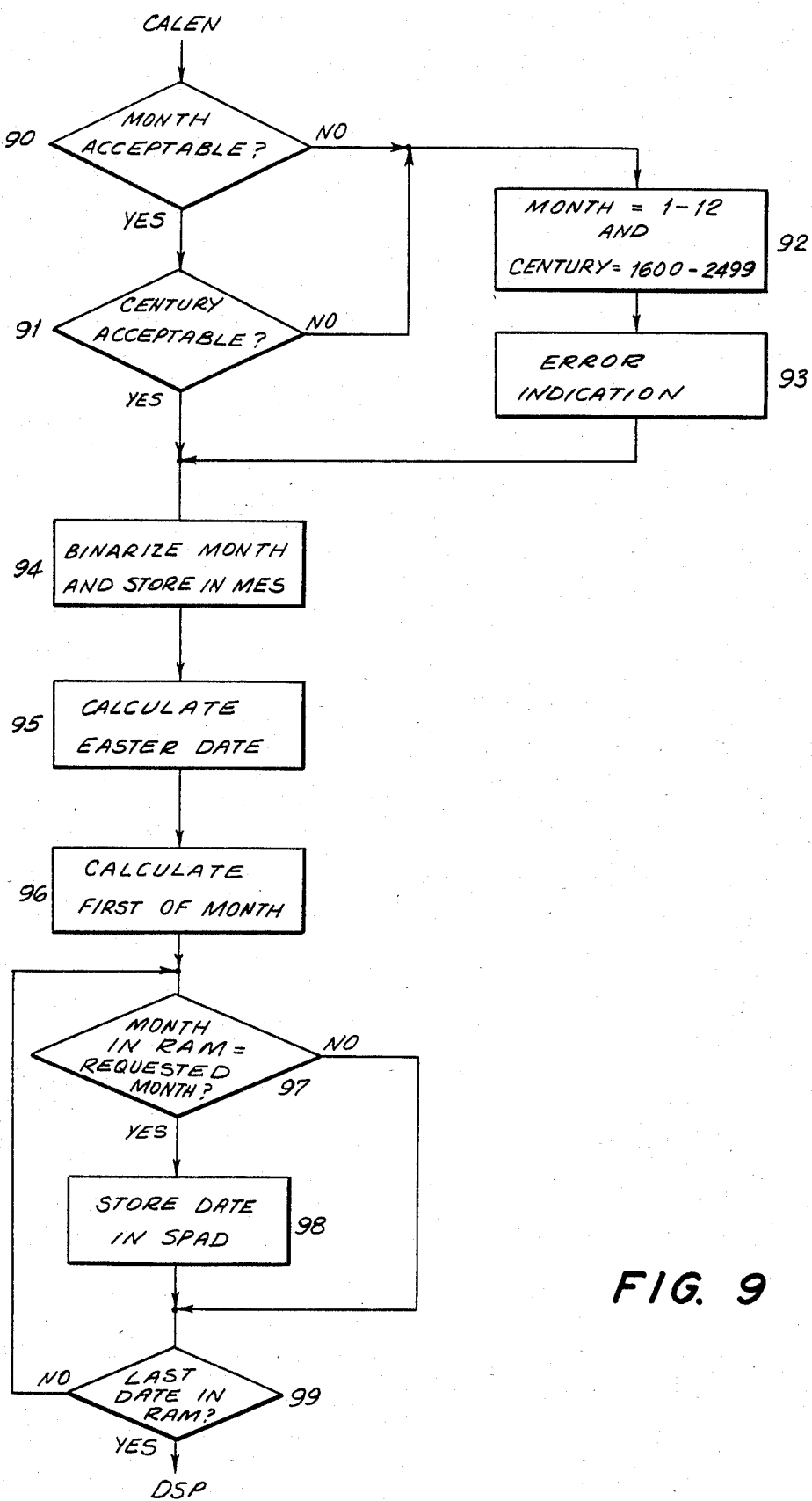

Table 4 shows the blocks in FIG. 9 for calculating Easter Sunday and the first day of the month requested, as well as examining the dates to be remembered.

Table 5 shows the blocks in FIG. 5 for transmitting data to the character generating circuit for displaying a calendar page in different colors.

TABLE 3

| ADDRESS | CODE | | | | | | | |
|---|---|---|---|---|---|---|---|---|
| M00D8 | | | | | | | | 66 |
| M00E0 = | 43 | 25 | 33 | 94 | 22 | 6D | 20 | 80 |
| M00E8 = | 58 | 2A | 0F | DF | 77 | 59 | 20 | 3F |
| M00F0 = | 22 | 40 | 17 | 39 | 94 | FD | 2A | 0F |
| M00F8 = | E1 | 20 | 2F | 22 | 40 | 17 | 70 | 52 |
| M0100 = | 2A | 0F | DF | 0E | 90 | 22 | 40 | 0B |
| M0108 = | 0F | 42 | 25 | 02 | 94 | 02 | 1F | 8E |
| M0110 = | 1F | 52 | 43 | 22 | 30 | 22 | 40 | 17 |
| M0118 = | C8 | 91 | 09 | 21 | 0F | CC | 5D | 20 |
| M0120 = | 80 | 90 | 04 | 15 | 5C | 70 | 58 | 2A |
| M0128 = | 02 | 15 | 28 | 02 | 29 | 0A | 50 | 24 |
| M0130 = | F8 | 21 | 07 | 94 | 04 | 29 | 02 | B8 |
| M0138 = | 29 | 00 | 2B | | | | | |

TABLE 4

| ADDRESS | CODE | | | | | | | |
|---|---|---|---|---|---|---|---|---|
| M02B8 = | 90 | 17 | 71 | 90 | 10 | 20 | 12 | 90 |
| M02C0 = | 0C | 20 | 24 | 5D | 20 | 99 | 90 | 05 |
| M02C8 = | 20 | 16 | 5D | 70 | 5C | 28 | 05 | 00 |
| M02D0 = | 66 | 6D | 4C | 25 | 00 | 82 | E4 | 25 |
| M02D8 = | 12 | 92 | E3 | 4D | 4C | 25 | 24 | 92 |
| M02E0 = | E1 | 25 | 15 | 82 | E4 | 6C | 4D | 4C |
| M02E8 = | 21 | 0F | 58 | 4E | 14 | 13 | 59 | 13 |
| M02F0 = | 13 | C9 | C8 | 58 | 4E | 4E | 48 | 5D |
| M02F8 = | 4D | 4D | 8F | EB | 2A | 05 | 9B | 6A |
| M0300 = | 4D | 5A | 4C | 8E | 13 | 13 | CD | CC |
| M0308 = | 24 | ED | 82 | FD | 24 | 13 | 67 | 6A |
| M0310 = | 5C | 20 | 13 | 59 | 16 | CC | 25 | 1D |
| M0318 = | 82 | 03 | 24 | E2 | 39 | 94 | F7 | 69 |
| M0320 = | 5C | 13 | CC | 58 | 66 | 6C | 4C | 21 |
| M0328 = | 03 | C8 | 58 | 4E | CC | CC | 24 | F9 |
| M0330 = | 82 | FD | 24 | 0A | 13 | C8 | 13 | 58 |
| M0338 = | 4C | 12 | 12 | 18 | CC | C8 | 24 | F9 |
| M0340 = | 82 | FD | 24 | 07 | 67 | 68 | 5C | 24 |
| M0348 = | 16 | 69 | CC | 58 | 59 | 25 | 1E | 81 |
| M0350 = | 1D | 24 | E1 | 59 | 25 | 19 | 91 | 0F |
| M0358 = | 94 | 11 | 68 | 4C | 25 | 06 | 94 | 0B |
| M0360 = | 6A | 4C | 25 | 0A | 81 | 05 | 49 | 24 |
| M0368 = | F9 | 59 | 74 | 90 | 02 | 73 | EA | 70 |
| M0370 = | 5B | 94 | 08 | 20 | 67 | DB | 5B | 39 |
| M0378 = | 81 | FA | 2A | 05 | B3 | 4A | 8E | 48 |
| M0380 = | 18 | 24 | 3C | 88 | 58 | 70 | 59 | 66 |
| M0388 = | 6C | 4C | 21 | 03 | 94 | 12 | CE | 94 |
| M0390 = | 06 | 4C | 21 | 03 | 94 | 0A | 4E | 4C |
| M0398 = | 25 | 02 | 91 | 04 | 38 | 71 | 59 | 6C |
| M03A0 = | 67 | 48 | 24 | F9 | 81 | FD | 24 | 07 |
| M03A8 = | 13 | 13 | 5C | 70 | 55 | 65 | 6F | 5E |
| M03B0 = | 8F | FE | 28 | 02 | 5B | 2A | 0F | E1 |
| M03B8 = | 0E | 03 | 24 | 00 | 81 | 2F | 16 | 21 |
| M03C0 = | 3F | 25 | 2F | 94 | F4 | 16 | 21 | 0F |
| M03C8 = | 13 | 5C | 13 | 13 | CC | 5C | 16 | 21 |
| M03D0 = | 0F | CC | 18 | 1F | CA | 94 | E2 | 20 |
| M03D8 = | FB | 8E | 16 | 21 | 0F | 13 | 5C | 13 |
| M03E0 = | 13 | CC | 5C | 16 | 21 | 0F | CC | 5D |
| M03E8 = | 73 | 8E | 90 | CD | | | | |
| M0528 = | | | | D3 | 47 | 45 | 4E | 4E |
| M0530 = | 06 | 80 | 46 | 45 | 42 | 42 | 52 | 41 |
| M0538 = | 49 | 4F | 83 | 4D | 41 | 52 | 5A | 4F |
| M0540 = | 82 | 41 | 50 | 52 | 49 | 4C | 45 | D3 |
| M0548 = | 4D | 41 | 47 | 47 | 49 | 4F | 82 | 47 |
| M0550 = | 49 | 55 | 47 | 4E | 4F | 83 | 4C | 55 |
| M0558 = | 47 | 4C | 49 | 4F | B3 | 41 | 47 | 4F |
| M0560 = | 53 | 54 | 4F | 82 | 53 | 45 | 54 | 54 |

TABLE 4-continued

| ADDRESS | CODE | | | | | | | |
|---|---|---|---|---|---|---|---|---|
| M0568 = | 0F | 83 | 4F | 54 | 54 | 4F | 0B | D2 |
| M0570 = | 4E | 4F | 56 | 04 | C3 | 44 | 49 | 43 |
| M0578 = | 45 | 4D | 42 | 52 | 45 | 80 | 4C | 55 |
| M0580 = | 4D | 41 | 4D | 45 | 47 | 49 | 56 | 45 |
| M0588 = | 53 | 41 | 44 | 4F | 71 | F2 | F3 | F4 |
| M0590 = | F5 | F6 | F7 | 78 | F9 | 90 | 91 | 92 |
| M0598 = | 93 | 94 | 15 | 96 | 97 | 98 | 99 | A0 |
| M05A0 = | A1 | A2 | A3 | A4 | 25 | 26 | A7 | A8 |
| M05A8 = | A9 | B0 | B1 | 16 | 17 | 17 | 18 | 18 |
| M05B0 = | 18 | 19 | 1A | 19 | 01 | 04 | 04 | 00 |
| M05B8 = | 02 | 05 | 00 | 03 | 06 | 01 | 04 | 06 |

TABLE 5

| ADDRESS | CODE | | | | | | | |
|---|---|---|---|---|---|---|---|---|
| M03E8 = | | | | 20 | 40 | 50 | 77 | |
| M03F0 = | 55 | B1 | 2A | 05 | 2B | 45 | 22 | 10 |
| M03F8 = | B1 | 20 | 1F | 52 | 49 | 25 | 02 | 84 |
| M0400 = | 70 | 28 | 05 | 1C | 42 | 25 | 1B | 91 |
| M0408 = | F9 | 45 | 25 | 07 | 84 | 25 | 25 | 05 |
| M0410 = | 94 | 06 | 6C | 67 | 3C | 81 | EB | 16 |
| M0418 = | 56 | 45 | 25 | 06 | 42 | 94 | 54 | 25 |
| M0420 = | 04 | 20 | 80 | 91 | 03 | 20 | 00 | 50 |
| M0428 = | 28 | 05 | 16 | 16 | 56 | 28 | 05 | 16 |
| M0430 = | 90 | 7D | 42 | 25 | 16 | 91 | CB | 70 |
| M0438 = | 88 | 81 | FD | 3A | 94 | FA | 5A | 21 |
| M0440 = | 0F | 94 | 02 | C9 | 59 | 20 | 8E | D9 |
| M0448 = | 59 | 16 | 25 | 1F | 81 | 06 | 56 | 28 |
| M0450 = | 05 | 16 | 70 | 8E | 70 | 88 | 81 | F3 |
| M0458 = | 28 | 05 | 1C | 42 | 25 | 0A | 91 | F9 |
| M0460 = | 6E | 66 | 4D | 58 | 28 | 05 | 01 | 4E |
| M0468 = | 58 | 2A | 05 | 7E | 90 | 73 | 90 | 86 |
| M0470 = | 90 | 72 | 25 | 04 | 81 | 32 | 46 | 21 |
| M0478 = | 7F | 25 | 70 | 82 | 03 | 21 | 0F | EB |
| M0480 = | 84 | 26 | 46 | 21 | 1F | 65 | 68 | EE |
| M0488 = | 84 | 05 | 8F | FC | 90 | 05 | 20 | 40 |
| M0490 = | 90 | 3D | 70 | C6 | 91 | 37 | 4A | 14 |
| M0498 = | 21 | 07 | E5 | 84 | 1D | 4A | 25 | C3 |
| M04A0 = | 94 | 2B | 45 | 25 | 02 | 91 | 26 | 20 |
| M04A8 = | 00 | 90 | 24 | 28 | 05 | 01 | 28 | 05 |
| M04B0 = | 1C | 28 | 05 | 1C | 91 | 33 | 29 | 04 |
| M04B8 = | 17 | 6D | 66 | 4D | 25 | 05 | 94 | E8 |
| M04C0 = | 4D | 25 | 18 | 92 | E3 | 94 | 06 | 4E |
| M04C8 = | 25 | 89 | 92 | DC | 20 | C0 | 50 | 46 |
| M04D0 = | 22 | 80 | 56 | 21 | 40 | 46 | 94 | 03 |
| M04D8 = | 21 | 7F | 58 | E9 | 94 | CE | 72 | 59 |
| M04E0 = | 28 | 05 | 01 | 28 | 05 | 1C | 81 | FC |
| M04E8 = | 77 | B1 | 35 | 81 | 82 | 6D | 66 | 4C |
| M04F0 = | 25 | 12 | 94 | 04 | 71 | 5D | 4D | 20 |
| M0458 = | 67 | DC | 5E | 84 | FB | 29 | 00 | 2B |
| M0500 = | 1C | 08 | 48 | 14 | 25 | 0F | 94 | 02 |
| M0508 = | 15 | 24 | 30 | 56 | 28 | 05 | 16 | 48 |
| M0510 = | 21 | 0F | 24 | 30 | 56 | 09 | 46 | 21 |
| M0518 = | 3F | C0 | 90 | 05 | 20 | 20 | 56 | 46 |
| M0520 = | 18 | B4 | 45 | 22 | 18 | B1 | 23 | 08 |
| M0528 = | B1 | 32 | 1C | | | | | |

Operation of the microcomputer control unit in connection with receiver functions is shown more clearly in the block diagrams in FIGS. 11–14.

Figure 11:
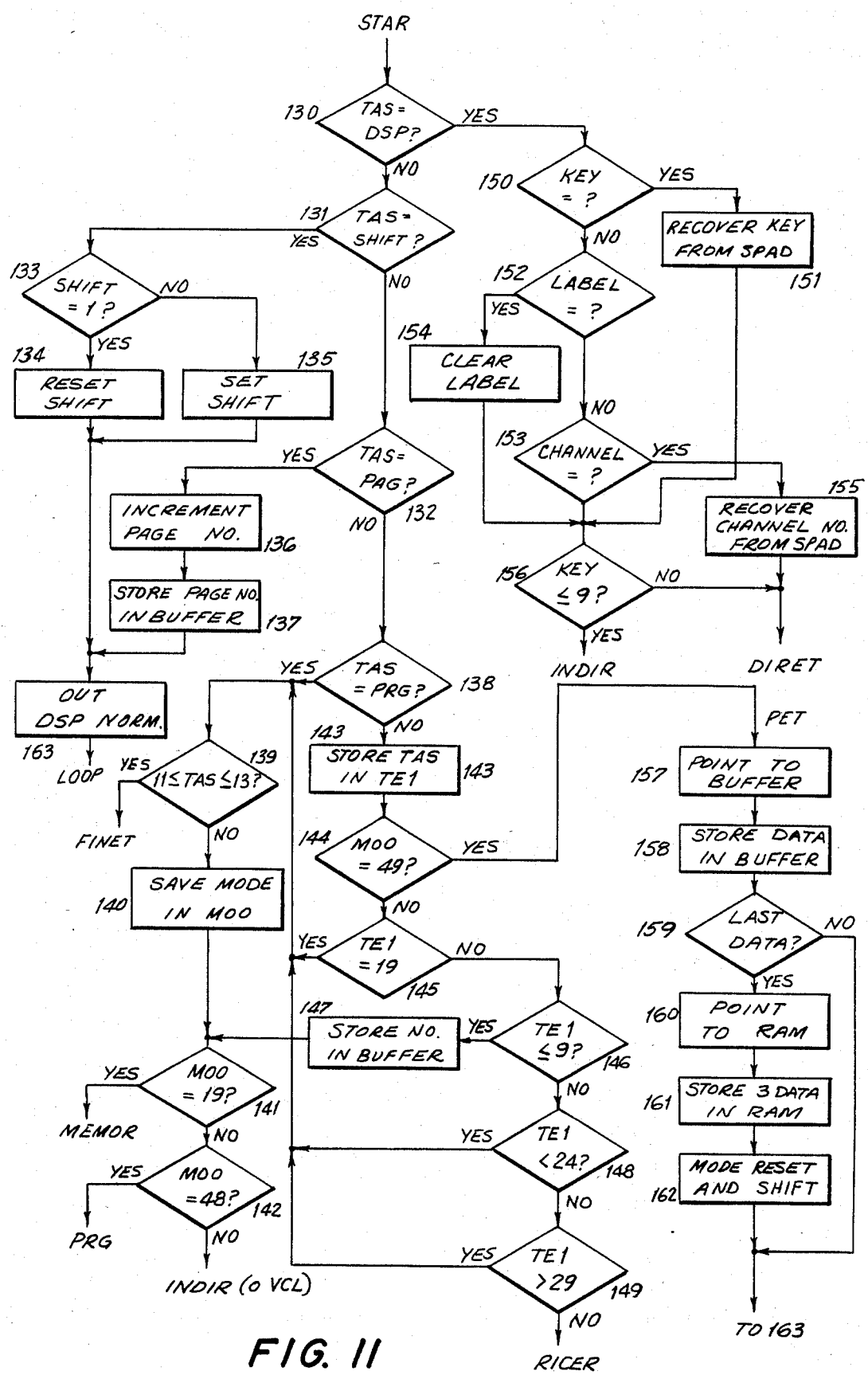

FIG. 11 shows operation mode selection (favorite program selection, etc.), "SHIFT" and memory page switch functions, return to normal television operation and memorization of program-associated station labels.

The "STAR" signal in FIG. 11 from block 13 in FIG. 3 activates block 130, which checks whether the operated key corresponds to a preset "DSP" code (return to normal operation of the set). The "YES" output of block 130 activates block 150, which checks whether, instead of the key number, the buffer contains the "?" code.

The "NO" output of block 150 activates, in turn, block 152, which checks whether, instead of the label, the buffer contains a "?", and block 153, which checks whether, instead of the channel number, the buffer contains a "?".

The "YES" output of block 150 activates block 151, which recovers the key number from one of the internal SPAD registers.

The "YES" output of block 152 activates block 154, which clears the label in the buffer. The "YES" output of block 153 activates block 155, which recovers the channel number from the SPAD.

The outputs of blocks 151 and 154 and the "NO" output of block 153 activate block 156, which checks whether the key number is between 0 and 9. The "YES" output supplies an "INDIR" signal to the blocks in FIG. 13, while the "NO" output and the output of block 155 supply a "DIRET" signal to the next receiver blocks for selecting a station in the usual way on the basis of a given transmission standard channel number.

The "NO" output of block 130 activates block 131, which checks whether the operated key corresponds to a given "SHIFT" code. The "YES" output of block 131 activates block 133, which checks whether the "SHIFT" function bit is 1: the "YES" output activates block 134, which zeroes the bit, while the "NO" output activates block 135, which sets the bit to 1. Blocks 134 and 135 supply a signal for activating block 163, which transmits the words "CHANNEL" and "KEY" to the character generating circuit together with the memory page, channel and program numbers and a label if there is one. A typical display in this case is:

---
P3
CHANNEL 42
KEY      6 GRP
---

The "NO" output of block 131 activates block 132, which checks whether the operated key corresponds to a given "PAG" code. The "YES" output activates, in turn, block 136, which increments the page number within a 1–3 range, block 137, which stores the page number in the buffer, and display block 163. The "NO" output activates block 138, which checks whether the operated key corresponds to a given "PRG" code. The "YES" output of block 138 activates block 139, which checks whether the operated key corresponds to a code from 11–13; the "YES" output supplies a "FINET" signal to the next blocks on the set which perform a tuning correction, while the "NO" output activates, in turn, block 140, which saves the operated key in a "MOO" mode register, and block 141, which checks whether the "MOO" register contains a preset 19 code. The "YES" output of block 141 supplies a "MEMOR" signal to the blocks in FIG. 12, while the "NO" output supplies an enable signal to block 142, which checks whether the "MOO" register contains a preset code 48. The "YES" output supplies a "PRG" signal to the blocks in FIG. 14, while the "NO" output supplies a signal to the next blocks in FIG. 13.

The "NO" output of block 138 activates, in turn, block 143, which stores the operated key in register "TE1", and block 144, which checks whether the "MOO" register contains a preset code 49 (label memorization).

The "NO" output of block 144 activates, in turn:
block 145, which checks whether the "TE1" register contains 19 (memorization);
block 146, which checks whether the "TE1" register is between 0 and 9;

block 148, which checks whether the "TE1" register is below a preset value of 48;

block 149, which checks whether the "TE1" register is over a preset value of 29.

The "YES" output of block 146 activates block 147, which saves the operated number in the buffer and supplies an enabling signal to block 141. The "YES" outputs of blocks 145, 148 and 149 supply an enabling signal to block 139. The "NO" output of block 149 supplies a "RICER" signal to the next blocks on the set which automatically scan the memorized programs and receivable channels.

The "YES" output of block 144 activates, in turn:

block 157, which converts a pointer register to the label character in the buffer;

block 158, which stores the operated key in the buffer;

block 159, which checks whether the entered data is the last (third character of the label).

The "YES" output of block 159 activates, in turn:

block 160, which points to a cell in RAM memory 7 of FIG. 1 corresponding to the first character of the selected page and program label;

block 161, which stores the three label data in the next three RAM cells;

block 162, which resets the SHIFT bit and normal program call-up mode.

Block 162 supplies a signal for activating display block 163 and for generating the "LOOP" signal for awaiting new instructions.

Figure 12:
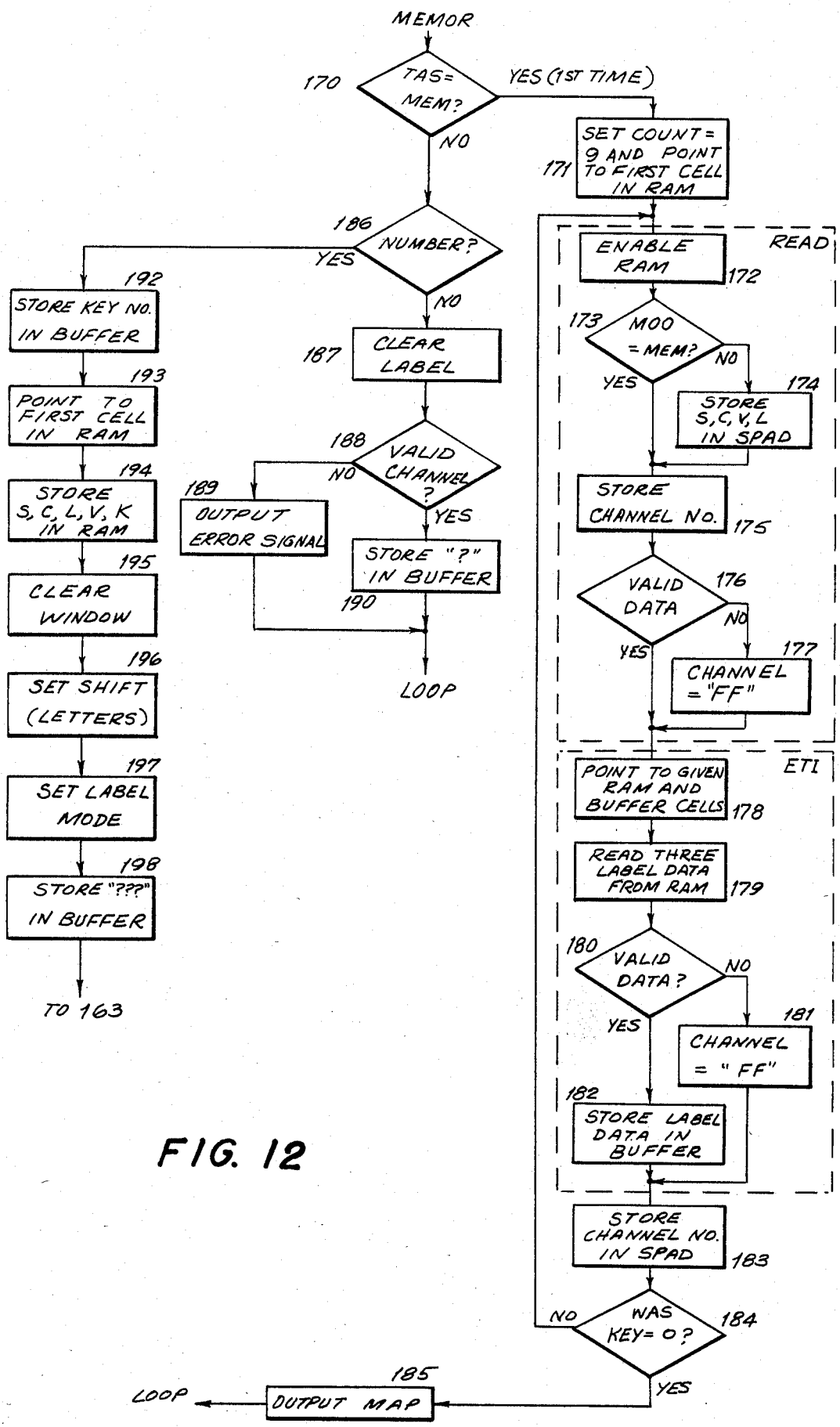

FIG. 12 shows map display of the channels on a memory page and memorization of channel data for assigning it to a given key. The "MEMOR" signal from block 141 in FIG. 11 activates block 170, which checks whether the operated key corresponds to a preset "MEM" value (memorization button).

The "YES" output of block 170 (first time the "MEM" key is operated) activates, in turn:

block 171, which assigns an initial value of 9 to the count register and points to an initial cell in RAM 7 of FIG. 1;

block 172, which read-enables the RAM memory;

block 173, which checks whether the "MOO" register contains a preset "MEM" value.

The "NO" output of block 173 activates block 174, which reads the tuning, color, volume and brightness data from the RAM memory and stores it in four "SPAD" registers.

Block 174 and the "YES" output of block 173 activate, in turn, block 175, which reads the channel number from the RAM memory and stores it in the "RD" register, and block 176, which checks whether the read data is valid.

The "NO" output of block 176 activates block 177, which assigns a fictitious "FF" number to the channel, while the output of block 177 and the "YES" output of block 176 activate, in turn:

block 178, which initializes pointer registers at a given RAM memory and buffer cell;

block 179, which reads three label data from the RAM memory;

block 180, which checks whether the label data is valid.

The "NO" output of block 180 activates block 181, which assigns an "FF" number to the channel, while the "YES" output activates block 182, which stores the label data in the buffer.

Blocks 181 and 182 activate, in turn, block 183, which stores the channel number in the "SPAD", and block 184, which checks whether the key count register contains a zero. The "NO" output of block 184 supplies a signal for activating block 172, while the "YES" output supplies a signal for activating block 185, which sends the numbers of 10 channels on a given memory page to the character generating circuit for displaying the map.

A typical channel map display is:

| C  | 21 | 30 | 42 |
|----|----|----|----|
| 22 | 35 | 61 | ?? |
| ?? | ?? | P3 |    | which indicates that the third program page contains channels C, 21, 30, 42, 22, 35 and 61 associated to keys 0-6, while keys 7, 8 and 9 are unassigned.

Blocks 172 to 177 form a single block, which we shall call "READ", for reading all the program data from the RAM memory. Blocks 178-182 also form a single block, which we shall call "ETI", for reading the label data from the RAM memory. Both "READ" and "ETI" blocks will be used again later. The "NO" output of block 170 activates block 186, which checks whether the operated key corresponds to a number from 0 to 9.

The "NO" output (second time the "MEM" key has been operated) activates, in turn, block 187, which clears the previous label in the buffer, and block 188, which checks whether the channel number is valid.

The "YES" output of block 188 activates block 190, which stores a "?" in the buffer to show that the receiver is waiting for the key number to be stored, while the "NO" output activates block 189, which supplies an error signal (short sound). Blocks 189 and 190 supply an enabling signal to block 2 in FIG. 3 (await further instructions).

The "YES" output of block 186 (actual memorization of a favorite program) activates, in turn:

block 192, which stores the key number in the buffer;

block 193, which points to the first cell in the RAM memory relative to the selected key number;

block 194, which stores tuning, color, volume, brightness and channel data in five consecutive RAM cells;

block 195, which clears the data in the buffer relative to the set data display window;

block 196, which sets the SHIFT bit to 1 (letter of the alphabet setting);

block 197, which stores a label memorization code (49) in the mode register;

block 198, which stores the "???" codes in the buffer.

Block 198 supplies an enabling signal to block 163 in FIG. 11 (await three label characters) which are then stored when blocks 157-162 in FIG. 11 (PET) are activated. A typical display during label memorization is:

| P3 ∧ |
|------|
| CHANNEL 42 |
| KEY 6 G?? |

In the example described, each label consists of three characters which may be letters of the alphabet, numbers or blanks. A special significance has been assigned, however, to labels whose first two letters are "VC", i.e. "VCR". Besides providing for memory tuning the set to the video cassette recorder channel, these labels, which recall the video cassette recorder, cause the microprocessor control unit to activate an automatic "AV" (time constant) switch so as to provide for good picture stability in the case of signals supplied from a video cassette recorder.

Figure 13:
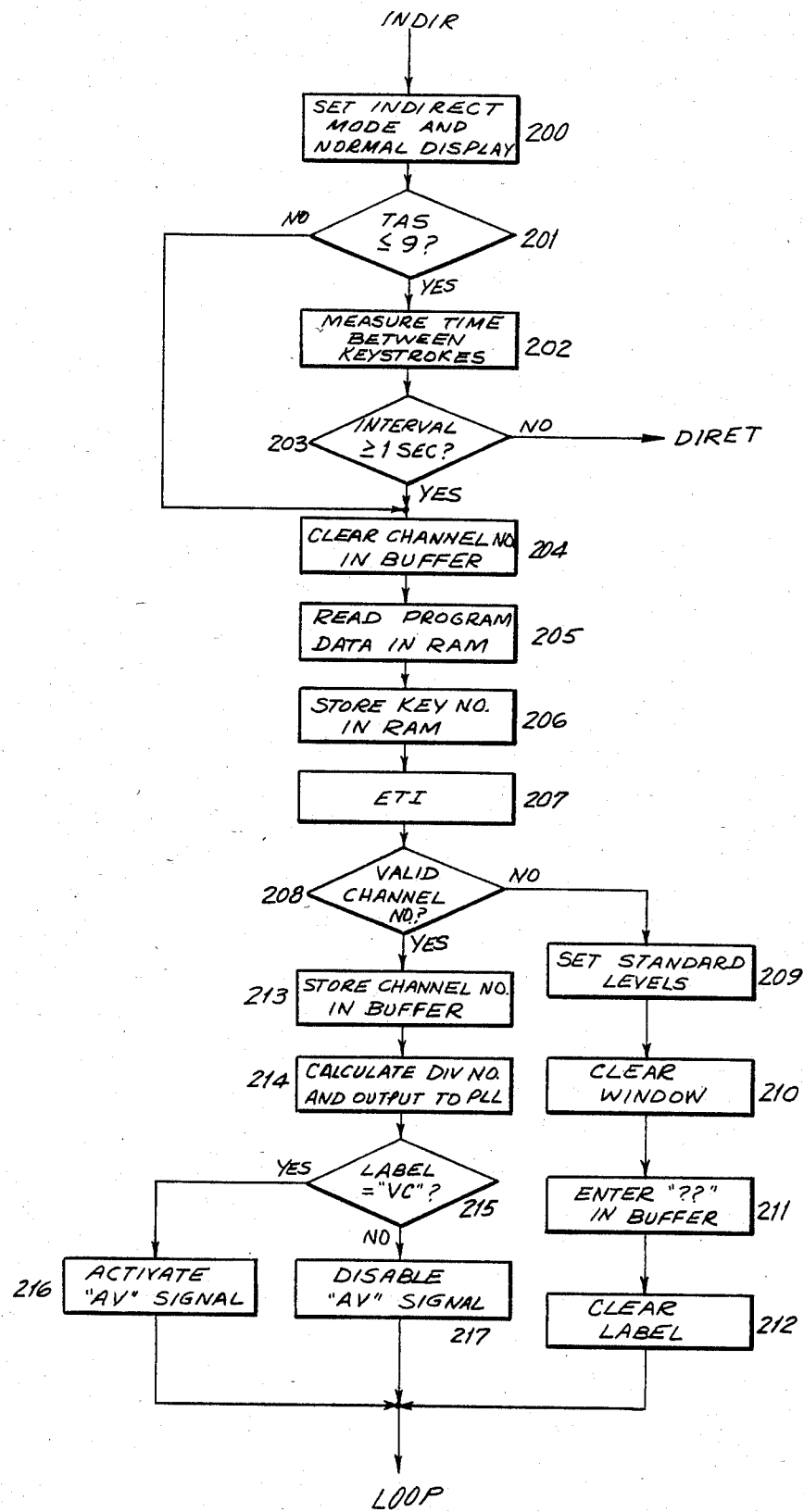

This particular operating mode will be described in more detail when FIG. 13 is discussed.

The "AV" switch activating function has been assigned to all the labels beginning with the letters "VC", so that switching is performed automatically both in the case of a "VCR" label, associated with a video cassette recorder, and "VC1", "VC2", "VCX" labels, etc. for receiving a number of different stations with a switched time constant, e.g. private broadcasting stations, using commercial video cassette recorders.

FIG. 13 shows indirect program selection, i.e. tuning into the 10×3 preferred stations corresponding to each of the 10 keys on the three pages.

The "INDIR" signal from the FIG. 11 blocks activates block 200, which provides for normal display and the indirect call-up mode, and block 201, which checks whether the operated key corresponds to a number from 0 to 9.

The "YES" output of block 201 activates, in turn, block 202, which calculates the time interval between two number key operations, and block 203, which checks whether the interval is greater than a given length of time, i.e. one second. The "NO" output of block 203 (two numbers operated in less than one second) supplies a "DIRET" signal to the next blocks on the receiver for selecting the station on the basis of the channel number, while the "YES" output of block 203 and the "NO" output of block 201 activate, in turn:

block 204, which clears the channel number in the buffer;

block 205 (same as the "READ" block in FIG. 12), which reads the program data in the RAM memory;

block 206, which stores the key number in the buffer;

block 207 (same as the "ETI" block in FIG. 12), which reads the label;

block 208, which checks whether the channel number is valid.

The "NO" output of block 208 activates, in turn:

block 209, which assigns standard volume, color and brightness values;

block 210, which clears the data relative to the window for displaying the data from the keyboard;

block 211, which enters two "??" in the buffer;

block 212, which clears the label in the buffer.

The "YES" output of block 208 activates, in turn:

block 213, which stores the channel number in the buffer;

block 214, which, on the basis of the channel number, calculates the division number to be sent to the PLL circuit for exact tuning of the channel;

block 215, which checks whether the first two letters on the label are "VC".

The "YES" output of block 215 activates block 216, which activates the signal for the "AV" terminal, while the "NO" output activates block 217, which disables the "AV" terminal signal. Blocks 212, 216 and 217 activate block 163 in FIG. 11 for display and awaiting further instructions.

Figure 14:
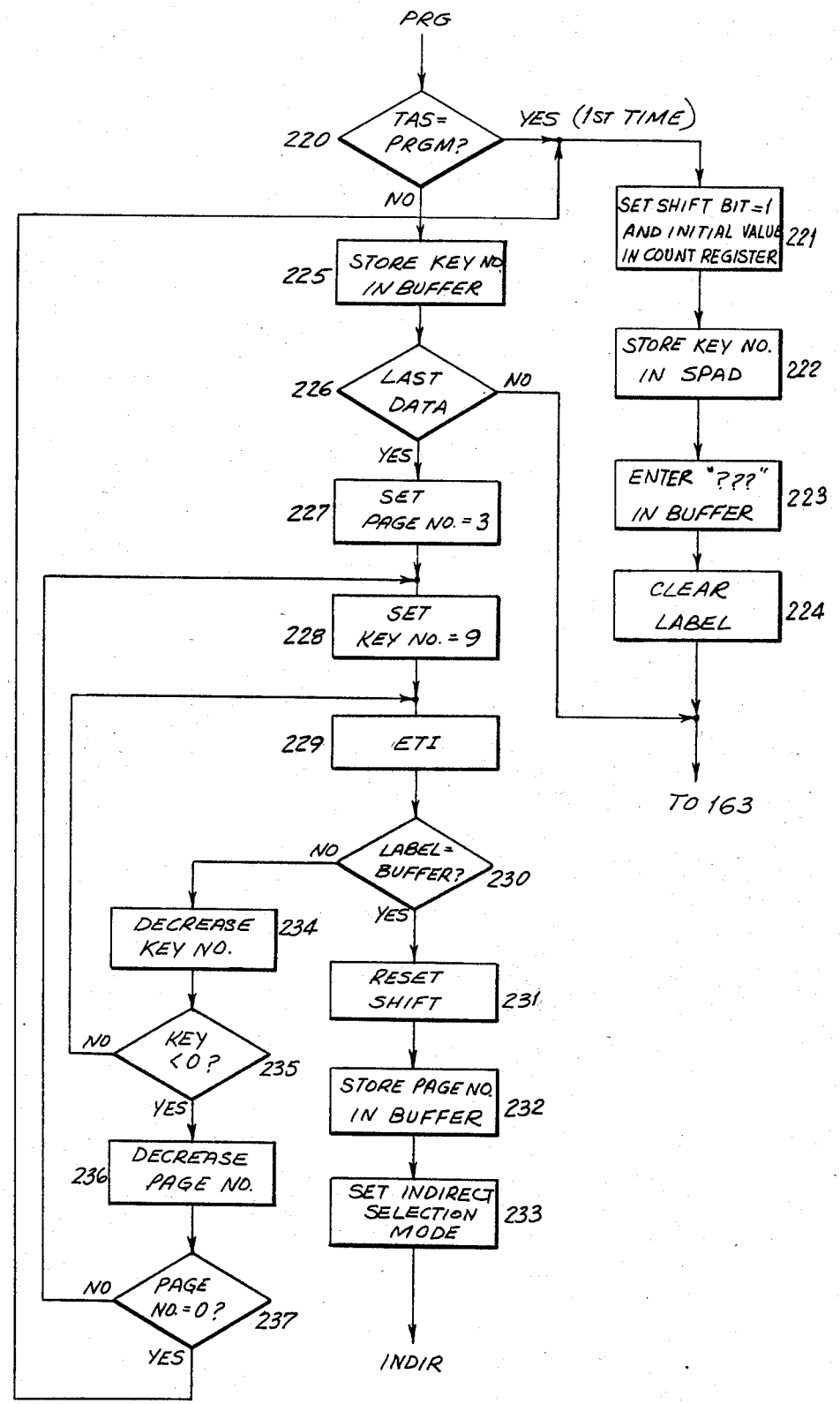

FIG. 14 shows selection of a station using the label associated with it.

The "PRG" signal from block 142 in FIG. 11 activates block 220, which checks whether the operated key corresponds to a preset "PRGM" code. The "YES" output (first time the "PRG" key is operated) activates, in turn:

block 221, which provides for normal display, sets the SHIFT bit to 1 (letter of the alphabet setting) and assigns an initial value to the count register;

block 222, which saves the key number in a SPAD register;

block 223, which enters "???" in the buffer;

block 224, which clears the label in the buffer.

The "NO" output of block 220 activates, in turn, block 225, which stores the key number in the buffer, and block 226, which checks whether the data entered is the last (count register=0).

Block 224 and the "NO" output of block 226 supply a signal for activating block 163 in FIG. 11 (await new data display). The "YES" output of block 226 activates, in turn:

block 227, which sets page N.3;

block 228, which sets key 9;

block 229 (same as the "ETI" block), which reads the label in the RAM;

block 230, which checks whether the read label corresponds to the one stored in the buffer.

The "YES" output of block 230 (label in the memory corresponds to the set one) activates, in turn:

block 231, which zeroes the SHIFT bit (number setting);

block 232, which stores the page number in the buffer;

block 233, which provides for the normal indirect selection mode.

Block 233 supplies a signal for activating block 200 in FIG. 13.

The "NO" output of block 230 activates, in turn, block 234, which decreases the key number, and block 235, which checks whether the key number is less than zero. The "NO" output supplies a signal for activating block 229, while the "YES" output activates, in turn, block 236, which decreases the page number, and block 237, which checks whether the page number is equal to zero.

The "NO" output of block 237 (label not yet found among the 10 stored programs) supplies a signal for activating block 238, while the "YES" output (label not in the memory) supplies a signal for activating block 221 and the next ones (new label setting).

A typical display during label channel call-up is:

| P1 | A |
|---|---|
| CHANNEL 54 | |
| KEY | G?? |

Operation of the circuits in FIGS. 11-14 will be described in more detail with reference to Tables 6-9.

To make things clearer, the following is a summary, for a number of operating modes, of the key functions on the panel and the data in the RAM memory and buffer.

The "receiver control" function is selected automatically when the set is turned on (block 1 in FIG. 3) or the "DSP" key is pressed.

A distinction must be made, however, as to whether the operating mode involves using the labels or not.

Only in the first case is the "SHI" (SHIFT) key active (for selecting the first or second case for the first 32 keys). Furthermore, the label call-up setting ("PRG" key) or call-up of the label during memorization provide for normal use of the letters which generally indicate an abbreviation of the broadcasting station. In all other cases, the SHIFT button is neglected and the keys on the keyboard assume the following functions:

| | |
|---|---|
| 0–9 | Selection of one of the 10 programs stored on the current memory page, or direct selection of 99 channels by pressing two numbers in less than one second. |
| \<e\> | Tuning correction. |
| MEM | Memory map display and (second time pressed) memorization setting. |
| VOL, LUM, SAT | Volume, brightness and color saturation adjustment. |
| R1, R2, R3 | Buttons for starting three types of memorized programme or channel scanning operations. |
| PAG | Page number forward key. |

Programs are divided into three 10-program pages, each programme indicated by 5 data and 3 letters for the label if there is one.

The data is stored in the memory in consecutive blocks of five (program 0 page 1, program 1 page 1, ... program 9 page 3, label 0 page 1, ... label 9 page 3).

Operation of the above blocks is shown more clearly on the similar to those we have already seen.

Tables 6 to 9 show operation of the blocks shown in FIGS. 11 to 14 respectively, for performing the functions described in connection with these Figures.

TABLE 6

| ADDRESS | CODE | | | | | | |
|---|---|---|---|---|---|---|---|
| M08D0 = | | | | | 2A | 0F | D6 |
| M08D8 = | 20 | 30 | 17 | 17 | 17 | 28 | 08 | 39 |
| M08E0 = | 28 | 08 | 71 | 2A | 0F | D6 | 73 | 5C |
| M08E8 = | 20 | 31 | 58 | 7F | 90 | AB | 28 | 09 |
| M08F0 = | 01 | 4C | 25 | 06 | 94 | A6 | 28 | 08 |
| M08F8 = | 39 | 70 | 57 | 58 | 2A | 0F | CA | 90 |
| M0900 = | 96 | 2A | 0F | CA | 16 | 25 | F0 | 70 |
| M0908 = | 94 | 03 | 20 | 30 | 50 | 2A | 0F | D3 |
| M0910 = | 65 | 6E | 4C | 8E | 1F | 5C | 43 | E0 |
| M0918 = | 24 | 10 | 17 | 1C | 2A | 0F | CA | 43 |
| M0920 = | 25 | 34 | 94 | 35 | 28 | 0D | 69 | 78 |
| M0928 = | 8E | 7F | 8D | 94 | 16 | 65 | 6A | 4C |
| M0930 = | 90 | 1E | 2A | 0F | CD | 8D | 94 | 14 |
| M0938 = | 70 | C1 | 81 | 19 | 21 | 0F | 57 | 29 |
| M0940 = | 09 | EC | 2A | 0F | D8 | 8D | 94 | EB |
| M0948 = | 28 | 0D | 71 | 2A | 0F | D4 | 16 | 25 |
| M0950 = | 09 | 82 | EC | 41 | 59 | 29 | 09 | DF |
| M0958 = | 25 | 2F | 84 | 33 | 25 | 2C | 84 | 29 |
| M0960 = | 25 | 30 | 84 | 4C | 5B | 48 | 25 | 31 |
| M0968 = | 94 | 04 | 29 | 08 | EE | 25 | 30 | 84 |
| M0970 = | 1B | 4B | 25 | 13 | 84 | 3A | 2A | 0F |
| M0978 = | CB | 25 | 09 | 81 | 24 | 25 | 17 | 81 |
| M0980 = | 2F | 25 | 1D | 91 | 2B | 29 | 07 | 41 |
| M0988 = | 29 | 06 | D1 | 29 | 08 | 7E | 16 | 25 |
| M0990 = | EE | 2A | 0F | CA | 84 | 05 | 20 | EE |
| M0998 = | 90 | 03 | 20 | F0 | 17 | 29 | 0C | 50 |
| M09A0 = | 5B | 47 | 56 | 17 | 4B | 57 | 17 | 7F |
| M09A8 = | E6 | 84 | 13 | 70 | 58 | 90 | 0F | 25 |
| M09B0 = | 0E | 91 | 08 | 25 | 0B | 81 | 04 | 29 |
| M09B8 = | 0B | 37 | 58 | 7F | 57 | 48 | 2A | 0F |
| M09C0 = | CB | 25 | 13 | 84 | 0E | 81 | 26 | 25 |
| M09C8 = | 30 | 84 | C1 | 25 | 16 | 91 | 1E | 29 |
| M09D0 = | 06 | F9 | 29 | 0A | 5C | | | |

TABLE 7

| ADDRESS | CODE | | | | | | |
|---|---|---|---|---|---|---|---|
| M0A58 = | | | | | 7F | E7 | 84 | 07 |
| M0A60 = | 70 | C5 | 94 | 89 | 90 | 6F | 55 | 16 |

TABLE 7-continued

| ADDRESS | CODE | | | | | | |
|---|---|---|---|---|---|---|---|
| M0A68 = | 25 | DD | 94 | 18 | 28 | 0D | 71 | 2A |
| M0A70 = | 0F | CD | 7F | 8D | 94 | 07 | 28 | 0D |
| M0A78 = | 63 | 29 | 0B | 64 | 2A | 0F | CC | 17 |
| M0A80 = | 29 | 0C | 4B | 20 | FF | 55 | 2A | 0F |
| M0A88 = | CB | 20 | DD | 17 | 20 | F0 | 17 | 20 |
| M0A90 = | 20 | 63 | 6C | 5C | A1 | 22 | 40 | B1 |
| M0A98 = | 79 | 57 | 50 | 28 | 07 | B8 | 28 | 08 |
| M0AA0 = | 17 | 47 | 24 | 1D | 0B | 70 | C6 | 94 |
| M0AA8 = | 03 | 20 | FF | 81 | 02 | 30 | 5C | 37 |
| M0AB0 = | 81 | EA | 70 | 57 | 28 | 08 | 01 | 24 |
| M0AB8 = | 33 | B5 | A4 | E0 | 84 | 0F | 70 | CC |
| M0AC0 = | 81 | 04 | 20 | 92 | 5C | 0A | 1F | 0B |
| M0AC8 = | 25 | 27 | 94 | F3 | 28 | 08 | 54 | 7F |
| M0AD0 = | 57 | 29 | 0C | 59 | 2A | 0F | D3 | 20 |
| M0AD8 = | F0 | 17 | 47 | 17 | 76 | 5B | 79 | 50 |
| M0AE0 = | 47 | 24 | 1D | 0B | 41 | 5C | 63 | 6D |
| M0AE8 = | 70 | CC | 81 | 02 | 30 | 0A | 1F | 0B |
| M0AF0 = | 25 | 27 | 94 | F5 | 28 | 08 | 01 | 62 |
| M0AF8 = | 6B | 4E | B4 | 23 | 80 | B4 | 23 | 80 |
| M0B00 = | B4 | 4A | 1F | B5 | 5A | 8F | 0A | 60 |
| M0B08 = | 69 | 20 | FF | 8E | 16 | 24 | 32 | 5A |
| M0B10 = | 4E | 3B | 94 | E7 | 70 | B4 | 28 | 08 |
| M0B18 = | 54 | 48 | 25 | 13 | 94 | 47 | 29 | 08 |
| M0B20 = | D5 | | | | | | | |
| M07B8 = | 08 | 28 | 08 | 01 | 62 | 6B | 3A | 90 |
| M07C0 = | 03 | 5C | 4E | 4A | 1F | 5A | B5 | 48 |
| M07C8 = | 25 | 13 | 94 | 04 | A4 | 8F | F4 | A4 |
| M07D0 = | 8F | F0 | 56 | 28 | 08 | 54 | 46 | 21 |
| M07D8 = | 0F | 25 | 09 | 91 | 0F | 6B | 4E | 25 |
| M07E0 = | 20 | 92 | 09 | 4E | 25 | 64 | 92 | 04 |
| M07E8 = | 8F | FA | 0C | 20 | FF | 56 | 0C | |
| M07F8 = | | | | | | | 00 | 34 |
| M0800 = | 68 | A1 | 23 | 80 | B1 | 47 | 13 | 13 |
| M0808 = | C7 | 5A | 2A | 0F | C1 | 16 | 2A | 07 |
| M0810 = | FD | 8E | 16 | CA | 5A | B5 | 1C | 08 |
| M0818 = | 2A | 0F | C1 | 16 | 59 | 08 | 28 | 08 |
| M0820 = | 5B | A4 | 25 | 10 | 82 | 0F | 25 | 49 |
| M0828 = | 92 | 0B | 17 | 4A | 1F | 5A | B5 | 3B |
| M0830 = | 94 | F0 | 90 | 04 | 20 | FF | 56 | 90 |
| M0838 = | 1B | 08 | 2A | 0F | C1 | 16 | 59 | 28 |
| M0840 = | 08 | 5B | 16 | 21 | 7F | B4 | 23 | 80 |
| M0848 = | B4 | 23 | 80 | B4 | 4A | 1F | 5A | B5 |
| M0850 = | 3B | 94 | F0 | 09 | 70 | B5 | A1 | 23 |
| M0858 = | 80 | B1 | 1C | A1 | 23 | 80 | B1 | 73 |
| M0860 = | 5B | 47 | 13 | C7 | 24 | 7C | 5A | 49 |
| M0868 = | 15 | 13 | CA | 5A | B5 | 2A | 0F | D6 |
| M0870 = | 1C | | | | | | | |

TABLE 8

| ADDRESS | CODE | | | | | | |
|---|---|---|---|---|---|---|---|
| M09E8 = | | | | | 70 | 58 | 55 | C7 |
| M09F0 = | 84 | 09 | 2A | 0F | CA | 16 | 25 | EE |
| M09F8 = | 84 | DC | 2A | 0F | D4 | 16 | 25 | 09 |
| M0A00 = | 92 | 04 | 22 | 80 | 51 | 43 | 25 | 09 |
| M0A08 = | 91 | 13 | 65 | 6D | 4C | 25 | 03 | 92 |
| M0A10 = | 0A | 25 | 01 | 73 | 5E | 5D | 94 | C1 |
| M0A18 = | 90 | 03 | 71 | 5C | 2A | 0F | CD | 7C |
| M0A20 = | 5A | 20 | F0 | 17 | 3A | 94 | FD | 28 |
| M0A28 = | 07 | B8 | 2A | 0F | D4 | 47 | 17 | 28 |
| M0A30 = | 08 | 17 | 46 | 59 | 25 | FF | 94 | 09 |
| M0A38 = | 28 | 07 | EF | 28 | 0D | 3E | 90 | 1A |
| M0A40 = | 2A | 0F | D6 | 16 | 25 | 56 | 94 | 0C |
| M0A48 = | 16 | 25 | 43 | 94 | 07 | A1 | 22 | 10 |
| M0A50 = | B1 | 90 | 07 | A1 | 22 | 10 | 23 | 10 |
| M0A58 = | B1 | 29 | 0B | 70 | | | | |
| M0B20 = | | 7F | 2A | 0F | CD | 17 | 17 | 2A |
| M0B28 = | 0F | D4 | 70 | 88 | 28 | 0D | 71 | 81 |
| M0B30 = | 04 | 28 | 0D | 63 | 29 | 0C | 4B | |

TABLE 9

| ADDRESS | CODE | | | | | | |
|---|---|---|---|---|---|---|---|
| M0878 = | | | | | | | 43 | 25 |
| M0880 = | 30 | 94 | 1C | 28 | 08 | 71 | 70 | 5C |
| M0888 = | 55 | 2A | 0F | D4 | 16 | 6A | 5C | 2A |
| M0890 = | 0F | D3 | 7F | 17 | 17 | 17 | 20 | F0 |
| M0898 = | 17 | 17 | 17 | 29 | 0C | 4B | 28 | 09 |

TABLE 9-continued

| ADDRESS | CODE | | | | | | |
|---|---|---|---|---|---|---|---|
| M08A0 = | 01 | 4C | 25 | 03 | 94 | F6 | 73 | 59 |
| M08A8 = | 79 | 57 | 28 | 08 | 1D | 73 | 5A | 2A |
| M08B0 = | 0F | D2 | 4A | 8E | 16 | 8D | 8D |
| M08B8 = | 94 | 14 | 3A | 94 | F3 | 2A | 0F | CA |
| M08C0 = | 20 | F0 | 17 | 2A | 0F | C1 | 49 | 17 |
| M08C8 = | 70 | 58 | 29 | 09 | FA | 37 | 81 | DB |
| M08D0 = | 39 | 94 | D6 | 90 | AF |

For a clearer understanding of Tables 1 to 9, in addition to the content of the cells in the RAM memory, Tables 10 to 18 also show the meaning of the instruction symbols used. These are in assembler language, which can be found in the operating manuals supplied by the maker of the 3870 microcomputer.

TABLE 10

| ADDRESS | CODE | ASSEMBLER | | |
|---|---|---|---|---|
| | | START | RORG | 0 |
| | | | ENTRY | LOOP |
| | | | EXTRN | CALE,CALEN,STAR,TACC |
| 0000 | 1A | | DI | |
| 0001 | 70 | | CLR | |
| 0002 | B4 | | OUTS | DOP |
| 0003 | 62 | | LISU | VEN |
| 0004 | 6C | | LISL | VAR |
| 0005 | 5C | | LR | S,A |
| 0006 | 52 | | LR | RIF,A |
| 0007 | 2A0FC0 | | DCI | BUF |
| 000A | 20E0 | | LI | H'EO' |
| 000C | 17 | | ST | |
| 000D | 71 | | LIS | 1 |
| 000E | 17 | | ST | |
| 000F | 7D | | LIS | 13 |
| 0010 | 58 | | LR | MOO,A |
| 0011 | 20F0 | | LI | H'FO' |
| 0013 | 17 | | ST | |
| 0014 | 38 | | DS | MOO |
| 0015 | 94FD | | BNZ | *-2 |
| 0017 | 2010 | | LI | H'10' |
| 0019 | B1 | | OUTS | S2P |
| 001A | 6F | | LISL | FMU |
| 001B | 5C | | LR | S,A |
| 001C | 65 | | LISU | 5 |
| 001D | 6D | | LISL | 5 |
| 001E | 5C | | LR | S,A |
| 001F | 20AA | | LI | H'AA' |
| 0021 | B6 | | OUTS | 6 |
| 0022 | 2A0FFF | | DCI | FUNZ |
| 0025 | 2034 | | LI | NOR |
| 0027 | 17 | | ST | |
| 0028 | 203C | | LI | 60 |
| 002A | 53 | | LR | TAS,A |
| 002B | 43 | LOOP | LR | A,TAS |
| 002C | 253C | | CI | 60 |
| 002E | 8401 | | BZ | INIZ |
| 0030 | 20A0 | INIZ | LI | 160 |
| 0032 | 67 | | LISU | TIME |
| 0033 | 6F | | LISL | TIME |
| 0034 | 5E | | LR | D,A |
| 0035 | 5D | | LR | I,A |
| 0036 | 2800D7 | IZZ | PI | INPUT |
| 0039 | 9419 | | BNZ | STA1 |
| 003B | 2A0FFF | | DCI | FUNZ |
| 003E | 16 | | LM | |
| 003F | 2533 | | CI | 51 |
| 0041 | 94E9 | | BNZ | LOOP |
| 0043 | 43 | | LR | A,DAT |
| 0044 | 252B | | CI | CROT |
| 0046 | 94E4 | | BNZ | LOOP |
| 0048 | 1A | | DI | |
| 0049 | 3C | | DS | S |
| 004A | 94EB | | BNZ | IZZ |
| 004C | 4E | | LR | A,D |
| 004D | 3D | | DS | I |
| 004E | 94E7 | | BNZ | IZZ |
| 0050 | 290000 | | JMP | CALEN |

TABLE 10-continued

| ADDRESS | CODE | ASSEMBLER | | |
|---|---|---|---|---|
| 0053 | 20BB | STA1 | LI | H'BB' |
| 0055 | B7 | | OUTS | 7 |
| 0056 | 2800D7 | STARTB | PI | INPUT |
| 0059 | 94FC | | BNZ | STARTB |
| 005B | 1A | | DI | |
| 005C | A7 | | INS | 7 |
| 005D | 91D8 | | BM | IZZ |
| 005F | 71 | | LIS | 1 |
| 0060 | 5A | | LR | MASK,A |
| 0061 | 203F | | LI | BMS+1 |
| 0063 | 0B | | LR | IS,A |
| 0064 | 70 | | CLR | |
| 0065 | 5E | | LR | D,A |
| 0066 | 5C | | LR | S,A |
| 0067 | 59 | | LR | TEM,A |
| 0068 | 20A0 | RD1 | LI | H'A0' |
| 006A | B7 | | OUTS | 7 |
| 006B | 2800D7 | REA | PI | INPUT |
| 006E | 4B | | LR | A,CON |
| 006F | E9 | | XS | TEM |
| 0070 | 84FA | | BZ | REA |
| 0072 | 4B | | LR | A,CON |
| 0073 | 59 | | LR | TEM,A |
| 0074 | 70 | D2 | CLR | |
| 0075 | CB | | AS | CON |
| 0076 | 8404 | | BZ | ZERO |
| 0078 | 4A | | LR | A,MASK |
| 0079 | CC | | AS | S |
| 007A | 5C | | LR | S,A |
| 007B | 4A | ZERO | LR | A,MASK |
| 007C | 13 | | SL | 1 |
| 007D | 5A | | LR | MASK,A |
| 007E | 840C | | BZ | T1 |
| 0080 | 2510 | | CI | B'10000' |
| 0082 | 940B | | BNZ | TEMPO |
| 0084 | 0A | | LR | A,IS |
| 0085 | 253F | | CI | BMS+1 |
| 0087 | 840E | | BZ | END |
| 0089 | 9004 | | BR | TEMPO |
| 008B | 71 | T1 | LIS | 1 |
| 008C | 5A | | LR | MASK,A |
| 008D | 4D | | LR | A,I |
| 008E | A7 | TEMPO | INS | 7 |
| 008F | 91D8 | | BM | RD1 |
| 0091 | 20FF | | LI | H'FF' |
| 0093 | B7 | | OUTS | 7 |
| 0094 | 90DF | | BR | D2 |
| 0096 | 203E | END | LI | BMS |
| 0098 | 0B | | LR | IS,A |
| 0099 | 70 | | CLR | |
| 009A | 59 | | LR | TEM,A |
| 009B | 71 | | LIS | 1 |
| 009C | 5A | | LR | MASK,A |
| 009D | 2510 | BIT1 | CI | B'10000' |
| 009F | 9405 | | BNZ | BIT |
| 00A1 | 4D | | LR | A,I |
| 00A2 | 4C | | LR | A,S |
| 00A3 | 15 | | SL | 4 |
| 00A4 | 5C | | LR | S,A |
| 00A5 | 4C | BIT | LR | A,S |
| 00A6 | 12 | | SR | 1 |
| 00A7 | 5C | | LR | S,A |
| 00A8 | FA | | NS | MASK |
| 00A9 | C9 | | AS | TEM |
| 00AA | 59 | | LR | TEM,A |
| 00AB | 4A | | LR | A,MASK |
| 00AC | 13 | | SL | 1 |
| 00AD | 5A | | LR | MASK,A |
| 00AE | 81EE | | BP | BIT 1 |
| 00B0 | 49 | | LR | A,TEM |
| 00B1 | 253E | | CI | H'3E' |
| 00B3 | 8405 | | BZ | TEST |
| 00B5 | 53 | | LR | DAT,A |
| C0B6 | 290030 | | JMP | INIZ |
| 00B9 | 43 | TEST | LR | A,DAT |
| 00BA | 2531 | | CI | 49 |
| 00BC | 8105 | | BP | TE |
| 00BE | 2A0FFF | | DCI | FUNZ |
| 00C1 | 17 | | ST | |
| 00C2 | 2A0FFF | TE | DCI | FUNZ |

TABLE 10-continued

| ADDRESS | CODE | ASSEMBLER | | |
|---|---|---|---|---|
| 00C5 | 16 | | LM | |
| 00C6 | 2533 | | CI | 51 |
| 00C8 | 8406 | | BZ | C |
| 00CA | 9207 | | BNC | D |
| 00CC | 290000 | | JMP | TACC |
| 00CF | 290000 | C | JMP | CALE |
| 00D2 | 43 | D | LR | A,TAS |
| 00D3 | 52 | | LR | RIF,A |
| 00D4 | 290000 | | JMP | STAR |
| 00D7 | 70 | INPUT | CLR | |
| 00D8 | B0 | | OUTS | IN |
| 00D9 | A0 | | INS | IN |
| 00DA | 18 | | COM | |
| 00DB | 2101 | | NI | TC |
| 00DD | 5B | | LR | CON,A |
| CODE | 1C | | POP | |
| | | | END | |

TABLE 11

| ADDRESS | CODE | ASSEMBLER | | |
|---|---|---|---|---|
| 005C | 43 | TACC | LR | A,DAT |
| 005D | 2532 | | CI | TAC |
| 005F | 844A | | BZ | TC2 |
| 0061 | 2530 | | CI | RAND |
| 0063 | 846C | | BZ | RDM |
| 0065 | 70 | | CLR | |
| 0066 | C8 | | AS | FLA |
| 0067 | 8405 | | BZ | TA |
| 0069 | 2530 | | CI | H'30' |
| 006B | 943E | | BNZ | TC2 |
| 006D | 45 | TA | LR | A,ADD |
| 006E | 15 | | SL | 4 |
| 006F | 13 | | SL | 1 |
| 0070 | C2 | | AS | CRT |
| 0071 | 18 | | COM | |
| 0072 | 07 | | LR | QL,A |
| 0073 | 43 | | LR | A,DAT |
| 0074 | 2520 | | CI | 32 |
| 0076 | 8150 | | BP | W44 |
| 0078 | 252E | | CI | RETURN |
| 007A | 841B | | BZ | RET |
| 007C | 252F | | CI | SHIFT |
| 007E | 842D | | BZ | SHI |
| 0080 | 252A | | CI | PFOR |
| 0082 | 8442 | | BZ | W41 |
| 0084 | 2529 | | CI | PBAK |
| 0086 | 842B | | BZ | PB |
| 0088 | 252B | | CI | PDOW |
| 008A | 843E | | BZ | PD |
| 008C | 252D | | CI | CLEAR |
| 008E | 8407 | | BZ | RET |
| 0090 | 40 | | LR | A,COL |
| 0091 | 2440 | | AI | H'40' |
| 0093 | 50 | | LR | COL,A |
| 0094 | 901B | | BR | W50 |
| 0096 | 2020 | RET | LI | C' ' |
| 0098 | 59 | | LR | TEM,A |
| 0099 | 2801C7 | | PI | STO |
| 009C | 32 | | DS | CRT |
| 009D | 81F8 | | BP | RET |
| 009F | 43 | | LR | A,DAT |
| 00A0 | 252D | | CI | CLEAR |
| 00A2 | 9426 | | BNZ | PD |
| 00A4 | 35 | | DS | ADD |
| 00A5 | 201F | | LI | 31 |
| 0047 | 52 | | LR | CRT,A |
| 00A8 | 81ED | | BP | RET |
| 00AA | 9051 | TC2 | BR | TC1 |
| 00AC | 48 | SHI | LR | A,FLA |
| 00AD | 2330 | | XI | F2 |
| 00AF | 58 | | LR | FLA,A |
| 00B0 | 9065 | W50 | BR | W11 |
| 00B2 | 42 | PB | LR | A,CRT |
| 00B3 | 2402 | | AI | 2 |
| 00B5 | 251F | | CI | 31 |
| 00B7 | 810C | | BP | PB1 |
| 00B9 | 70 | | LIS | O |
| 00BA | 52 | | LR | CRT,A |
| 00BB | 28017C | | PI | OUTL |
| 00BE | 45 | | LR | A,ADD |
| 00BF | 1F | | INC | |
| 00C0 | 2107 | | NI | 7 |
| 00C2 | 55 | | LR | ADD,A |
| 00C3 | 72 | | LIS | 2 |
| 00C4 | 52 | PB1 | LR | CRT,A |
| 00C5 | 905D | W41 | BR | W4 |
| 00C7 | 9050 | W44 | BR | WRT |
| 00C9 | 70 | PD | LIS | O |
| 00CA | 52 | | LR | CRT,A |
| 00CB | 28017C | | PI | OUTL |
| 00CE | 905A | | BR | W3 |
| 00D0 | 38 | RDM | DS | FLA |
| 00D1 | 77 | | LIS | 7 |
| 00D2 | 55 | | LR | ADD,A |
| 00D3 | 70 | | CLR | |
| 00D4 | 52 | | LR | CRT,A |
| 00D5 | 2A057F | | DCI | MESS |
| 00D8 | 48 | RM1 | LR | A,FLA |
| 00D9 | 2101 | | NI | 1 |
| 00DB | 9415 | | BNZ | RM5 |
| 00DD | 201E | | LI | 30 |
| 00DF | 59 | | LR | TEM,A |
| 00E0 | 2020 | | LI | C' ' |
| 00E2 | 2A0FDF | | DCI | DATA |
| 00E5 | 17 | | ST | |
| 00E6 | 17 | | ST | |
| 00E7 | 42 | RM3 | LR | A,CRT |
| 00E8 | 17 | | ST | |
| 00E9 | 1F | | INC | |
| 00EA | 52 | | LR | CRT,A |
| 00EB | 39 | | DS | TEM |
| 00EC | 94FA | | BNZ | RM3 |
| 00EE | 2A0FDF | | DCI | DATA |
| 00F1 | 2020 | RM5 | LI | 32 |
| 00F3 | 59 | | LR | TEM,A |
| 00F4 | 2801B0 | | PI | 022 |
| 00F7 | 35 | | DS | ADD |
| 00F8 | 81DF | | BP | RM1 |
| 00FA | 9037 | | BR | W2 |
| 00FC | 70 | TC1 | CLR | |
| 00FD | 58 | | LR | FLA,A |
| 00FE | 52 | | LR | CRT,A |
| 00FF | 07 | | LR | QL,A |
| 0100 | 2020 | | LI | C' ' |
| 0102 | 59 | | LR | TEM,A |
| 0103 | 2801C7 | | PI | STO |
| 0106 | 76 | | LIS | 6 |
| 0107 | 55 | | LR | ADD,A |
| 0108 | 28017C | OL | PI | OUTL |
| 010B | 35 | | DS | ADD |
| 010C | 81FB | | BP | OL |
| 010E | 20C0 | | LI | BIANCO |
| 0110 | 50 | | LR | COL,A |
| 0111 | 201E | | LI | 30 |
| 0113 | 52 | | LR | CRT,A |
| 0114 | 77 | PL | LIS | 7 |
| 0115 | 55 | | LR | ADD,A |
| 0116 | 9018 | W11 | BR | W1 |
| 0118 | 43 | | LR | A,DAT |
| 0119 | 2520 | | CI | C' ' |
| 011B | 8403 | | BZ | W5 |
| 011D | C0 | | AS | COL |
| 011E | E8 | | XS | FLA |
| 011F | 59 | W5 | LR | TEM,A |
| 0120 | 2801C7 | | PI | STO |
| 0123 | 32 | W4 | DS | CRT |
| 0124 | 940A | | BNZ | W1 |
| 0126 | 28017C | | PI | OUTL |
| 0129 | 201E | W3 | LI | 30 |
| 012B | 52 | | LR | CRT,A |
| 012C | 35 | | DS | ADD |
| 012D | 91E6 | | BM | PL |
| 012F | 28017C | W1 | PI | OUTL |
| 0132 | 290000 | W2 | IMP | LOOP |
| 017C | 2A0FDF | OUTL | DCI | DATA |
| 017F | 2020 | | LI | 32 |
| 0181 | 59 | | LR | TEM,A |
| 0182 | 45 | | LR | A,ADD |

TABLE 11-continued

| ADDRESS | CODE | ASSEMBLER | | |
|---|---|---|---|---|
| 0183 | 18 | | COM | |
| 0184 | 15 | | SL | 4 |
| 0185 | 13 | | SL | 1 |
| 0186 | 1F | | INC | |
| 0187 | 07 | | LR | QL,A |
| 0188 | 2027 | | LI | CSE+7 |
| 018A | B1 | | OUTS | S2P |
| 018B | 2020 | BLK | LI | C' ' |
| 018D | 901B | | BR | 02 |
| 018F | 49 | 03 | LR | A,TEM |
| 0190 | 251F | | CI | 31 |
| 0192 | 84F8 | | BZ | BLK |
| 0194 | 03 | | LR | A,QL |
| 0195 | B5 | | OUTS | TIP |
| 0196 | 1F | | INC | |
| 0197 | 07 | | LR | QL,A |
| 0198 | 70 | | CLR | |
| 0199 | B4 | | OUTS | DOP |
| 019A | A4 | | INS | DOP |
| 019B | 64 | | LISU | 4 |
| 019C | 6F | | LISL | 7 |
| 019D | 5C | | LR | S,A |
| 019E | 49 | | LR | A,TEM |
| 019F | E2 | | XS | CRT |
| 01A0 | 4C | | LR | A,S |
| 01A1 | 9407 | | BNZ | 02 |
| 01A3 | 48 | | LR | A,FLA |
| 01A4 | 14 | | SR | 4 |
| 01A5 | 12 | | SR | 1 |
| 01A6 | C0 | | AS | COL |
| 01A7 | 241E | | AI | PUNT-1 |
| 01A9 | 17 | 02 | ST | |
| 01AA | 39 | | DS | TEM |
| 01AB | 94E3 | | BNZ | 03 |
| 01AD | 2A0FDF | | DCI | DATA |
| 01B0 | 08 | 022 | LR | K,P |
| 01B1 | 77 | | LIS | 7 |
| 01B2 | B1 | | OUTS | S2P |
| 01B3 | A0 | | INS | 0 |
| 01B4 | 2110 | | NI | RS |
| 01B6 | 94FC | | BNZ | *−3 |
| 01B8 | 2020 | | LI | 32 |
| 01BA | 59 | | LR | TEM,A |
| 01BB | 45 | | LR | A,ADD |
| 01BC | 2210 | | OI | DT |
| 01BE | B1 | | OUTS | S2P |
| 01BF | 280170 | 033 | PI | DCL |
| 01C2 | 94FC | | BNZ | 033 |
| 01C4 | 77 | | LIS | 7 |
| 01C5 | B1 | | OUTS | S2P |
| 01C6 | 0C | | PK | |
| 01C7 | A1 | STO | INS | S2P |
| 01C8 | 2220 | | OI | CSE |
| 01CA | B1 | | OUTS | S2P |
| 01CB | 03 | | LR | A,QL |
| 01CC | B5 | | OUTS | TIP |
| 01CD | 1F | | INC | |
| 01CE | 07 | | LR | QL,A |
| 01CF | 49 | | LR | A,TEM |
| 01D0 | B4 | | OUTS | DOP |
| 01D1 | A1 | | INS | S2P |
| 01D2 | 2308 | | XI | DC |
| 01D4 | B1 | | OUTS | S2P |
| 01D5 | 2328 | | XI | DC+CSE |
| 01D7 | B1 | | OUTS | S2P |
| 01D8 | 1C | | POP | |
| | | | END | |

TABLE 12

| ADDRESS | CODE | ASSEMBLER | | |
|---|---|---|---|---|
| | | CALE | RORG | 0 |
| | | | ENTRY | TACC,OUTL |
| | | | EXTRN | LOOP,CALEN |
| 0000 | 66 | | LISU | DATE |
| 0001 | 43 | | LR | A,DAT |
| 0002 | 2533 | | CI | CAL |
| 0004 | 9422 | | BNZ | CX |
| 0006 | 6D | | LISL | ANN−2 |
| 0007 | 2080 | | LI | F1 |
| 0009 | 58 | | LR | FLA,A |
| 000A | 2A0FDF | | DCI | DATA |
| 000B | 77 | | LIS | 7 |
| 000E | 59 | | LR | TEM,A |
| 000F | 203F | | LI | C'?' |
| 0011 | 2240 | | OI | GIALLO |
| 0013 | 17 | ST1 | ST | |
| 0014 | 39 | | DS | TEM |
| 0015 | 94FD | | BNZ | ST1 |
| 0017 | 2A0FE1 | | DCI | DATA+2 |
| 001A | 202F | | LI | C'1' |
| 001C | 2240 | | OI | GIALLO |
| 001E | 17 | | ST | |
| 001F | 70 | | CLR | |
| 0020 | 52 | | LR | CRT,A |
| 0021 | 2A0FDF | | DCI | DATA |
| 0024 | 0E | | LR | Q,DC |
| 0025 | 9022 | | BR | DC2 |
| 0027 | 40 | CX | LR | A,COL |
| 0028 | 0B | | LR | IS,A |
| 0029 | 0F | | LR | DC,Q |
| 002A | 42 | | LR | A,CRT |
| 002B | 2502 | | CI | 2 |
| 002D | 9402 | | BNZ | CX1 |
| 002F | 1F | | INC | |
| 0030 | 8E | CX1 | ADC | |
| 0031 | 1F | | INC | |
| 0032 | 52 | | LR | CRT,A |
| 0033 | 43 | | LR | A,DAT |
| 0034 | 2230 | | OI | H'30' |
| 0036 | 2240 | | OI | GIALLO |
| 0038 | 17 | | ST | |
| 0039 | C8 | | AS | FLA |
| 003A | 9109 | | BM | DEC |
| 003C | 210F | | NI | H'F' |
| 003E | CC | | AS | S |
| 003F | 5D | | LR | I,A |
| 0040 | 2080 | | LI | F1 |
| 0042 | 9004 | | BR | DC1 |
| 0044 | 15 | DEC | SL | 4 |
| 0045 | 5C | | LR | S,A |
| 0046 | 70 | | CLR | |
| 0047 | 58 | DC1 | LR | FLA,A |
| 0048 | 2A0136 | DC2 | DCI | CLD |
| 004B | 28014A | | PI | OUTL1 |
| 004E | 0A | | LR | A,IS |
| 004F | 50 | | LR | COL,A |
| 0050 | 24F8 | | AI | −(ANN+1) |
| 0052 | 2107 | | NI | 7 |
| 0054 | 9404 | | BNZ | IN |
| 0056 | 290000 | | JMP | CALEN |
| 0059 | 290000 | IN | JMP | LOOP |

TABLE 13

| ADDRESS | CODE | ASSEMBLER | | |
|---|---|---|---|---|
| | | CALEN | RORG | 0 |
| | | | ENTRY | FINE |
| | | | EXTERN | LOOP, |
| | | OUTL | | |
| 0000 | 9017 | | BR | START |
| 0002 | 71 | ERR1 | LIS | 1 |
| 0003 | 9010 | | BR | ERROR |

TABLE 13-continued

| ADDRESS | CODE | ASSEMBLER | | |
|---|---|---|---|---|
| 0005 | 2012 | ERR2 | LI | H'12' |
| 0007 | 900C | | BR | ERROR |
| 0009 | 2024 | ERR3 | LI | H'24' |
| 000B | 5D | | LR | I,A |
| 000C | 2099 | | LI | H'99' |
| 000E | 9005 | | BR | ERROR |
| 0010 | 2016 | ERR4 | LI | H'16' |
| 0012 | 5D | | LR | I,A |
| 0013 | 70 | | CLR | |
| 0014 | 5C | ERROR | LR | S,A |
| 0015 | 280248 | | PI | BEEP |
| 0018 | 66 | START | LISU | DATE |
| 0019 | 6D | | LISL | ANN−2 |
| 001A | 4C | | LR | A,S |
| 001B | 2500 | | CI | O |
| 001D | 82E4 | | BC | ERR1 |
| 001F | 2512 | | CI | H'12' |
| 0021 | 92E3 | | BNC | ERR2 |
| 0023 | 4D | | LR | A,I |
| 0024 | 4C | | LR | A,S |
| 0025 | 2524 | | CI | H'24' |
| 0027 | 92E1 | | BNC | ERR3 |
| 0029 | 2515 | | CI | H'15' |
| 002B | 82E4 | | BC | ERR4 |
| 002D | 6C | | LISL | ANN−3 |
| 002E | 4D | BIN | LR | A,I |
| 002F | 4C | | LR | A,S |
| 0030 | 210F | | NI | H'E' |
| 0032 | 58 | | LR | TE2,A |
| 0033 | 4E | | LR | A,D |
| 0034 | 14 | | SR | 4 |
| 0035 | 13 | | SL | 1 |
| 0036 | 59 | | LR | TE1,A |
| 0037 | 13 | | SL | 1 |
| 0038 | 13 | | SL | 1 |
| 0039 | C9 | | AS | TE1 |
| 003A | C8 | | AS | TE2 |
| 003B | 58 | | LR | TE2,A |
| 003C | 4E | | LR | A,D |
| 003D | 4E | | LR | A,D |
| 003E | 48 | | LR | A,TE2 |
| 003F | 5D | | LR | I,A |
| 0040 | 4D | | LR | A,I |
| 0041 | 4D | | LR | A,I |
| 0042 | 8FEB | | BR7 | BIN |
| 0044 | 2A02E3 | | DCI | EMME−16 |
| 0047 | 6A | | LISL | ANN−5 |
| 0048 | 4D | | LR | A,I |
| 0049 | 5A | | LR | MES,A |
| 004A | 4C | | LR | A,S |
| 00AB | 8E | | ADC | |
| 004C | 13 | | SL | 1 |
| 004D | 13 | | SL | 1 |
| 004E | CD | | AS | I |
| 004F | CC | | AS | S |
| 0050 | 24ED | FO | AI | −19 |
| 0052 | 82FD | | BC | FO |
| 0054 | 2413 | | AI | 19 |
| 0056 | 67 | | LISU | MODU |
| 0057 | 6A | | LISL | C |
| 0058 | 5C | | LR | S,A |
| 0059 | 2013 | | LI | 19 |
| 005B | 59 | | LR | TE1,A |
| 005C | 16 | | LM | |
| 005D | CC | AS | AS | S |
| 005E | 215D | | CI | 29 |
| 0060 | 8203 | | BC | F1 |
| 0062 | 24E2 | | AI | −30 |
| 0064 | 39 | F1 | DS | TE1 |
| 0065 | 94F7 | | BNZ | AS |
| 0067 | 69 | | LISL | D |
| 0068 | 5C | | LR | S,A |
| 0069 | 13 | | SL | 1 |
| 006A | CC | | AS | S |
| 006B | 58 | | LR | TE2,A |
| 006C | 66 | | LISU | DATE |
| 006D | 6C | | LISL | ANN−3 |
| 006E | 4C | | LR | A,S |
| 006F | 2103 | | NI | 3 |
| 0071 | C8 | | AS | TE2 |

TABLE 13-continued

| ADDRESS | CODE | ASSEMBLER | | |
|---------|------|-----------|------|------|
| 0072 | 58 | | LR | TE2,A |
| 0073 | 4E | | LR | A,D |
| 0074 | CC | | AS | S |
| 0075 | CC | | AS | S |
| 0076 | 24F9 | F2 | AI | −7 |
| 0078 | 82FD | | BC | F2 |
| 007A | 240A | | AI | 10 |
| 007C | 13 | | SL | 1 |
| 007D | C8 | | AS | TE2 |
| 007E | 13 | | SL | 1 |
| 007F | 58 | | LR | TE2,A |
| 0080 | 4C | | LR | A,S |
| 0081 | 12 | | SR | 1 |
| 0082 | 12 | | SR | 1 |
| 0083 | 18 | | COM | |
| 0084 | CC | | AS | S |
| 0085 | C8 | | AS | TE2 |
| 0086 | 24F9 | F3 | AI | −7 |
| 0088 | 82FD | | BC | F3 |
| 008A | 2407 | | AI | 7 |
| 008C | 67 | | LISU | MODU |
| 008D | 68 | | LISL | E |
| 008E | 5C | | LR | S,A |
| 008F | 2416 | | AI | 22 |
| 0091 | 69 | | LISL | D |
| 0092 | CC | | AS | S |
| 0093 | 58 | | LR | TE2,A |
| 0094 | 59 | | LR | TE1,A |
| 0095 | 251E | | CI | 30 |
| 0097 | 811D | | BP | MARZ |
| 0099 | 24E1 | | AI | −31 |
| 009B | 59 | | LR | TE1,A |
| 009C | 2519 | | CI | 25 |
| 009E | 910F | | BM | AP2 |
| 00A0 | 9411 | | BNZ | APRIL |
| 00A2 | 68 | | LISL | E |
| 00A3 | 4C | | LR | A,S |
| 00A4 | 2506 | | CI | 6 |
| 00A6 | 940B | | BNZ | APRIL |
| 00A8 | 6A | | LISL | C |
| 00A9 | 4C | | LR | A,S |
| 00AA | 250A | | CI | 10 |
| 00AC | 8105 | | BP | APRIL |
| 00AE | 49 | AP2 | LR | A,TE1 |
| 00AF | 24F9 | | AI | −7 |
| 00B1 | 59 | | LR | TE1,A |
| 00B2 | 74 | APRIL | LIS | 4 |
| 00B3 | 9002 | | BR | MA1 |
| 00B5 | 73 | MARZ | LIS | 3 |
| 00B6 | EA | MA1 | XS | MES |
| 00B7 | 70 | | CLR | |
| 00B8 | 5B | | LR | GIO,A |
| 00B9 | 9408 | | BNZ | PMES |
| 00BB | 2067 | BCD | LI | H'67' |
| 00BD | DB | | ASD | GIO |
| 00BE | 5B | | LR | GIO,A |
| 00BF | 39 | | DS | TE1 |
| 00C0 | 81FA | | BP | BCD |
| 00C2 | 2A02FB | PMES | DCI | ESSE−1 |
| 00C5 | 4A | | LR | A,MES |
| 00C6 | 8E | | ADC | |
| 00C7 | 48 | | LR | A,TE2 |
| 00C8 | 18 | | COM | |
| 00C9 | 243C | | AI | 60 |
| 00CB | 88 | | AM | |
| 00CC | 58 | | LR | TE2,A |
| 00CD | 70 | | CLR | |
| 00CE | 59 | | LR | TE1,A |
| 00CF | 66 | | LISU | DATE |
| 00D0 | 6C | | LISL | ANN−3 |
| 00D1 | 4C | | LR | A,S |
| 00D2 | 2103 | | NI | 3 |
| 00D4 | 9412 | | BNZ | NORM |
| 00D6 | CE | | AS | D |
| 00D7 | 9406 | | BNZ | BIS |
| 00D9 | 4C | | LR | A,S |
| 00DA | 2103 | | NI | 3 |
| 00DC | 940A | | BNZ | NORM |
| 00DE | 4E | BIS | LR | A,D |
| 00DF | 4C | | LR | A,S |

TABLE 13-continued

| ADDRESS | CODE | ASSEMBLER | | |
|---|---|---|---|---|
| 00E0 | 2502 | | CI | 2 |
| 00E2 | 9104 | | BM | NORM |
| 00E4 | 38 | | DS | TE2 |
| 00E5 | 71 | | LIS | 1 |
| 00E6 | 59 | | LR | TE1,A |
| 00E7 | 6C | NORM | LISL | A |
| 00E8 | 67 | | LISU | MODU |
| 00E9 | 48 | | LR | A,TE2 |
| 00EA | 24F9 | NI | AI | −7 |
| 00EC | 81FD | | BP | N1 |
| 00EE | 2407 | | AI | 7 |
| 00F0 | 13 | | SL | 1 |
| 00F1 | 13 | | SL | 1 |
| 00F2 | 5C | | LR | S,A |
| 00F3 | 70 | | CLR | |
| 00F4 | 55 | | LR | ADD,A |
| 00F5 | 65 | | LISU | 5 |
| 00F6 | 6F | | LISL | 7 |
| 00F7 | 5E | | LR | D,A |
| 00F8 | 8FFE | | BR7 | *−1 |
| 00FA | 280000 | | PI | OUTL |
| 00FD | 2A0FE1 | | DCI | DATA+2 |
| 0100 | 0E | LLMM | LR | Q,DC |
| 0101 | 03 | | LR | A,QL |
| 0102 | 2400 | | AI | O |
| 0104 | 812F | | BP | DSC |
| 0106 | 16 | | LM | |
| 0107 | 213F | | NI | H'3F' |
| 0109 | 252F | | CI | C'1' |
| 010B | 94F4 | | BNZ | LLMM |
| 010D | 16 | | LM | |
| 010E | 210F | | NI | H'E' |
| 0110 | 13 | | SL | 1 |
| 0111 | 5C | | LR | S,A |
| 0112 | 13 | | SL | 1 |
| 0113 | 13 | | SL | 1 |
| 0114 | CC | | AS | S |
| 0115 | 5C | | LR | S,A |
| 0116 | 16 | | LM | |
| 0117 | 210F | | NI | H'F' |
| 0119 | CC | | AS | S |
| 011A | 18 | | COM | |
| 011B | 1F | | INC | |
| 011C | CA | | AS | MES |
| 011D | 94E2 | | BNZ | LLMM |
| 011F | 20FB | | LI | −5 |
| 0121 | 8E | | ADC | |
| 0122 | 16 | | LM | |
| 0123 | 210F | | NI | H'F' |
| 0125 | 13 | | SL | 1 |
| 0126 | 5C | | LR | S,A |
| 0127 | 13 | | SL | 1 |
| 0128 | 13 | | SL | 1 |
| 0129 | CC | | AS | S |
| 012A | 5C | | LR | S,A |
| 012B | 16 | | LM | |
| 012C | 210F | | NI | H'F' |
| 012E | CC | | AS | S |
| 012F | 5D | | LR | I,A |
| 0130 | 73 | | LIS | 3 |
| 0131 | 8E | | ADC | |
| 0132 | 90CD | | BR | LLMM |
| 0273 | D3 | MESI | DC | H'D3' |
| 0274 | 47454E | | DC | C'GENN' |
| 0278 | 0680 | | DC | H'0680' |
| 027A | 454542 | C'DC | C'FEBBRAIO' | |
| 0282 | 83 | | DC | H'83' |
| 0283 | 4D4152 | | DC | C'MARZO' |
| 0288 | 82 | | DC | H'82' |
| 0289 | 415052 | | DC | C'APRILE' |
| 028F | D3 | | DC | H'D3' |
| 0290 | 4D4147 | | DC | C'MAGGIO' |
| 0296 | 82 | | DC | H'82' |
| 0297 | 474955 | | DC | C'GIUGNO' |
| 029D | 83 | | DC | H'83' |
| 029E | 4C5547 | | DC | C'LUGLIO' |
| 02A4 | B3 | | DC | H'B3' |
| 02A5 | 41474F | | DC | C'AGOSTO' |
| 02AB | 82 | | DC | H'82' |

TABLE 13-continued

| ADDRESS | CODE | ASSEMBLER | | |
|---|---|---|---|---|
| 02AC | 534554 | | DC | C'SETT' |
| 02B0 | 0F83 | | DC | H'0F83' |
| 02B2 | 4F5454 | | DC | C'8' |
| 02B6 | 0BD2 | | DC | H'0B02' |
| 02B8 | 4E4F56 | | DC | C'NOV' |
| 02BB | 04C3 | | DC | H'O4C3' |
| 02BD | 444943 | | DC | C'DICEMBRE' |
| 02C5 | 80 | | DC | H'80' |
| 02C6 | 4C554D | GIORNI | DC | C'LUMAMEGIVESADO' |
| 02D4 | 71F2F3 | | DC | H'71F2E3F4F5F6F778' |
| 02DC | F99091 | | DC | H'F990919293941596' |
| 02E4 | 979899 | | DC | H'979898AOA1A2A3A4' |
| 02EC | 2526A7 | | DC | H'2526A7A9B0B1' |
| 02F3 | 16 | EMME | DC | 22 |
| 02F4 | 17 | | DC | 23 |
| 02F5 | 17 | | DC | 23 |
| 02F6 | 18 | | DC | 24 |
| 02F7 | 18 | | DC | 24 |
| 02F8 | 18 | | DC | 24 |
| 02F9 | 19 | | DC | 25 |
| 02FA | 1A | | DC | 26 |
| 02FB | 19 | | DC | 25 |
| 02FC | 01 | ESSE | DC | 1 |
| 02FD | 04 | | DC | 4 |
| 02FE | 04 | | DC | 4 |
| 02FF | 00 | | DC | 0 |
| 0300 | 02 | | DC | 2 |
| 0301 | 05 | | DC | 5 |
| 0302 | 00 | | DC | 0 |
| 0303 | 03 | | DC | 3 |
| 0304 | 06 | | DC | 6 |
| 0305 | 01 | | DC | 1 |
| 0306 | 04 | | DC | 4 |
| 0307 | 06 | FINE | DC | 6 |
| | | | ORG | MESI |
| | | | END | |

TABLE 14

| ADDRESS | CODE | ASSEMBLER | | |
|---|---|---|---|---|
| 0134 | 2040 | DSC | LI | GIALLO |
| 0136 | 50 | | LR | COL,A |
| 0137 | 77 | | LIS | 7 |
| 0138 | 55 | | LR | ADD,A |
| 0139 | B1 | | OUTS | ADP |
| 013A | 2A0273 | | DCI | MESI |
| 013D | 45 | RIGA | LR | A,ADD |
| 013E | 2210 | | OI | DT |
| 0140 | B1 | | OUTS | ADP |
| 0141 | 201F | | LI | 31 |
| 0143 | 52 | | LR | CRT,A |
| 0144 | 49 | | LR | A,TE1 |
| 0145 | 2502 | | CI | 2 |
| 0147 | 8470 | | BZ | BB4 |
| 0149 | 280264 | AAA | PI | BLK |
| 014C | 42 | | LR | A,CRT |
| 014D | 251B | | CI | 27 |
| 014F | 91F9 | | BM | AAA |
| 0151 | 45 | | LR | A,ADD |
| 0152 | 2507 | | CI | 7 |
| 0154 | 8425 | | BZ | PRI |
| 0156 | 2505 | | CI | 5 |
| 0158 | 9406 | | BNZ | BBB |
| 015A | 6C | | LISL | A |
| 015B | 67 | | LISU | MODU |
| 015C | 3C | | DS | S |
| 015D | 81EB | | BP | AAA |
| 015F | 16 | BBB | LM | |
| 0160 | 56 | | LR | DAT,A |
| 0161 | 45 | | LR | A,ADD |
| 0162 | 2506 | | CI | 6 |
| 0164 | 42 | | LR | A,CRT |
| 0165 | 9454 | | BNZ | MMM |
| 0167 | 2504 | | CI | 4 |
| 0169 | 2080 | | LI | MAGEN |
| 016B | 9103 | | BM | *+4 |
| 016D | 2000 | | LI | ROSSO |
| 016F | 50 | | LR | COL,A |

TABLE 14-continued

| ADDRESS | CODE | ASSEMBLER | | |
|---|---|---|---|---|
| 0170 | 28025E | | PI | OUT1 |
| 0173 | 16 | | LM | |
| 0174 | 56 | | LR | DAT,A |
| 0175 | 28025E | | PI | OUT1 |
| 0178 | 907D | | BR | LLL |
| 017A | 42 | PRI | LR | A,CRT |
| 017B | 2516 | | CI | 22 |
| 017D | 91CB | | BM | AAA |
| 017F | 70 | DUR | CLR | |
| 0180 | 88 | | AM | |
| 0181 | 81FD | | BP | DUR |
| 0183 | 3A | | DS | MES |
| 0184 | 94FA | | BNZ | DUR |
| 0186 | 5A | | LR | MES,A |
| 0187 | 210F | | NI | 15 |
| 0189 | 9402 | | BNZ | *+3 |
| 018B | C9 | | AS | TE1 |
| 018C | 59 | | LR | TE1,A |
| 018D | 208E | | LI | H'8E' |
| 018F | D9 | | ASD | TE1 |
| 0190 | 59 | | LR | TE1,A |
| 0191 | 16 | | LM | |
| 0192 | 251F | DDD | CI | 31 |
| 0194 | 8106 | | BP | DD1 |
| 0196 | 56 | | LR | DAT,A |
| 0197 | 28025E | | PI | OUT1 |
| 019A | 70 | | CLR | |
| 019B | 8E | DD1 | ADC | |
| 019C | 70 | | CLR | |
| 019D | 88 | | AM | |
| 019E | 81F3 | | BP | DDD |
| 01A0 | 280264 | EEE | PI | BLK |
| 01A3 | 42 | | LR | A,CRT |
| 01A4 | 250A | | CI | 10 |
| 01A6 | 91F9 | | BM | EEE |
| 01A8 | 6E | | LISL | ANN-1 |
| 01A9 | 66 | | LISU | DATE |
| 01AA | 4D | | LR | A,I |

TABLE 14-continued

| ADDRESS | CODE | | ASSEMBLER | |
|---|---|---|---|---|
| 01AB | 58 | | LR | TE2,A |
| 01AC | 280249 | | PI | ASCII |
| 01AF | 4E | | LR | A,D |
| 01B0 | 58 | | LR | TE2,A |
| 01B1 | 2A02C6 | | DCI | GIORNI |
| 01B4 | 9073 | | BR | NNN |
| 01B6 | 9086 | RI | BR | RIGA |
| 01B8 | 9072 | BB4 | BR | BB3 |
| 01BA | 2504 | MMM | CI | 4 |
| 01BC | 8132 | | BP | RED |
| 01BE | 46 | | LR | A,DAT |
| 01BF | 217F | | NI | H'7F' |
| 01C1 | 2570 | | CI | H'70' |
| 01C3 | 8203 | | BC | MM1 |
| 01C5 | 210F | | NI | H'F' |
| 01C7 | EB | MM1 | XS | GIO |
| 01C8 | 8426 | | BZ | RED |
| 01CA | 46 | | LR | A,DAT |
| 01CB | 211F | | NI | H'1F' |
| 01CD | 65 | | LISU | 5 |
| 01CE | 68 | | LISL | 0 |
| 01CF | EE | | XS | D |
| 01D0 | 8405 | | BZ | GIAL |
| 01D2 | 8FFC | | BR7 | *−3 |
| 01D4 | 9005 | | BR | BB5 |
| 01D6 | 2040 | GIAL | LI | GIALLO |
| 01D8 | 903D | | BR | BB2 |
| 01DA | 70 | BB5 | CLR | |
| 01DB | C6 | | AS | DAT |
| 01DC | 9137 | | BM | BIANCO |
| 01DE | 4A | | LR | A,MES |
| 01DF | 14 | | SR | 4 |
| 01E0 | 2107 | | NI | 7 |
| 01E2 | E5 | | XS | ADD |
| 01E3 | 841D | | BZ | MAG |
| 01E5 | 4A | | LR | A,MES |
| 01E6 | 25C3 | | CI | H'C3' |
| 01E8 | 942B | | BNZ | BIANCO |
| 01EA | 45 | | LR | A,ADD |
| 01EB | 2502 | | CI | 2 |
| 01ED | 9126 | | BM | BIANCO |
| 01EF | 2000 | RED | LI | ROSSO |
| 01F1 | 9024 | | BR | BB2 |
| 01F3 | 280249 | BB1 | PI | ASCII |
| 01F6 | 280264 | LLL | PI | BLK |
| 01F9 | 280264 | | PI | BLK |
| 01FC | 9133 | | BM | HHH |
| 01FE | 29015F | | JMP | BBB |
| 0201 | 6D | MAG | LISL | ANN-2 |
| 0202 | 66 | | LISU | DATE |
| 0203 | 4D | | LR | A,I |
| 0204 | 2505 | | CI | 5 |
| 0206 | 94E8 | | BNZ | RED |
| 0208 | 4D | | LR | A,I |
| 0209 | 2518 | | CI | H'18' |
| 020B | 92E3 | | BNC | RED |
| 020D | 9406 | | BNZ | BIANCO |
| 020F | 4E | | LR | A,D |
| 0210 | 2589 | | CI | H'89' |
| 0212 | 92DC | | BNC | RED |
| 0214 | 20C0 | BIANCO | LI | BIAN |
| 0216 | 50 | BB2 | LR | COL,A |
| 0217 | 46 | | LR | A,DAT |

TABLE 14-continued

| ADDRESS | CODE | | ASSEMBLER | |
|---|---|---|---|---|
| 0218 | 2280 | | OI | H'80' |
| 021A | 56 | | LR | DAT,A |
| 021B | 2140 | | NI | H'40' |
| 021D | 46 | | LR | A,DAT |
| 021E | 9403 | | BNZ | BLA |
| 0220 | 217F | | NI | H'7F' |
| 0222 | 58 | BLA | LR | TE2,A |
| 0223 | E9 | | XS | TE1 |
| 0224 | 94CE | | BNZ | BB1 |
| 0226 | 72 | | LIS | 2 |
| 0227 | 59 | | LR | TE1,A |
| 0228 | 280249 | NNN | PI | ASCII |
| 022B | 280264 | BB3 | PI | BLK |
| 022E | 81FC | | BP | BB3 |
| 0230 | 77 | HHH | LIS | 7 |
| 0231 | B1 | | OUTS | ADP |
| 0232 | 35 | | DS | ADD |
| 0233 | 8182 | | BP | R1 |
| 0235 | 6D | | LISL | ANN-2 |
| 0236 | 66 | | LISU | DATE |
| 0237 | 4C | | LR | A,S |
| 0238 | 2512 | | CI | H'12' |
| 023A | 9404 | | BNZ | ST3 |
| 023C | 71 | | LIS | 1 |
| 023D | 5D | | LR | I,A |
| 023E | 4D | | LR | A,I |
| 023F | 2067 | ST3 | LI | H'67' |
| 0241 | DC | | ASD | S |
| 0242 | 5E | | LR | D,A |
| 0243 | 84FB | | BZ | ST3 |
| 0245 | 290000 | | JMP | LOOP |
| 0248 | 1C | BEEP | POP | |
| 0249 | 08 | ASCII | LR | K,P |
| 024A | 48 | | LR | A,TE2 |
| 024B | 14 | | SR | 4 |
| 024C | 250F | | CI | 15 |
| 024E | 9402 | | BNZ | *+3 |
| 0250 | 15 | | SL | 4 |
| 0251 | 2430 | | AI | H'30' |
| 0253 | 56 | | LR | DAT,A |
| 0254 | 28025E | | PI | OUT1 |
| 0257 | 48 | | LR | A,TE2 |
| 0258 | 210F | | NI | 15 |
| 025A | 2430 | | AI | H'30' |
| 025C | 56 | | LR | DAT,A |
| 025D | 09 | | LR | P,K |
| 025E | 46 | OUT1 | LR | A,DAT |
| 025F | 213F | | NI | H'3F' |
| 0261 | C0 | | AS | COL |
| 0262 | 9005 | | BR | OUT+1 |
| 0264 | 2020 | BLK | LI | C' ' |
| 0266 | 56 | | LR | DAT,A |
| 0267 | 46 | OUT | LR | A,DAT |
| 0268 | 18 | | COM | |
| 0269 | B4 | | OUTS | DAP |
| 026A | 45 | | LR | A,ADD |
| 026B | 2218 | | OI | DC+DT |
| 026D | B1 | | OUTS | ADP |
| 026E | 2308 | | XI | DC |
| 0270 | B1 | | OUTS | ADP |
| 0271 | 32 | | DS | CRT |
| 0272 | 1C | | POP | |

TABLE 15

| ADDRESS | CODE | | ASSEMBLER | |
|---|---|---|---|---|
| | | STAR | RORG | 0 |
| | | | ENTRY | DISPLAY,IN1 |
| | | | ENTRY | MEM6,DIR,OUTPUT,IN2 |
| | | | EXTRN | SET,RICER,READ,EEE |
| | | | EXTRN | VLC,INTER,LOOP,ADF |
| | | | EXTRN | PAG,PRG,ETI,PET,PETI |
| 0000 | 2A0FCA | | DCI | BUF+10 |
| 0003 | 43 | | LR | A,TAS |
| 0004 | 2534 | | CI | NOR |
| 0006 | 9435 | | BNZ | CX |
| 0008 | 28044D | | PI | D11 |
| 000B | 78 | | LIS | 8 |
| 000C | 8E | | ADC | |

TABLE 15-continued

| ADDRESS | CODE | ASSEMBLER | | |
|---------|------|-----------|------|------|
| 000D | 7F | | LIS | 15 |
| 000E | 8D | | CM | |
| 000F | 9416 | | BNZ | D12 |
| 0011 | 65 | | LISU | 5 |
| 0012 | 6A | | LISL | 2 |
| 0013 | 4C | | LR | A,S |
| 0014 | 901E | | BR | D18 |
| 0016 | 2A0FCD | D14 | DCI | BUFC |
| 0019 | 8D | | CM | |
| 001A | 9414 | | BNZ | D16 |
| 001C | 70 | | CLR | |
| 001D | C1 | | AS | CAN |
| 001E | 8119 | | BP | D17 |
| 0020 | 210F | | NI | H'F' |
| 0022 | 57 | D15 | LR | NU,A |
| 0023 | 2900D0 | | JMP | INDIR |
| 0026 | 2A0FD8 | D12 | DCI | BUFT+5 |
| 0029 | 8D | | CM | |
| 002A | 94EB | | BNZ | D14 |
| 002C | 280455 | | PI | CET |
| 002F | 2A0FD4 | D16 | DCI | BUFT+1 |
| 0032 | 16 | | LM | |
| 0033 | 2509 | D18 | CI | 9 |
| 0035 | 82EC | | BC | D15 |
| 0037 | 41 | | LR | A,CAN |
| 0038 | 59 | D17 | LR | FOR,A |
| 0039 | 2900C3 | | JMP | DIR |
| 003C | 252F | CX | CI | 47 |
| 003E | 8433 | | BZ | SHIFT |
| 0040 | 252C | | CI | 44 |
| 0042 | 8429 | | BZ | P |
| 0044 | 2530 | | CI | 48 |
| 0046 | 844C | | BZ | MODO |
| 008 | 5B | | LR | TE1,A |
| 0049 | 48 | | LR | A,MOO |
| 004A | 2531 | | CI | 49 |
| 004C | 9404 | | BNZ | *+5 |
| 004E | 290000 | | JMP | PET |
| 0051 | 2530 | | CI | 48 |
| 0053 | 841B | | BZ | P+3 |
| 0055 | 4B | | LR | A,TE1 |
| 0056 | 2513 | | CI | 19 |
| 0058 | 843A | | BZ | MODO |
| 005A | 2A0FCB | | DCI | BUF+11 |
| 005D | 2509 | | CI | 9 |
| 005F | 8124 | | BP | SLV |
| 0061 | 2517 | | CI | 23 |
| 0063 | 812F | | BP | MODO |
| 0065 | 251D | | CI | 29 |
| 0067 | 912B | | BM | MODO |
| 0069 | 290000 | | JMP | RICER |
| 006C | 290000 | P | JMP | PAG |
| 006F | 290000 | | JMP | PRG |
| 0072 | 16 | SHIFT | LM | |
| 0073 | 25EE | | CI | H'EE' |
| 0075 | 2A0FCA | | DCI | BUF+10 |
| 0078 | 8405 | | BZ | SH |
| 007A | 20EE | | LI | H'EE' |
| 007C | 9003 | | BR | SH+2 |
| 007E | 20F0 | SH | LI | H'FO' |
| 0080 | 17 | | ST | |
| 0081 | 290334 | | JMP | DLY |
| 0084 | 5B | SLV | LR | TE1,A |
| 008 | 47 | | LR | A,NU |
| 0086 | 56 | | LR | ND,A |
| 0087 | 17 | | ST | |
| 0088 | 4B | | LR | A,TE1 |
| 0089 | 57 | | LR | NU,A |
| 008A | 17 | | ST | |
| 008B | 7F | | LIS | 15 |
| 008C | E6 | | XS | ND |
| 008D | 8413 | | BZ | MODI |
| 008F | 70 | | CLR | |
| 0090 | 58 | | LR | MOO,A |
| 0091 | 900F | | BR | MODI |
| 0093 | 250E | M0D0 | CI | 14 |
| 0095 | 9108 | | BM | MOD |
| 0097 | 250B | | CI | 11 |
| 0099 | 8104 | | BP | MOD |
| 009B | 29021B | | JMP | FINET |
| 009E | 58 | MOD | LR | MOO,A |

TABLE 15-continued

| ADDRESS | CODE | ASSEMBLER | | |
|---------|--------|------|------|--------|
| 009F | 7F | | LIS | 15 |
| 00A0 | 57 | | LR | NU,A |
| 00A1 | 48 | M0DI | LR | A,MOO |
| 00A2 | 2A0FCB | | DCI | BUF+11 |
| 00A5 | 2513 | | CI | 19 |
| 00A7 | 840E | | BZ | MMR |
| 00A9 | 8126 | | BP | INDIR |
| 00AB | 2530 | | CI | 48 |
| 00AD | 84C1 | | BZ P+3 | |
| 00AF | 2516 | | CI | 22 |
| 00B1 | 911E | | BM | INDIR |
| 00B3 | 290000 | | JMP | VLC |
| 00B6 | 290140 | MMR | JMP | MEMOR |
| 0255 | 2A0FD6 | PETI | DCI | BUFT+3 |
| 0258 | 2030 | | LI | H'30' |
| 025A | 17 | | ST | |
| 025B | 17 | | ST | |
| 025C | 17 | | ST | |
| 025D | 2801B9 | | PI | WRTE |
| 0260 | 2801F1 | | PI | SHI |
| 0263 | 2A0FD6 | | DCI | BUFT+3 |
| 0266 | 73 | | LIS | 3 |
| 0267 | 5C | | LR | S,A |
| 0268 | 2031 | | LI | 49 |
| 026A | 58 | | LR | MOO,A |
| 026B | 7F | | LIS | 15 |
| 026C | 90AB | | BR | P1-3 |
| 026E | 280281 | PET | PI | P10 |
| 0271 | 4C | | LR | A,S |
| 0272 | 2506 | | CI | 6 |
| 0274 | 94A6 | | BNZ | P1 |
| 0276 | 2801B9 | | PI | WRTE |
| 0279 | 70 | | CLR | |
| 027A | 57 | | LR | NU,A |
| 027B | 58 | | LR | MOO,A |
| 027C | 2A0FCA | | DCI | BUF+10 |
| 027F | 9096 | | BR | P9 |
| 0281 | 2A0FCA | P10 | DCI | BUF+10 |
| 0284 | 16 | | LM | |
| 0285 | 25F0 | | CI | H'F0' |
| 0287 | 70 | | LIS | 0 |
| 0288 | 9403 | | BNZ | *+4 |
| 028A | 2030 | | LI | H'30' |
| 028C | 50 | | LR | TE3,A |
| 028D | 2A0FD3 | | DCI | BUFT |
| 0290 | 65 | | LISU | 5 |
| 0291 | 6E | | LISL | 6 |
| 0292 | 4C | | LR | A,S |
| 0293 | 8E | | ADC | |
| 0294 | 1F | | INC | |
| 0295 | 5C | | LR | S,A |
| 0296 | 43 | | LR | A,TAS |
| 0297 | E0 | | XS | TE3 |
| 0298 | 2410 | | AI | H'10' |
| 029A | 17 | | ST | |
| 029B | 1C | | POP | |
| | | | END | |

TABLE 16

| ADDRESS | CODE | ASSEMBLER | | |
|---------|--------|------|------|--------|
| 0140 | 7F | MEMOR | LIS | 15 |
| 0141 | E7 | | XS | NU |
| 0142 | 8407 | | BZ | MEM7 |
| 0144 | 70 | | CLR | |
| 0145 | C5 | | AS | FDI |
| 0146 | 9489 | | BNZ | INDIR |
| 0148 | 906F | | BR | MEM4 |
| 014A | 55 | MEM7 | LR | FDI,A |
| 014B | 16 | | LM | |
| 014C | 25DD | | CI | H'DD' |
| 014E | 9418 | | BNZ | MEM3 |
| 0150 | 280455 | | PI | CET |
| 0153 | 2A0FCD | | DCI | BUFC |
| 0156 | 7F | | LIS | 15 |
| 0157 | 8D | | CM | |
| 0158 | 9407 | | BNZ | MEM5 |
| 015A | 280447 | | PI | BEEP |
| 015D | 290248 | | JMP | MEM2 |

TABLE 16-continued

| ADDRESS | CODE | ASSEMBLER | | |
|---------|--------|------|------|--------|
| 0160 | 2A0FCC | MEM5 | DCI | BUF+12 |
| 0163 | 17 | | ST | |
| 0164 | 29032F | | JMP | DISPLAY |
| 0167 | 20FF | MEM3 | LI | −1 |
| 0169 | 55 | | LR | FDI,A |
| 016A | 2A0FCB | | DCI | BUF+11 |
| 016D | 20DD | | LI | H'DD' |
| 016F | 17 | | ST | |
| 0170 | 20F0 | | LI | MSB |
| 0172 | 17 | | ST | |
| 0173 | 2020 | | LI | 32 |
| 0175 | 63 | | LISU | TREN |
| 0176 | 6C | | LISL | DUR |
| 0177 | 5C | | LR | S,A |
| 0178 | A1 | | INS | S2P |
| 0179 | 2240 | | OI | DIS |
| 017B | B1 | | OUTS | S2P |
| 017C | 79 | MEM6 | LIS | 9 |

TABLE 16-continued

| ADDRESS | CODE | ASSEMBLER | |
|---|---|---|---|
| 017D | 57 | LR | NU,A |
| 017E | 50 | LR | TE3,A |
| 017F | 280000 | RED PI | READ |
| 0182 | 280000 | PI | ETI |
| 0185 | 47 | LR | A,NU |
| 0186 | 241D | AI | 0'35' |
| 0188 | 0B | LR | IS,A |
| 0189 | 70 | CLR | |
| 018A | C6 | AS | ND |
| 018B | 9403 | BNZ | *+4 |
| 018D | 20FF | LI | H'FF' |
| 018F | 8102 | BP | DC |
| 0191 | 30 | DS | TE3 |
| 0192 | 5C | DC LR | S,A |
| 0193 | 37 | DS | NU |
| 0194 | 81EA | BP | RED |
| 0196 | 70 | CLR | |
| 0197 | 57 | LR | NU,A |
| 0198 | 280000 | PI | ADR |
| 019B | 2433 | AI | 51 |
| 019D | B5 | OUTS | TIP |
| 019E | A4 | INS | DOP |
| 019F | E0 | XS | TE3 |
| 01A0 | 840F | BZ | DB |
| 01A2 | 70 | DD CLR | |
| 01A3 | CC | AS | S |
| 01A4 | 8104 | BP | DA |
| 01A6 | 2092 | LI | H'92' |
| 01A8 | 5C | LR | S,A |
| 01A9 | 0A | DA LR | A,IS |
| 01AA | 1F | INC | |
| 01AB | 0B | LR | IS,A |
| 01AC | 2527 | CI | 0'47' |
| 01AE | 94F3 | BNZ | DD |
| 01B0 | 280000 | DB PI | EEE |
| 01B3 | 7F | LIS | LSB |
| 01B4 | 57 | LR | NU,A |
| 01B5 | 29033D | JMP | OUTPUT |
| 01B8 | 2A0FD3 | MEM4 DCI | BUFT |
| 01BB | 20F0 | LI | MSB |
| 01BD | 17 | ST | |
| 01BE | 47 | LR | A,NU |
| 01BF | 17 | ST | |
| 01C0 | 76 | LIS | 6 |
| 01C1 | 5B | LR | TE1,A |
| 01C2 | 79 | LIS | 9 |
| 01C3 | 50 | LR | TE3,A |
| 01C4 | 47 | LR | A,NU |
| 01C5 | 241D | AI | 0'35' |
| 01C7 | 0B | LR | IS,A |
| 01C8 | 41 | LR | A,CAN |
| 01C9 | 5C | LR | S,A |
| 01CA | 63 | LISU | TREN |
| 01CB | 6D | LISL | DUR+1 |
| 01CC | 70 | CK CLR | |
| 01CD | CC | AS | S |
| 01CE | 8102 | BP | *+3 |
| 01D0 | 30 | DS | TE3 |
| 01D1 | 0A | LR | A,IS |
| 01D2 | 7F | INC | |
| 01D3 | 0B | LR | IS,A |
| 01D4 | 2527 | CI | 0'47' |
| 01D6 | 94F5 | BNZ | CK |
| 01D8 | 280000 | MEM1 PI | ADR |
| 01DB | 62 | LISU | VEN |
| 01DC | 6B | LISL | SIN |
| 01DD | 4E | LR | A,D |
| 01DE | B4 | WRT OUTS | DOP |
| 01DF | 2380 | XI | CSE |
| 01E1 | B4 | OUTS | DOP |
| 01E2 | 2380 | XI | CSE |
| 01E4 | B4 | OUTS | DOP |
| 01E5 | 4A | LR | A,TE2 |
| 01E6 | 1F | INC | |
| 01E7 | B5 | OUTS | TIP |
| 01E8 | 5A | LR | TE2,A |
| 01E9 | 80F0A | BR7 | CA |
| 01EB | 60 | LISU | 0 |
| 01EC | 69 | LISL | CAN |
| 01ED | 20FF | LI | −1 |
| 01EF | 8E | ADC | |

TABLE 16-continued

| ADDRESS | CODE | ASSEMBLER | |
|---|---|---|---|
| 01F0 | 16 | LM | |
| 01F1 | 2432 | AI | 50 |
| 01F3 | 5A | LR | TE2,A |
| 01F4 | 4E | CA LR | A,D |
| 01F5 | 3B | DS | TE1 |
| 01F6 | 94E7 | BNZ | WRT |
| 01F8 | 70 | CLR | |
| 01F9 | B4 | OUTS | DOP |
| 01FA | 280000 | PI | EEE |
| 01FD | 48 | LR | A,MOO |
| 01FE | 2513 | CI | 19 |
| 0200 | 9447 | BNZ | MEM2 |
| 0202 | 290000 | JMP | PETI |
| 0138 | 08 | READ LR | K,P |
| 0139 | 280181 | PI | ADR |
| 013C | 62 | LISU | VEN |
| 013D | 6B | LISL | SIN |
| 013E | 3A | DS | TE2 |
| 013F | 9003 | BR | RD+2 |
| 0141 | 5C | RD LR | S,A |
| 0142 | 4E | LR | A,D |
| 0143 | 4A | LR | A,TE2 |
| 0144 | 1F | INC | |
| 0145 | 5A | LR | TE2,A |
| 0146 | B5 | OUTS | TIP |
| 0147 | 48 | LR | A,MOO |
| 0148 | 2513 | CI | 19 |
| 014A | 9404 | BNZ | *+5 |
| 014C | A4 | INS | DOP |
| 014D | 8FF4 | BR7 | RD+1 |
| 014F | A4 | INS | DOP |
| 0150 | 8FF0 | BR7 | RD |
| 0152 | 56 | LR | ND,A |
| 0153 | 2801D4 | RG PI | EEE |
| 0156 | 46 | LR | A,ND |
| 0157 | 210F | NI | 15 |
| 0159 | 2509 | CI | 9 |
| 015B | 910F | BM | RE |
| 015D | 6B | LISL | SIN |
| 015E | 4E | LR | A,D |
| 015F | 2520 | CI | 32 |
| 0161 | 9209 | BNC | RE |
| 0163 | 4E | LR | A,D |
| 0164 | 2564 | CI | 100 |
| 0166 | 9204 | BNC | RE |
| 0168 | 8FFA | BR7 | *−5 |
| 016A | 0C | PK | |
| 016B | 20FF | RE LI | H'FF' |
| 016D | 56 | LR | ND,A |
| 016E | 0C | PK | |
| 017E | 003468 | PAGE DC | H'003468' |
| 0181 | A1 | ADR INS | S2P |
| 0182 | 2380 | XI | CSE |
| 0184 | B1 | OUTS | S2P |
| 0185 | 47 | LR | A,NU |
| 0186 | 13 | SL | 1 |
| 0187 | 13 | SL | 1 |
| 0188 | C7 | AS | NU |
| 0189 | 5A | LR | TE2,A |
| 018A | 2A0FC1 | DCI | BUF+1 |
| 018D | 16 | LM | |
| 018E | 2A017D | DCI | PAGE−1 |
| 0191 | 8E | ADC | |
| 0192 | 16 | LM | |
| 0193 | CA | AS | TE2 |
| 0194 | 5A | LR | TE2,A |
| 0195 | B5 | OUTS | TIP |
| 0196 | 1C | POP | |
| 0197 | 08 | ETI LR | K,P |
| 0198 | 2A0FC1 | DCI | BUF+1 |
| 019B | 16 | LM | |
| 019C | 59 | LR | FOR,A |
| 019D | 08 | ETIC LR | K,P |
| 019E | 2801DB | PI | ADD |
| 01A1 | A4 | REE INS | DOP |
| 01A2 | 2510 | CI | H'10' |
| 01A4 | 820F | BC | ERR |
| 01A6 | 2549 | CI | H'49' |
| 01A8 | 920B | BNC | ERR |
| 01AA | 17 | ST | |
| 01AB | 4A | LR | A,TE2 |

TABLE 16-continued

| ADDRESS | CODE | | ASSEMBLER | |
|---------|------|------|-----------|------|
| 01AC | 1F | | INC | |
| 01AD | 5A | | LR | TE2,A |
| 01AE | B5 | | OUTS | TIP |
| 01AF | 3B | | DS | TE1 |
| 01B0 | 94F0 | | BNZ | REE |
| 01B2 | 9004 | | BR | WE1 |
| 01B4 | 20FF | ERR | LI | H'FF' |
| 01B6 | 56 | | LR | ND,A |
| 01B7 | 901B | WE1 | BR | WE |
| 01B9 | 08 | WRTE | LR | K,P |
| 01BA | 2A0FC1 | | DCI | BUF+1 |
| 01BD | 16 | | LM | |
| 01BE | 59 | | LR | FOR,A |
| 01BF | 2801DB | | PI | ADD |
| 01C2 | 16 | W | LM | |
| 01C3 | 217F | | NI | H'7F' |
| 01C5 | B4 | | OUTS | DOP |
| 01C6 | 2380 | | XI | CSE |
| 01C8 | B4 | | OUTS | DOP |
| 01C9 | 2380 | | XI | CSE |
| 01CB | B4 | | OUTS | DOP |
| 01CC | 4A | | LR | A,TE2 |
| 01CD | 1F | | INC | |
| 01C | 5A | | LR | TE2,A |
| 01CF | B5 | | OUTS | TIP |
| 01D0 | 3B | | DS | TE1 |
| 01D1 | 94F0 | | BNZ | W |
| 01D3 | 09 | | LR | P,K |
| 01D4 | 70 | EEE | CLR | |
| 01D5 | B5 | | OUTS | TIP |
| 01D6 | A1 | | INSS | S2P |
| 01D7 | 2380 | | XI | CSE |
| 01D9 | B1 | | OUTS | S2P |
| 01DA | 1C | | POP | |
| 01DB | A1 | ADD | INS | S2P |
| 01DC | 2380 | | XI | CSE |
| 01DE | B1 | | OUTS | S2P |
| 01DF | 73 | | LIS | 3 |
| 01E0 | 5B | | LR | TE1,A |
| 01E1 | 47 | | LR | A,NU |
| 01E2 | 13 | | SL | 1 |
| 01E3 | C7 | | AS | NU |
| 01E4 | 247C | | AI | TBE−32 |
| 01E6 | 5A | | LR | TE2,A |
| 01E7 | 49 | | LR | A,FOR |
| 01E8 | 15 | | SL | 4 |
| 01E9 | 13 | | SL | 1 |
| 01EA | CA | | AS | TE2 |
| 01EB | 5A | | LR | TE2,A |
| 01EC | B5 | | OUTS | TIP |
| 01ED | 2A0FD6 | | DCI | BUFT+3 |
| 01F0 | 1C | | POP | |

TABLE 17

| ADDRESS | CODE | | ASSEMBLER | |
|---------|------|------|-----------|------|
| 00D0 | 70 | INDIR | CLR | |
| 00D1 | 58 | | LR | M00,A |
| 00D2 | 55 | | LR | FDI,A |
| 00D3 | C7 | | AS | NU |
| 00D4 | 8409 | | BZ | IN1 |
| 00D6 | 2A0FCA | | DCI | BUF+10 |
| 00D9 | 16 | | LM | |
| 00DA | 25EE | | CI | H'EE' |
| 00DC | 84DC | | BZ | ITALIA |
| 00DE | 2A0FD4 | IN1 | DCI | BUFT+1 |
| 00E1 | 16 | | LM | |
| 00E2 | 2509 | | CI | 9 |
| 00E4 | 9204 | | BNC | *+5 |
| 00E6 | 2280 | | OI | H'80' |
| 00E8 | 51 | | LR | CAN,A |
| 00E9 | 43 | | LR | A,TAS |
| 00EA | 2509 | | CI | 9 |
| 00EC | 9113 | | BM | IN2 |
| 00EE | 65 | | LISU | 5 |
| 00EF | 6D | | LISL | 5 |
| 00F0 | 4C | | LR | A,S |
| 00F1 | 2503 | | CI | A,S |
| 00F3 | 920A | | BNC | IN2−2 |

TABLE 17-continued

| ADDRESS | CODE | | ASSEMBLER | |
|---------|------|------|-----------|------|
| 00FC | 2501 | | CI | 1 |
| 00F7 | 73 | | LIS | 3 |
| 00F8 | 5E | | LR | D,A |
| 00F9 | 5D | | LR | I,A |
| 00FA | 94C1 | | BNZ | DIRET |
| 00FC | 9003 | | BR | IN2 |
| 00FE | 71 | | LIS | 1 |
| 00FF | 5C | | LR | S,A |
| 0100 | 2A0FCD | IN2 | DCI | BUFC |
| 0103 | 7C | | LIS | 12 |
| 0104 | 5A | | LR | TE2,A |
| 0105 | 20F0 | | LI | MSB |
| 0107 | 17 | | ST | |
| 0108 | 3A | | DS | TE2 |
| 0109 | 94FD | | BNZ | *−2 |
| 010B | 280000 | | PI | READ |
| 010E | 2A0FD4 | | DCI | BUFT+1 |
| 0111 | 47 | | LR | A,NU |
| 0112 | 17 | | ST | |
| 0113 | 280000 | | PI | ETI |
| 0116 | 46 | | LR | A,ND |
| 0117 | 59 | | LR | FOR,A |
| 0118 | 25FF | | CI | −1 |
| 011A | 9409 | | BNZ | VCR |
| 011C | 280000 | | PI | SET |
| 011F | 280422 | | PI | BFN |
| 0122 | 901A | | BR | SCA |
| 0124 | 2A0FD6 | VCR | DCI | BUFT+3 |
| 0127 | 16 | | LM | |
| 0128 | 2556 | | CI | C'V' |
| 012A | 940C | | BNZ | AVRS |
| 012C | 16 | | LM | |
| 012D | 2543 | | CI | C'C' |
| 012F | 9407 | | BNZ | AVRS |
| 0131 | A1 | | INS | S2P |
| 0132 | 2210 | | OI | AV |
| 0134 | B1 | | OUTS | S2P |
| 0135 | 9007 | | BR | SCA |
| 0137 | A1 | AVRS | INS | S2P |
| 0138 | 2210 | | OI | AV |
| 013A | 2310 | | XI | AV |
| 013C | B1 | | OUTS | S2P |
| 013D | 290254 | SCA | JMP | CALC |
| 0205 | 7F | ERROR | LIS | 15 |
| 0206 | 2A0FCD | | DCI | BUFC |
| 0209 | 17 | | ST | |
| 020A | 17 | | ST | |
| 020B | 2A0FD4 | | DCI | BUFT+1 |
| 020E | 70 | | CLR | |
| 020F | 88 | | AM | |
| 0210 | 280455 | | PI | CET |
| 0213 | 8104 | | BP | *+5 |
| 0215 | 280447 | VISL | PI | BEEP |
| 0218 | 29032F | | JMP | DISPLAY |

TABLE 18

| ADDRESS | CODE | | ASSEMBLER | |
|---------|------|------|-----------|------|
| 01FE | 43 | PRG | LR | A,TAS |
| 01FF | 2530 | | CI | 48 |
| 0201 | 941C | | BNZ | P2 |
| 0203 | 2801F1 | P7 | PI | SHI |
| 0206 | 70 | | LIS | 0 |
| 0207 | 5C | | LR | S,A |
| 0208 | 55 | | LR | FDI,A |
| 0209 | 2A0FD4 | | DCI | BUFT+1 |
| 020C | 16 | | LM | |
| 020D | 6A | | LISL | 2 |
| 020E | 5C | | LR | S,A |
| 020F | 2A0FD3 | | DCI | BUFT |
| 0212 | 7F | | LIS | 15 |
| 0213 | 17 | | ST | |
| 0214 | 17 | | ST | |
| 0215 | 17 | | ST | |
| 0216 | 20F0 | P9 | LI | H'F0' |
| 0218 | 17 | | ST | |
| 0219 | 17 | | ST | |
| 021A | 17 | | ST | |
| 021B | 290000 | P1 | JMP | DISPLAY |

TABLE 18-continued

| ADDRESS | CODE | ASSEMBLER | | |
| --- | --- | --- | --- | --- |
| 021E | 280281 | P2 | PI | P10 |
| 0211 | 4C | | LR | A,S |
| 0222 | 2503 | | CI | 3 |
| 0224 | 64F6 | | BNZ | P1 |
| 0227 | 59 | | LRI | FOR,A |
| 0228 | 79 | P8 | LIS | 9 |
| 0229 | 57 | | LR | NU,A |
| 022A | 28019D | P6 | PI | ETIC |
| 022D | 73 | | LIS | 3 |
| 022E | 5A | | LR | TE2,A |
| 022F | 2A0FD2 | P5 | DCI | BUFT−1 |
| 0232 | 4A | | LR | A,TE2 |
| 0233 | 8E | | ADC | |
| 0234 | 16 | | LM | |
| 0235 | 8D | | CM | |
| 0236 | 8D | | CM | |
| 0237 | 8D | | CM | |
| 0238 | 9414 | | BNZ | P4 |
| 023A | 3A | | DS | TE2 |
| 023B | 94F3 | | BNZ | P5 |
| 023D | 2A0FCA | | DCI | BUF+10 |
| 0240 | 20F0 | | LI | H'FO' |
| 0242 | 17 | | ST | |
| 0243 | 2A0FC1 | | DCI | BUF+1 |
| 0246 | 49 | | LR | A,FOR |
| 0247 | 17 | | ST | |
| 0248 | 70 | | CLR | |
| 0249 | 58 | | LR | MOO,A |
| 024A | 290000 | | JMP | IN1 |
| 024D | 37 | P4 | DS | NU |
| 024E | 81DB | | BP | P6 |
| 0250 | 39 | | DS | FOR |
| 0251 | 94D6 | | BNZ | P8 |
| 0253 | 90AF | | BR | P7 |

The advantages deriving from the present invention are clearly apparent from the foregoing description.

For example, the microprocessor is used for performing a considerable number of functions, besides the control of the typical functions of the television receiver, so that its use is rendered optimal from the point of view of the cost/performance ratio.

Moreover, the additional functions are achieved by the circuits according to the invention without appreciably increasing the hardware of the receiver.

Obviously, many variants are possible.

Among these we mention the use of a different group of characters, comprising, for example, different graphic symbols, the use of a different format of the page of the note-book (for example, 6 lines of 40 characters each), or a different RAM memory capacity in order to store a different number of pages of messages or a different number of memorized programs.

Other variants may consist in the selection of other colors for the writings, in particular in the case of the calendar, or in the choice of a different mode of presentation of the calendar (for example, more months at the same time), or in the use of labels comprising a different number of characters in the case of the selection of a program by means of the mnemonic label. Many other variants are possible without departing from the novel principles of the present invention. For example, reference numeral 8 in FIG. 1 indicates a frequency-synthesis circuit of the PLL type for obtaining the tuning for a television receiver.

It is clear that the invention may also be used advantageously in an electronic tuning circuit with memorization of the voltage-synthesis type, in which each selected station has associated thereto and memorized a voltage in the form of a binary number which is then converted in a D/A converter into a tuning voltage to be applied to the variable reactance circuit contained in the tuning unit of the receiver.

Therefore, the devices which obtain the memorization of the binary number may conveniently be dimensioned in such a manner as to contain also data relative to the labels to be associated to each memorized program.

Another variant may consist in displaying, besides the map of the memorized channels, also the map of the labels associated to the memorized channels. To obtain this, with reference to FIG. 12, it is sufficient that a block similar to block 183 stores in particular inner registers the codes relative to the characters forming the label, instead of the channel number.

Also, the remote-control unit 1 provided with the alphanumerical keyboard and the receiver circuit 2, the control unit 3, the memory 7, eventually the circuit 8 and the character generating circuit 4 and the final video circuit 5, conveniently modified, may be designed not only for a color type television set having the characteristics described hereinabove, but also for a color television set having different functions, and eventually also for a black and white television set and generally for any device provided with a display screen, usable not only as described hereinabove, but also, in an exclusive or differently combinatorial manner, as note-book, calendar, etc., and generally as a device for displaying on a screen (of any type) pictures formed by alphanumerical data, which device is used e.g. as peripheral unit in a computer, or minicomputer or microcomputer type system. Among the other variants based on the novel principles of the present invention, also the provision of a receiver of radioelectric signals in general may be mentioned, in which it is possible to receive stations emitting on pre-established frequencies, by simply requesting the mnemonic label formed by some alphanumerical characters which has been memorized in association with the station, according to the same principle which has already been described for the selection of television channels. In the case, for example, of a radio receiver set or a HI-FI tuner, in which the device for tuning the receivable frequencies is obviously designed for the field of radio frequencies, the variant with respect to the block diagram of FIG. 1 consists only in the fact that the character generator 4, or a character generator of a different, more simplified type, controls directly an alphanumerical character display device for the presentation of the mnemonic labels. The selection of the preferred and previously memorized station may take place by sending to the control unit 3 the code corresponding to the selected mnemonic label, or by means of the keyboard of the remote-control unit 1, or by means of a keyboard connected directly to control unit 3.

Figure 15:
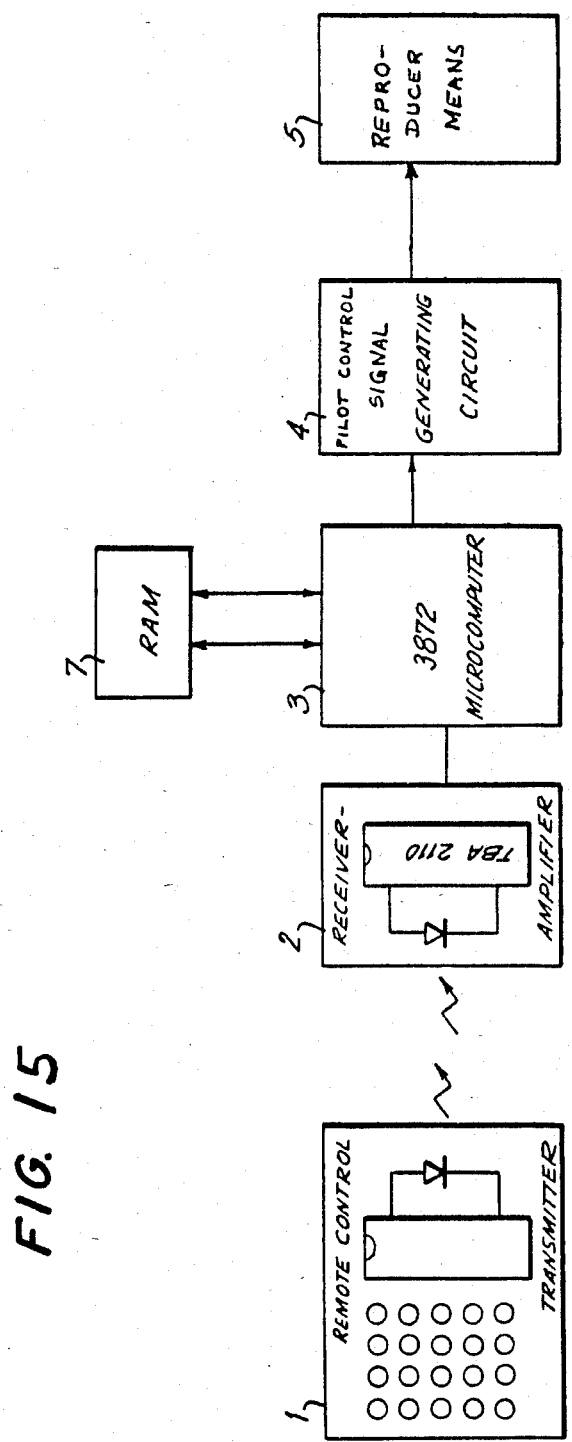
FIG. 15 shows a block diagram of a different embodiment of a set according to the present invention.

Finally, the variant shown in FIG. 15 relates to a set comprising reproducer means for the reproduction of alphanumerical data, on a display screen, or reproducer printing means or vocal reproducer means, and in respect of the block diagram shown in FIG. 1 there is missing the frequency-synthesis PLL circuit 8. In this case, the circuit 4 (which is a known circuit for the reproducer means 5) receives the signals from the unit 3 and generates the pilot control signals for the reproducer means 5 which reproduce on a screen, or printing reproducers (typewriter or printing machine) or vocal reproducers (reproducing the single character or also the combination of characters), so as to obtain the 64 types of alphanumerical characters corresponding to the 64 keys which may be selected by means of the keyboard of the transmitter 1.

The operation of the set shown in FIG. 15 may be inferred from what has been described already in the foregoing. Thus, the apparatus shown in FIG. 1 may be used for different functions, including also the notebook function for memorizing determined data and reproducing them at the desired moment, or the calendar function for obtaining data of the type described already in the foregoing, with the advantage of having the control keyboard 1 freely movable, without it having to be constrained to a fixed and limited position relative to the set.

Finally, among the further variants we mention the possibility of providing in the control unit as many keys as the characters to be reproduced, without having to use a shift key for creating all the control signals necessary to reproduce all the characters.

We claim:

1. A television receiver comprising:
   (a) display means for displaying a color image;
   (b) character generation means capable of being operatively coupled at video frequencies to said display means;
   (c) a keyboard for inputting coded data signals corresponding to characters and control signals corresponding to commands by remote control;
   (d) random access memory (RAM) means for nonvolatilely storing data signals, and
   (e) control means connected to said keyboard, said RAM means, and said character generation means, said control means comprising means for decoding coded data signals received from said keyboard, means for storing decoded data signals in said RAM means, means for sending said decoded data signals to said character generation means, means for sending format control signals received from said keyboard to said character generation means for displaying characters corresponding to said data signals received from said keyboard and formatting said characters in accordance with said format control signals, means for reading data signals stored in said RAM means, buffer means for temporarily storing data signals read from said RAM means, means for sending said data signals stored in said buffer means to said character generation means for displaying characters corresponding to said data signals, and means for controlling the operating mode of said television receiver in response to mode control signals received from said keyboard,
   wherein said television receiver is placed in a first operational mode in which said character generation means is coupled to said keyboard for displaying a picture comprising formatted characters corresponding to data signals directly input by way of said keyboard and stored in said RAM means in response to first mode control signals and in a second operational mode in which said character generation means is coupled to said RAM means for displaying a picture comprising formatted characters corresponding to stored data signals read-out from said RAM means in response to second mode control signals.

2. The television receiver as defined in claim 1, wherein said control means further comprises a pointer register, means for selecting an address of said RAM means, each address being selected in response to receipt of a set of coded data signals corresponding to a character to be displayed and in dependence on the content of said pointer register, means for storing decoded data signals in binary form in a cell corresponding to said selected address in said RAM means, means for reading said stored code out of said RAM means, means for sending said read code to said character generation means, and means for modifying the contents of said pointer register by one unit.

3. The television receiver as defined in claim 2, wherein said control means further comprises means for sequentially reading the cells of said RAM means, means for sending the contents of said cells to said character generation means, means for receiving further coded data signals corresponding to further characters to be displayed and control signals corresponding to commands, and means for storing further decoded data signals in said cells of said RAM means in place of the previously stored decoded data signals.

4. The television receiver as defined in claim 1, wherein said character generation means comprise means for generating said characters in the form of dot matrices.

5. The television receiver as defined in claim 4, wherein said input means comprises means for assigning a color code to each character to be displayed, and said control means further comprises random access memory (RAM) buffer means including a first group of cells for storing decoded data signals corresponding to characters to be displayed and a second group of cells for storing decoded data signals corresponding to associated color codes received from said input means, and further comprises means for periodically sending, in synchronization with line and frame scanning on said receiver, said character and color data signals from said RAM buffer means to said character generation means for displaying said characters in a format comprising a predetermined number of lines each having a predetermined number of characters.

6. The television receiver as defined in claim 5, wherein said control means further comprises means for storing character and color data signals in said RAM buffer means corresponding to a single line of characters to be displayed in synchronization with the vertical scanning return period of said receiver.

7. The television receiver as defined in claim 1, wherein said input means comprises a keyboard having a cursor key for controlling the position of a first pointer character on said display means and a shift key for enabling at least one key of said keyboard which produces a first coded signal in response to depression to produce a second and different coded signal in response to depression, and said control means further comprises a pointer register for storing a value corresponding to the position of said pointer on said display means, means for modifying the contents of said pointer register in response to depression of said cursor key, and means for controlling said character generation means to display a second pointer character in place of said first pointer character in response to depression of said shift key.

8. The television receiver as defined in claim 1, wherein said input means comprises a keyboard having a color key for selecting one of a plurality of colors for the characters to be displayed following depression of said color key and means for assigning one of a plurality of color codes to each character to be displayed following said depression and before the next succeeding depression of said color key, said plurality of color codes being assigned in a predetermined sequence which is cyclically repeated, the next color code in said predetermined sequence being assigned following the next depression of said color key, and said control means further comprises means for controlling said character generation means to display said first or second pointer character in the color selected by said depression of said color key.

9. The television receiver as defined in claim 1, wherein said control means further comprises read only memory (ROM) means for storing a binary coded sequence and means for reading out said stored binary coded sequence for controlling said character generation means to display an instruction message corresponding to said stored binary coded sequence, and said input means comprises a keyboard having an instruction key for actuating display of said instruction message in response to depression of said instruction key.

10. The television receiver as defined in claim 1, wherein said control means further comprises means for generating in a predetermined sequence the codes corresponding to each of a multiplicity of characters and means for controlling said character generation means to display a test pattern made up of said predetermined sequence of characters, and said input means comprises a keyboard having a test key for actuating display of said test pattern in response to depression of said test key.

11. The television receiver as defined in claim 1, wherein said input means comprises means for inputting coded data signals corresponding to tuning, color, brightness, or volume data for controlling said receiver in said first operating mode.

12. The television receiver as defined in claim 1, wherein said control means further comprises means for detecting a predetermined sequence of signals in a predetermined part of the signals corresponding to said complete alternative picture and means for activating a preset function on said receiver in response to detection of said predetermined sequence.

13. The television receiver as defined in claim 1, wherein said input means comprises a keyboard having a first function key for actuating display of a first calendar month and a multiplicity of data keys corresponding to arabic number 0-9, and means for generating a coded control signal representing a calendar operating mode and coded data signals identifying a calendar month to be displayed in response to depression of said first function key and said data keys respectively, and said control means further comprises means for switching to said calendar mode in response to receipt of said calendar mode control signal and means for executing said calendar mode whereby said calendar month data signals are decoded, the day of the first date of and first calendar month to be displayed is calculated, and signals are output for controlling said character generation means to generate a seven-column array of data representing said first calendar month on said display means in at least two colors.

14. The television receiver as defined in claim 13, wherein said control means further comprises means for associating coded signals representing a first color with a first group of days and a second color with a second group of days of a calendar month to be displayed.

15. The television receiver as defined in claim 14, wherein said input means comprises means for selecting a third color and means for associating said third color with a predetermined day of a calendar month to be displayed, and said control means further comprises means for controlling said character generation means to generate a character representing said predetermined day in said third color on said display means.

16. The television receiver as defined in claim 13, wherein said control means further comprises means for controlling said character generation means to generate an instruction on said display means in response to receipt of said calendar mode control signal, said instruction requesting the input of numbers corresponding to the month and year of the calendar month to be displayed by the user, and said input means comprises means for generating said calendar month data signals in response to despression of keys corresponding to said month and year numbers.

17. The television receiver as defined in claim 13, wherein said keyboard has a second function key for actuating display of the calendar month next in sequence after said first calendar month, and said control means further comprises means for calculating the numbers corresponding to the month and year of said next calendar month in response to depression of said second function key and means for controlling said character generation means to generate a seven-column array of data representing said next calendar month on said display means.

18. The television receiver as defined in claim 1, wherein said input means comprises a remote control transmitting means having an alphanumerical keyboard and receiving means remotely coupled to receive radiation from said transmitting means and connected to output coded signals to said control means in response to receipt of radiation.

19. A television receiver comprising:
(a) an alphanumerical character display means;
(b) character generation means capable of being operatively coupled to said display means;
(c) a keyboard for inputting coded data signals corresponding to alphanumerical characters and control signals corresponding to commands by remote control;
(d) television signal tuning means for direct channel tuning;
(e) random access memory (RAM) means for nonvolatilely storing data signals, and
(f) control means connected to said character generation means, said signal tuning means, said RAM means, and said keyboard;
wherein said RAM means comprises a first plurality of cells and a second plurality of cells associated with said first plurality of cells, said first plurality of cells storing data relating to tuning of television signals broadcast by a plurality of broadcast stations, and said second plurality of cells storing data forming identifying labels corresponding to each of those broadcast stations having tuning data stored in said first plurality of cells, said control means comprising means for decoding a sequence of data signals representing an identifying label received from said keyboard, means for storing a plurality of identifying labels in said second plurality of cells, means for receiving from said keyboard a sequence of data signals representing a selected identifying label, means for searching said second plurality of cells for stored data representing said selected identifying label received from said keyboard, means for reading the tuning data in those cells of said first plurality which are associated with the cells of said second plurality in which said selected identifying label is stored, and means for sending the read tuning data to said tuning means in order to tune the broadcast station corresponding to said selected identifying label.

20. The radioelectric signal receiver as defined in claim 19, wherein in response to a second coded signal from said input means, said control means addresses a second group of cells in said RAM means, said second group of cells being associated with said first group of cells, and stores decoded signals in said second group of cells corresponding to the alphanumeric characters forming the message identifying said selected station.

21. The radioelectric signal receiver as defined in claim 19, wherein said tuning means comprises a frequency-synthesis circuit having a programmable divider and said tuning data stored in said RAM means comprises a division number, said tuning data being read from said RAM means and sent to said frequency-synthesis circuit by said control means for tuning in to the radioelectric signal.

22. The radioelectric signal receiver as defined in claim 20, wherein said control means comprises means for decoding coded signals received from said input means, read only memory (ROM) means in which codes corresponding to a multiplicity of broadcast stations are stored, and means for comparing the broadcast station codes stored in said ROM means and said decoded selected station identification signal stored in second group of cells of said RAM means, said control means reading tuning data from said first group of cells of said RAM means corresponding to said selected station and sending said tuning data to said tuning means only in response to a signal output by said comparison means representing correspondence of said selected station identification signal and one of said broadcast station codes stored in said ROM means.

23. The radioelectric signal receiver as defined in claim 22, further comprising an auxiliary circuit for connection with a video recorder wherein said comparison means outputs a switching signal for enabling said auxiliary circuit in response to corresponding of decoded signals stored in said second group of cells of said RAM means and a predetermined combination stored in said ROM means.

* * * * *